(12) United States Patent
Shah et al.

(10) Patent No.: US 10,348,051 B1
(45) Date of Patent: Jul. 9, 2019

(54) FIBER-OPTIC AMPLIFIER

(71) Applicant: Luminar Technologies, Inc., Orlando, FL (US)

(72) Inventors: Lawrence Shah, Winter Park, FL (US); Alain Villeneuve, Mont-Royal (CA); Cheng Zhu, Orlando, FL (US); Laurance S. Lingvay, Orlando, FL (US)

(73) Assignee: Luminar Technologies, Inc., Orlando, FL (US)

( * ) Notice: Subject to any disclaimer, the term of this patent is extended or adjusted under 35 U.S.C. 154(b) by 0 days.

(21) Appl. No.: 15/983,828

(22) Filed: May 18, 2018

(51) Int. Cl.
*H01S 3/094* (2006.01)
*G02B 6/024* (2006.01)
*H01S 3/067* (2006.01)

(52) U.S. Cl.
CPC ........ *H01S 3/094011* (2013.01); *G02B 6/024* (2013.01); *H01S 3/06712* (2013.01); *H01S 3/06783* (2013.01); *H01S 3/094007* (2013.01)

(58) Field of Classification Search
CPC ......... H01S 3/094011; H01S 3/094007; H01S 3/06754
See application file for complete search history.

(56) References Cited

U.S. PATENT DOCUMENTS

| 5,006,721 | A | 4/1991 | Cameron et al. |
| 6,437,906 | B1 * | 8/2002 | Di Pasquale ....... H01S 3/06754 359/337.2 |
| 6,449,384 | B2 | 9/2002 | Laumeyer et al. |
| 6,710,324 | B2 | 3/2004 | Hipp |
| 6,723,975 | B2 | 4/2004 | Saccomanno |
| 6,747,747 | B2 | 6/2004 | Hipp |
| 6,759,649 | B2 | 7/2004 | Hipp |
| 7,092,548 | B2 | 5/2006 | Laumeyer et al. |
| 7,209,221 | B2 | 4/2007 | Breed et al. |
| 7,345,271 | B2 | 3/2008 | Boehlau et al. |
| 7,443,903 | B2 | 10/2008 | Leonardo et al. |
| 7,532,311 | B2 | 5/2009 | Henderson et al. |
| 7,570,793 | B2 | 8/2009 | Lages et al. |
| 7,583,364 | B1 | 9/2009 | Mayor et al. |
| 7,649,920 | B2 | 1/2010 | Welford |

(Continued)

FOREIGN PATENT DOCUMENTS

| WO | 2008/128359 | 10/2008 |
| WO | 2013/087799 | 6/2013 |

*Primary Examiner* — Eric L Bolda

(57) ABSTRACT

In one embodiment, a fiber-optic amplifier includes an optical gain fiber configured to amplify input light received from a seed laser. The optical gain fiber includes a first gain section configured to: receive the seed-laser input light and co-propagating pump light; and amplify the seed-laser input light as it propagates along the first gain section. The seed-laser input light and the co-propagating pump light propagate along the first gain section in a same direction. The optical gain fiber also includes a second gain section configured to: receive the amplified input light from the first gain section; receive counter-propagating pump light; and further amplify the amplified input light as it propagates along the second gain section. The amplified input light and the counter-propagating pump light propagate along the second gain section in opposite directions. The fiber-optic amplifier also includes a first pump laser diode and a second pump laser diode.

28 Claims, 16 Drawing Sheets

(56) References Cited

U.S. PATENT DOCUMENTS

| | | | |
|---|---|---|---|
| 7,652,752 B2 | 1/2010 | Fetzer et al. | |
| 7,768,700 B1* | 8/2010 | Savage-Leuchs | B29C 47/0026 359/341.1 |
| 7,839,491 B2 | 11/2010 | Harris et al. | |
| 7,872,794 B1* | 1/2011 | Minelly | H01S 3/06758 359/337.13 |
| 7,902,570 B2 | 3/2011 | Itzler et al. | |
| 7,945,408 B2 | 5/2011 | Dimsdale et al. | |
| 7,969,558 B2 | 6/2011 | Hall | |
| 7,995,796 B2 | 8/2011 | Retterath et al. | |
| 8,059,263 B2 | 11/2011 | Haberer et al. | |
| 8,072,663 B2 | 12/2011 | O'Neill et al. | |
| 8,081,301 B2 | 12/2011 | Stann et al. | |
| 8,138,849 B2 | 3/2012 | West et al. | |
| 8,279,420 B2 | 10/2012 | Ludwig et al. | |
| 8,280,623 B2 | 10/2012 | Trepagnier et al. | |
| 8,346,480 B2 | 1/2013 | Trepagnier et al. | |
| 8,364,334 B2 | 1/2013 | Au et al. | |
| 8,452,561 B2 | 5/2013 | Dimsdale et al. | |
| 8,548,014 B2 | 10/2013 | Fermann et al. | |
| 8,625,080 B2 | 1/2014 | Heizmann et al. | |
| 8,675,181 B2 | 3/2014 | Hall | |
| 8,723,955 B2 | 5/2014 | Kiehn et al. | |
| 8,767,190 B2 | 7/2014 | Hall | |
| 8,796,605 B2 | 8/2014 | Mordarski et al. | |
| 8,836,922 B1 | 9/2014 | Pennecot et al. | |
| 8,880,296 B2 | 11/2014 | Breed | |
| 8,896,818 B2 | 11/2014 | Walsh et al. | |
| 8,934,509 B2 | 1/2015 | Savage-Leuchs et al. | |
| 9,000,347 B2 | 4/2015 | Woodward et al. | |
| 9,041,136 B2 | 5/2015 | Chia | |
| 9,048,370 B1 | 6/2015 | Urmson et al. | |
| 9,063,549 B1 | 6/2015 | Pennecot et al. | |
| 9,069,060 B1 | 6/2015 | Zbrozek et al. | |
| 9,074,878 B2 | 7/2015 | Steffey et al. | |
| 9,086,273 B1 | 7/2015 | Gruver et al. | |
| 9,086,481 B1 | 7/2015 | Dowdall et al. | |
| 9,091,754 B2 | 7/2015 | D'aligny | |
| 9,103,669 B2 | 8/2015 | Giacotto et al. | |
| 9,121,703 B1 | 9/2015 | Droz et al. | |
| 9,160,140 B2 | 10/2015 | Gusev et al. | |
| 9,170,333 B2 | 10/2015 | Mheen et al. | |
| 9,199,641 B2 | 12/2015 | Ferguson et al. | |
| 9,213,085 B2 | 12/2015 | Kanter | |
| 9,239,260 B2 | 1/2016 | Bayha et al. | |
| 9,246,041 B1 | 1/2016 | Clausen et al. | |
| 9,285,464 B2 | 3/2016 | Pennecot et al. | |
| 9,285,477 B1 | 3/2016 | Smith et al. | |
| 9,297,901 B2 | 3/2016 | Bayha et al. | |
| 9,299,731 B1 | 3/2016 | Lenius et al. | |
| 9,304,154 B1 | 4/2016 | Droz et al. | |
| 9,304,203 B1 | 4/2016 | Droz et al. | |
| 9,304,316 B2 | 4/2016 | Weiss et al. | |
| 9,310,471 B2 | 4/2016 | Sayyah et al. | |
| 9,335,255 B2 | 5/2016 | Retterath et al. | |
| 9,360,554 B2 | 6/2016 | Retterath et al. | |
| 9,368,933 B1 | 6/2016 | Nijjar et al. | |
| 9,383,201 B2 | 7/2016 | Jackman et al. | |
| 9,383,445 B2 | 7/2016 | Lu et al. | |
| 9,383,753 B1 | 7/2016 | Templeton et al. | |
| 9,787,048 B1* | 10/2017 | Fidric | G01S 17/02 |
| RE46,672 E | 1/2018 | Hall | |
| 2001/0033412 A1* | 10/2001 | Vavassori | H01S 3/06758 359/341.3 |
| 2005/0105865 A1* | 5/2005 | Fermann | H01S 3/0057 385/122 |
| 2006/0198397 A1* | 9/2006 | Korolev | H01S 3/302 372/3 |
| 2006/0290920 A1 | 12/2006 | Kampchen et al. | |
| 2008/0175279 A1* | 7/2008 | Kakui | H01S 3/06791 372/10 |
| 2009/0257116 A1* | 10/2009 | Sweeney | H01S 3/06758 359/341.3 |
| 2009/0273770 A1 | 11/2009 | Bauhahn et al. | |
| 2010/0034221 A1 | 2/2010 | Dragic | |
| 2011/0249321 A1* | 10/2011 | Savage-Leuchs | G02B 6/02009 359/341.3 |
| 2012/0227263 A1 | 9/2012 | Leclair et al. | |
| 2012/0294323 A1* | 11/2012 | Lin | H01S 3/06725 372/25 |
| 2013/0033742 A1 | 2/2013 | Rogers et al. | |
| 2014/0111805 A1 | 4/2014 | Albert et al. | |
| 2014/0168631 A1 | 6/2014 | Haslim et al. | |
| 2014/0176933 A1 | 6/2014 | Haslim et al. | |
| 2014/0211194 A1 | 7/2014 | Pacala et al. | |
| 2014/0293263 A1 | 10/2014 | Justice et al. | |
| 2014/0293266 A1 | 10/2014 | Hsu et al. | |
| 2015/0131080 A1 | 5/2015 | Retterath et al. | |
| 2015/0177368 A1 | 6/2015 | Bayha et al. | |
| 2015/0185244 A1 | 7/2015 | Inoue et al. | |
| 2015/0185313 A1 | 7/2015 | Zhu | |
| 2015/0192676 A1 | 7/2015 | Kotelnikov et al. | |
| 2015/0192677 A1 | 7/2015 | Yu et al. | |
| 2015/0204978 A1 | 7/2015 | Hammes et al. | |
| 2015/0214690 A1 | 7/2015 | Savage-Leuchs et al. | |
| 2015/0301182 A1 | 10/2015 | Geiger et al. | |
| 2015/0323654 A1 | 11/2015 | Jachmann et al. | |
| 2015/0378023 A1 | 12/2015 | Royo Royo et al. | |
| 2015/0378241 A1 | 12/2015 | Eldada | |
| 2016/0025842 A1 | 1/2016 | Anderson et al. | |
| 2016/0047896 A1 | 2/2016 | Dussan | |
| 2016/0047901 A1 | 2/2016 | Pacala et al. | |
| 2016/0049765 A1 | 2/2016 | Eldada | |
| 2016/0146939 A1 | 5/2016 | Shpunt et al. | |
| 2016/0146940 A1 | 5/2016 | Koehler | |
| 2016/0161600 A1 | 6/2016 | Eldada et al. | |
| 2016/0181756 A1* | 6/2016 | Muendel | H01S 3/06754 372/6 |
| 2016/0245919 A1 | 8/2016 | Kalscheur et al. | |
| 2017/0264069 A1* | 9/2017 | Seo | H01S 3/10084 |

* cited by examiner

FIBER-OPTIC AMPLIFIER

TECHNICAL FIELD

This disclosure generally relates to fiber-optic amplifiers.

BACKGROUND

A fiber-optic amplifier is a fiber-optic device that directly amplifies an optical signal without having to convert the optical signal into an electrical signal. Generally, a fiber-optic amplifier includes a length of optical gain fiber (e.g., optical fiber that is doped with a gain material) and a source of pump light (e.g., a pump laser diode). The pump light is coupled into the gain fiber along with an optical signal to be amplified. The gain material absorbs the pump light which promotes the gain material into an excited energy state, and the excited gain material provides optical amplification to the optical signal through stimulated emission. An optical signal that is amplified by a fiber-optic amplifier can include continuous-wave light or a series of optical pulses.

Light detection and ranging (lidar) is a technology that can be used to measure distances to remote targets. Typically, a lidar system includes a light source and an optical receiver. The light source can include, for example, a seed laser which emits light having a particular operating wavelength followed by a fiber-optic amplifier that amplifies the seed-laser light. The operating wavelength of a lidar system may lie, for example, in the infrared, visible, or ultraviolet portions of the electromagnetic spectrum. The light source emits light toward a target which then scatters the light. Some of the scattered light is received back at the receiver. The system determines the distance to the target based on one or more characteristics associated with the returned light. For example, the system may determine the distance to the target based on the time of flight of a returned light pulse.

DESCRIPTION OF EXAMPLE EMBODIMENTS

Figure 1:
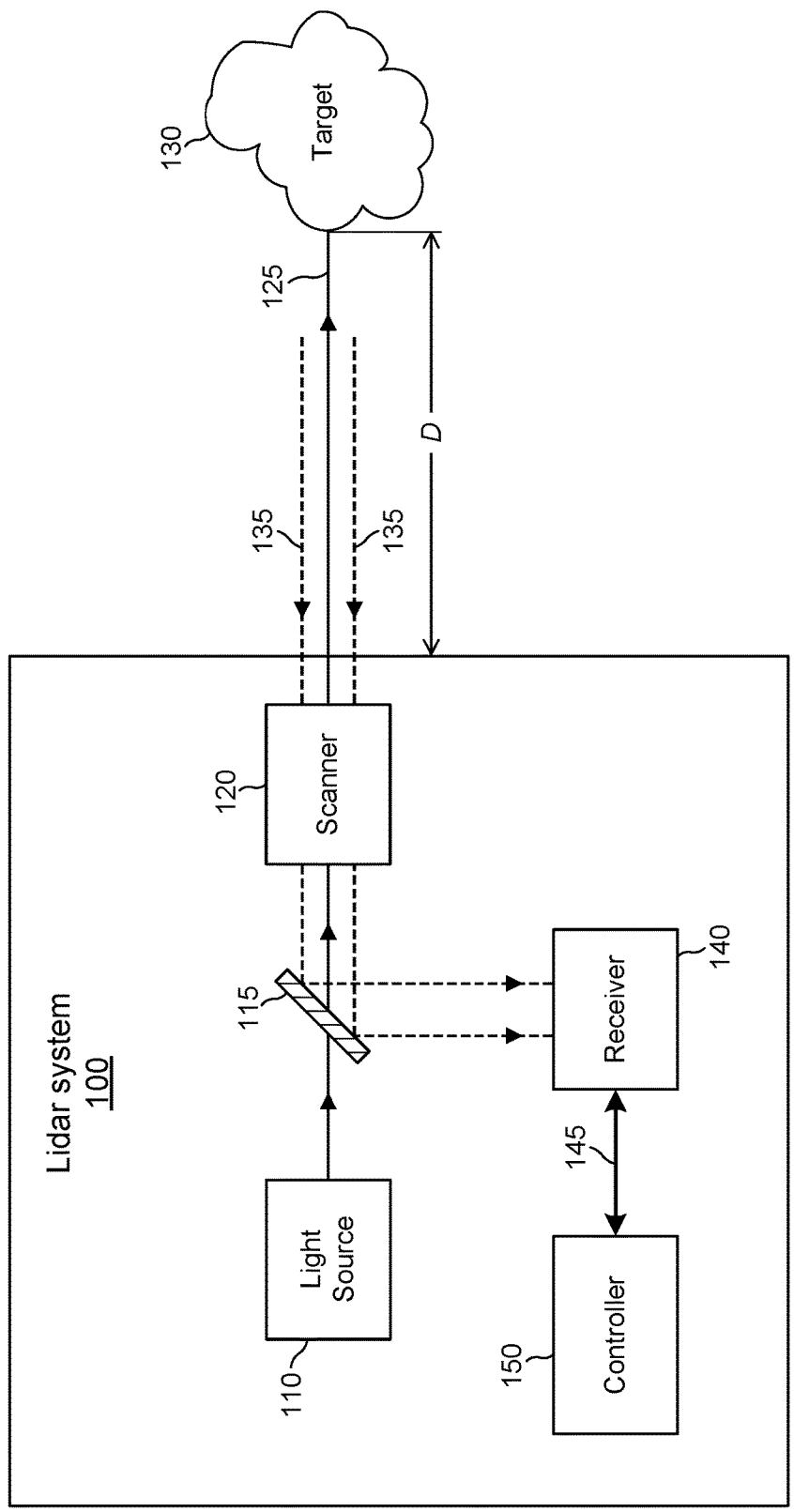
FIG. 1 illustrates an example light detection and ranging (lidar) system.

FIG. 1 illustrates an example light detection and ranging (lidar) system 100. In particular embodiments, a lidar system 100 may be referred to as a laser ranging system, a laser radar system, a LIDAR system, a lidar sensor, a laser detection and ranging (LADAR or ladar) system, a sensor, or a sensor head. In particular embodiments, a lidar system 100 may include a light source 110, mirror 115, scanner 120, receiver 140, or controller 150. The light source 110 may include, for example, a laser which emits light having a particular operating wavelength in the infrared, visible, or ultraviolet portions of the electromagnetic spectrum. As an example, light source 110 may include a laser with an operating wavelength between approximately 1.2 µm and 1.7 µm. The light source 110 emits an output beam of light 125 which may be continuous wave (CW), pulsed, or modulated in any suitable manner for a given application. The output beam of light 125 is directed downrange toward a remote target 130. As an example, the remote target 130 may be located a distance D of approximately 1 m to 1 km from the lidar system 100.

Once the output beam 125 reaches the downrange target 130, the target may scatter or reflect at least a portion of light from the output beam 125, and some of the scattered or reflected light may return toward the lidar system 100. In the example of FIG. 1, the scattered or reflected light is represented by input beam 135, which passes through scanner 120 and is directed by mirror 115 to receiver 140. In particular embodiments, a relatively small fraction of the light from output beam 125 may return to the lidar system 100 as input beam 135. As an example, the ratio of input beam 135 average power, peak power, or pulse energy to output beam 125 average power, peak power, or pulse energy may be approximately $10^{-1}$, $10^{-2}$, $10^{-3}$, $10^{-4}$, $10^{-5}$, $10^{-6}$, $10^{-7}$, $10^{-8}$, $10^{-9}$, $10^{-10}$, $10^{-11}$, or $10^{-12}$. As another example, if a pulse of output beam 125 has a pulse energy of 1 microjoule (µJ), then the pulse energy of a corresponding pulse of input beam 135 may have a pulse energy of approximately 10 nanojoules (nJ), 1 nJ, 100 picojoules (pJ), 10 pJ, 1 pJ, 100 femtojoules (fJ), 10 fJ, 1 fJ, 100 attojoules (aJ), 10 aJ, 1 aJ, or 0.1 aJ. In particular embodiments, output beam 125 may be referred to as a laser beam, light beam, optical beam, emitted beam, or beam. In particular embodiments, input beam 135 may be referred to as a return beam, received beam, return light, received light, input light, scattered light, or reflected light. As used herein, scattered light may refer to light that is scattered or reflected by a target 130. As an example, an input beam 135 may include: light from the output beam 125 that is scattered by target 130; light from the output beam 125 that is reflected by target 130; or a combination of scattered and reflected light from target 130.

In particular embodiments, receiver 140 may receive or detect photons from input beam 135 and generate one or more representative signals. For example, the receiver 140 may generate an output electrical signal 145 that is representative of the input beam 135. This electrical signal 145 may be sent to controller 150. In particular embodiments, receiver 140 or controller 150 may include a processor, computing system (e.g., an ASIC or FPGA), or other suitable circuitry. A controller 150 may be configured to analyze one or more characteristics of the electrical signal 145 from the receiver 140 to determine one or more characteristics of the target 130, such as its distance downrange from the lidar system 100. This can be done, for example, by analyzing the time of flight or phase modulation for a beam of light 125 transmitted by the light source 110. If lidar system 100 measures a time of flight of T (e.g., T represents a round-trip time of flight for an emitted pulse of light to travel from the lidar system 100 to the target 130 and back to the lidar system 100), then the distance D from the target 130 to the lidar system 100 may be expressed as D=c·T/2, where c is the speed of light (approximately $3.0 \times 10^8$ m/s). As an example, if a time of flight is measured to be T=300 ns, then the distance from the target 130 to the lidar system 100 may be determined to be approximately D=45.0 m. As another example, if a time of flight is measured to be T=1.33 μs, then the distance from the target 130 to the lidar system 100 may be determined to be approximately D=199.5 m. In particular embodiments, a distance D from lidar system 100 to a target 130 may be referred to as a distance, depth, or range of target 130. As used herein, the speed of light c refers to the speed of light in any suitable medium, such as for example in air, water, or vacuum. As an example, the speed of light in vacuum is approximately $2.9979 \times 10^8$ m/s, and the speed of light in air (which has a refractive index of approximately 1.0003) is approximately $2.9970 \times 10^8$ m/s.

In particular embodiments, light source 110 may include a pulsed laser. As an example, light source 110 may be a pulsed laser configured to produce or emit pulses of light with a pulse duration or pulse width of approximately 10 picoseconds (ps) to 100 nanoseconds (ns). The pulses may have a pulse duration of approximately 100 ps, 200 ps, 400 ps, 1 ns, 2 ns, 5 ns, 10 ns, 20 ns, 50 ns, 100 ns, or any other suitable pulse duration. As another example, light source 110 may be a pulsed laser that produces pulses with a pulse duration of approximately 1-5 ns. As another example, light source 110 may be a pulsed laser that produces pulses at a pulse repetition frequency of approximately 100 kHz to 5 MHz or a pulse period (e.g., a time between consecutive pulses) of approximately 200 ns to 10 μs. In particular embodiments, light source 110 may have a substantially constant pulse repetition frequency, or light source 110 may have a variable or adjustable pulse repetition frequency. As an example, light source 110 may be a pulsed laser that produces pulses at a substantially constant pulse repetition frequency of approximately 640 kHz (e.g., 640,000 pulses per second), corresponding to a pulse period of approximately 1.56 μs. As another example, light source 110 may have a pulse repetition frequency that can be varied from approximately 500 kHz to 3 MHz. As used herein, a pulse of light may be referred to as an optical pulse, a light pulse, or a pulse.

In particular embodiments, light source 110 may produce a free-space output beam 125 having any suitable average optical power, and the output beam 125 may have optical pulses with any suitable pulse energy or peak optical power. As an example, output beam 125 may have an average power of approximately 1 milliwatt (mW), 10 mW, 100 mW, 1 watt (W), 10 W, or any other suitable average power. As another example, output beam 125 may include pulses with a pulse energy of approximately 0.01 μJ, 0.1 μJ, 1 μJ, 10 μJ, 100 μJ, 1 mJ, or any other suitable pulse energy. As another example, output beam 125 may include pulses with a peak power of approximately 10 W, 100 W, 1 kW, 5 kW, 10 kW, or any other suitable peak power. The peak power ($P_{peak}$) of a pulse of light can be related to the pulse energy (E) by the expression $E=P_{peak} \cdot \Delta t$, where $\Delta t$ is the duration of the pulse, and the duration of a pulse may be defined as the full width at half maximum duration of the pulse. For example, an optical pulse with a duration of 1 ns and a pulse energy of 1 μJ has a peak power of approximately 1 kW. The average power ($P_{av}$) of an output beam 125 can be related to the pulse repetition frequency (PRF) and pulse energy by the expression $P_{av}=PRF \cdot E$. For example, if the pulse repetition frequency is 500 kHz, then the average power of an output beam 125 with 1-μpulses is approximately 0.5 W.

In particular embodiments, light source 110 may include a laser diode, such as for example, a Fabry-Perot laser diode, a quantum well laser, a distributed Bragg reflector (DBR) laser, a distributed feedback (DFB) laser, a vertical-cavity surface-emitting laser (VCSEL), or a discrete mode (DM) laser diode. As an example, light source 110 may include an aluminum-gallium-arsenide (AlGaAs) laser diode, an indium-gallium-arsenide (InGaAs) laser diode, an indium-gallium-arsenide-phosphide (InGaAsP) laser diode, or a laser diode that includes any suitable combination of aluminum (Al), indium (In), gallium (Ga), arsenic (As), phosphorous (P), or any other suitable material. As another example, light source 110 may include a DM laser diode with a ridge waveguide that has been etched to remove material and produce etched features at particular locations along the ridge. The etched features provide a refractive-index perturbation that modifies or stabilizes the emission wavelength of the DM laser diode. Additionally, light source 110 may include an optical filter that receives light emitted by the DM laser diode and substantially absorbs or reflects light from side modes that are produced when the DM laser diode is pulsed or modulated. A DM laser diode may produce output light at a particular discrete-mode wavelength (which corresponds to the operating wavelength or emission wavelength of the DM laser diode) as well as additional side-mode light located at one or more side-mode wavelengths with respect to the discrete mode. In particular embodiments, light source 110 may include a pulsed laser diode with a peak emission wavelength of approximately 1400-1600 nanometers (nm). As an example, light source 110 may include a DBR, DFB, or DM laser diode that is current modulated to produce optical pulses. In particular embodiments, light source 110 may include a pulsed laser diode followed by one or more optical-amplification stages. The pulsed laser diode may produce relatively low-power optical seed pulses which are amplified by an optical amplifier. As an example, light source 110 may be a fiber-laser module that includes a current-modulated laser diode with a peak wavelength of approximately 1550 nm followed by a single-stage or a multi-stage erbium-doped fiber amplifier (EDFA) that amplifies the seed pulses from the laser diode. As another example, light source 110 may include a continuous-wave (CW) or quasi-CW laser diode followed by an external optical modulator (e.g., an electro-optic modulator), and the output of the modulator may be fed into an optical amplifier.

In particular embodiments, an output beam of light 125 emitted by light source 110 may be a collimated optical beam with any suitable beam divergence, such as for example, a full-angle beam divergence of approximately 0.5 to 5.0 milliradians (mrad). A divergence of output beam 125 may refer to an angular measure of an increase in beam size (e.g., a beam radius or beam diameter) as output beam 125 travels away from light source 110 or lidar system 100. In particular embodiments, output beam 125 may have a substantially circular cross section with a beam divergence characterized by a single divergence value. As an example, an output beam 125 with a circular cross section and a divergence of 2 mrad may have a beam diameter or spot size of approximately 20 cm at a distance of 100 m from lidar system 100. In particular embodiments, output beam 125 may be an astigmatic beam or may have a substantially elliptical cross section and may be characterized by two divergence values. As an example, output beam 125 may have a fast axis and a slow axis, where the fast-axis divergence is greater than the slow-axis divergence. As another example, output beam 125 may be an astigmatic beam with a fast-axis divergence of 4 mrad and a slow-axis divergence of 2 mrad.

In particular embodiments, an output beam of light 125 emitted by light source 110 may be unpolarized or randomly polarized, may have no specific or fixed polarization (e.g., the polarization may vary with time), or may have a particular polarization (e.g., output beam 125 may be linearly polarized, elliptically polarized, or circularly polarized). As an example, light source 110 may produce linearly polarized light, and lidar system 100 may include a quarter-wave plate that converts this linearly polarized light into circularly polarized light. The circularly polarized light may be transmitted as output beam 125, and lidar system 100 may receive input beam 135, which may be substantially or at least partially circularly polarized in the same manner as the output beam 125 (e.g., if output beam 125 is right-hand circularly polarized, then input beam 135 may also be right-hand circularly polarized). The input beam 135 may pass through the same quarter-wave plate (or a different quarter-wave plate) resulting in the input beam 135 being converted to linearly polarized light which is orthogonally polarized (e.g., polarized at a right angle) with respect to the linearly polarized light produced by light source 110. As another example, lidar system 100 may employ polarization-diversity detection where two polarization components are detected separately. The output beam 125 may be linearly polarized, and the lidar system 100 may split the input beam 135 into two polarization components (e.g., s-polarization and p-polarization) which are detected separately by two photodiodes (e.g., a balanced photoreceiver that includes two photodiodes).

In particular embodiments, lidar system 100 may include one or more optical components configured to condition, shape, filter, focus, modify, steer, or direct light within the lidar system 100 or light produced or received by the lidar system 100 (e.g., output beam 125 or input beam 135). As an example, lidar system 100 may include one or more lenses, mirrors, filters (e.g., bandpass or interference filters), beam splitters, polarizers, polarizing beam splitters, wave plates (e.g., half-wave or quarter-wave plates), diffractive elements, holographic elements, isolators, couplers, detectors, combiners, or collimators. The optical components in a lidar system 100 may be free-space optical components, fiber-coupled optical components, or a combination of free-space and fiber-coupled optical components.

In particular embodiments, lidar system 100 may include a telescope, one or more lenses, or one or more mirrors to expand, focus, or collimate the output beam 125 or the input beam 135 to a desired beam diameter or divergence. As an example, the lidar system 100 may include one or more lenses to focus the input beam 135 onto an active region of receiver 140. As another example, the lidar system 100 may include one or more flat mirrors or curved mirrors (e.g., concave, convex, or parabolic mirrors) to steer or focus the output beam 125 or the input beam 135. For example, the lidar system 100 may include an off-axis parabolic mirror to focus the input beam 135 onto an active region of receiver 140. As illustrated in FIG. 1, the lidar system 100 may include mirror 115 (which may be a metallic or dielectric mirror), and mirror 115 may be configured so that light beam 125 passes through the mirror 115 or passes along an edge or side of the mirror 115. As an example, mirror 115 (which may be referred to as an overlap mirror, superposition mirror, or beam-combiner mirror) may include a hole, slot, or aperture which output light beam 125 passes through. As another example, mirror 115 may be configured so that at least 80% of output beam 125 passes through mirror 115 and at least 80% of input beam 135 is reflected by mirror 115. As another example, rather than passing through the mirror 115, the output beam 125 may be directed to pass alongside the mirror 115 with a gap (e.g., a gap of width approximately 0.1 mm, 0.5 mm, 1 mm, 2 mm, 5 mm, or 10 mm) between the output beam 125 and an edge of the mirror 115. In particular embodiments, mirror 115 may provide for output beam 125 and input beam 135 to be substantially coaxial so that the two beams travel along substantially the same optical path (albeit in opposite directions).

In particular embodiments, lidar system 100 may include a scanner 120 to steer the output beam 125 in one or more directions downrange. As an example, scanner 120 may include one or more scanning mirrors that are configured to rotate, oscillate, tilt, pivot, or move in an angular manner about one or more axes. In particular embodiments, a flat scanning mirror may be attached to a scanner actuator or mechanism which scans the mirror over a particular angular range. As an example, scanner 120 may include a galvanometer scanner, a resonant scanner, a piezoelectric actuator, a polygon-mirror scanner, a rotating-prism scanner, a voice coil motor, an electric motor (e.g., a DC motor, a brushless DC motor, a synchronous electric motor, or a stepper motor), or a microelectromechanical systems (MEMS) device, or any other suitable actuator or mechanism. In particular embodiments, scanner 120 may be configured to scan the output beam 125 over a 5-degree angular range, 20-degree angular range, 30-degree angular range, 60-degree angular range, or any other suitable angular range. As an example, a scanning mirror may be configured to periodically oscillate or rotate back and forth over a 15-degree range, which results in the output beam 125 scanning across a 30-degree range (e.g., a 0-degree rotation by a scanning mirror results in a 20-degree angular scan of output beam 125). In particular embodiments, a field of regard (FOR) of a lidar system 100 may refer to an area, region, or angular range over which the lidar system 100 may be configured to scan or capture distance information. As an example, a lidar system 100 with an output beam 125 with a 30-degree scanning range may be referred to as having a 30-degree angular field of regard. As another example, a lidar system 100 with a scanning mirror that rotates over a 30-degree range may produce an output beam 125 that scans across a 60-degree range (e.g., a 60-degree FOR). In particular embodiments, lidar system 100 may have a FOR of approximately 10°, 20°, 40°, 60°, 120°, or any other suitable FOR. In particular embodiments, a FOR may be referred to as a scan region.

In particular embodiments, scanner 120 may be configured to scan the output beam 125 (which may include at least a portion of the pulses of light emitted by light source 110) across a FOR of the lidar system 100. In particular embodiments, scanner 120 may be configured to scan the output beam 125 horizontally and vertically, and lidar system 100 may have a particular FOR along the horizontal direction and another particular FOR along the vertical direction. As an example, lidar system 100 may have a horizontal FOR of 10° to 120° and a vertical FOR of 2° to 45°. In particular embodiments, scanner 120 may include a first mirror and a second mirror, where the first mirror directs the output beam 125 toward the second mirror, and the second mirror directs the output beam 125 downrange. As an example, the first mirror may scan the output beam 125 along a first direction, and the second mirror may scan the output beam 125 along a second direction that is substantially orthogonal to the first direction. As another example, the first mirror may scan the output beam 125 along a substantially horizontal direction, and the second mirror may scan the output beam 125 along a substantially vertical direction (or vice versa). In particular embodiments, scanner 120 may be referred to as a beam scanner, optical scanner, or laser scanner.

In particular embodiments, one or more scanning mirrors may be communicatively coupled to controller 150 which may control the scanning mirror(s) so as to guide the output beam 125 in a desired direction downrange or along a desired scan pattern. In particular embodiments, a scan pattern may refer to a pattern or path along which the output beam 125 is directed. As an example, scanner 120 may include two scanning mirrors configured to scan the output beam 125 across a 60° horizontal FOR and a 20° vertical FOR. The two scanner mirrors may be controlled to follow a scan path that substantially covers the 60°×20° FOR. As an example, the scan path may result in a point cloud with pixels that substantially cover the 60°×20° FOR. The pixels may be approximately evenly distributed across the 60°×20° FOR. Alternatively, the pixels may have a particular non-uniform distribution (e.g., the pixels may be distributed across all or a portion of the 60°×20° FOR, and the pixels may have a higher density in one or more particular regions of the 60°×20° FOR).

In particular embodiments, a light source 110 may emit pulses of light which are scanned by scanner 120 across a FOR of lidar system 100. One or more of the emitted pulses of light may be scattered by a target 130 located downrange from the lidar system 100, and a receiver 140 may detect at least a portion of the pulses of light scattered by the target 130. In particular embodiments, receiver 140 may be referred to as a photoreceiver, optical receiver, optical sensor, detector, photodetector, or optical detector. In particular embodiments, lidar system 100 may include a receiver 140 that receives or detects at least a portion of input beam 135 and produces an electrical signal that corresponds to input beam 135. As an example, if input beam 135 includes an optical pulse, then receiver 140 may produce an electrical current or voltage pulse that corresponds to the optical pulse detected by receiver 140. As another example, receiver 140 may include one or more avalanche photodiodes (APDs) or one or more single-photon avalanche diodes (SPADs). As another example, receiver 140 may include one or more PN photodiodes (e.g., a photodiode structure formed by a p-type semiconductor and a n-type semiconductor) or one or more PIN photodiodes (e.g., a photodiode structure formed by an undoped intrinsic semiconductor region located between p-type and n-type regions). An APD, SPAD, PN photodiode, or PIN photodiode may be referred to as a detector, photodetector, or photodiode. A detector that is part of receiver 140 may have an active region or an avalanche-multiplication region that includes silicon, germanium, or InGaAs. The active region of a detector may have any suitable size, such as for example, a diameter or width of approximately 20-500 µm.

In particular embodiments, receiver 140 may include circuitry that performs signal amplification, sampling, filtering, signal conditioning, analog-to-digital conversion, time-to-digital conversion, pulse detection, threshold detection, rising-edge detection, or falling-edge detection. As an example, receiver 140 may include a transimpedance amplifier that converts a received photocurrent (e.g., a current produced by an APD in response to a received optical signal) into a voltage signal. The voltage signal may be sent to pulse-detection circuitry that produces an analog or digital output signal 145 that corresponds to one or more characteristics (e.g., rising edge, falling edge, amplitude, or duration) of a received optical pulse. As an example, the pulse-detection circuitry may perform a time-to-digital conversion to produce a digital output signal 145. The electrical output signal 145 may be sent to controller 150 for processing or analysis (e.g., to determine a time-of-flight value corresponding to a received optical pulse).

In particular embodiments, controller 150 may be electrically coupled or communicatively coupled to light source 110, scanner 120, or receiver 140. As an example, controller 150 may receive electrical trigger pulses or edges from light source 110, where each pulse or edge corresponds to the emission of an optical pulse by light source 110. As another example, controller 150 may provide instructions, a control signal, or a trigger signal to light source 110 indicating when light source 110 should produce optical pulses. Controller 150 may send an electrical trigger signal that includes electrical pulses, where each electrical pulse results in the emission of an optical pulse by light source 110. In particular embodiments, the frequency, period, duration, pulse energy, peak power, average power, or wavelength of the optical pulses produced by light source 110 may be adjusted based on instructions, a control signal, or trigger pulses provided by controller 150. In particular embodiments, controller 150 may be coupled to light source 110 and receiver 140, and controller 150 may determine a time-of-flight value for an optical pulse based on timing information associated with when the pulse was emitted by light source 110 and when a portion of the pulse (e.g., input beam 135) was detected or received by receiver 140. In particular embodiments, controller 150 may include circuitry that performs signal amplification, sampling, filtering, signal conditioning, analog-to-digital conversion, time-to-digital conversion, pulse detection, threshold detection, rising-edge detection, or falling-edge detection.

In particular embodiments, a lidar system 100 may be used to determine the distance to one or more downrange targets 130. By scanning the lidar system 100 across a field of regard, the system can be used to map the distance to a number of points within the field of regard. Each of these depth-mapped points may be referred to as a pixel or a voxel. A collection of pixels captured in succession (which may be referred to as a depth map, a point cloud, or a frame) may be rendered as an image or may be analyzed to identify or detect objects or to determine a shape or distance of objects within the FOR. As an example, a point cloud may cover a field of regard that extends 60° horizontally and 15° vertically, and the point cloud may include a frame of 100-2000 pixels in the horizontal direction by 4-400 pixels in the vertical direction.

In particular embodiments, lidar system 100 may be configured to repeatedly capture or generate point clouds of a field of regard at any suitable frame rate between approximately 0.1 frames per second (FPS) and approximately 1,000 FPS. As an example, lidar system 100 may generate point clouds at a frame rate of approximately 0.1 FPS, 0.5 FPS, 1 FPS, 2 FPS, 5 FPS, 10 FPS, 20 FPS, 100 FPS, 500 FPS, or 1,000 FPS. As another example, lidar system 100 may be configured to produce optical pulses at a rate of $5\times10^5$ pulses/second (e.g., the system may determine 500,000 pixel distances per second) and scan a frame of 1000×50 pixels (e.g., 50,000 pixels/frame), which corresponds to a point-cloud frame rate of 10 frames per second (e.g., 10 point clouds per second). In particular embodiments, a point-cloud frame rate may be substantially fixed, or a point-cloud frame rate may be dynamically adjustable. As an example, a lidar system 100 may capture one or more point clouds at a particular frame rate (e.g., 1 Hz) and then switch to capture one or more point clouds at a different frame rate (e.g., 10 Hz). A slower frame rate (e.g., 1 Hz) may be used to capture one or more high-resolution point clouds, and a faster frame rate (e.g., 10 Hz) may be used to rapidly capture multiple lower-resolution point clouds.

In particular embodiments, a lidar system 100 may be configured to sense, identify, or determine distances to one or more targets 130 within a field of regard. As an example, a lidar system 100 may determine a distance to a target 130, where all or part of the target 130 is contained within a field of regard of the lidar system 100. All or part of a target 130 being contained within a FOR of the lidar system 100 may refer to the FOR overlapping, encompassing, or enclosing at least a portion of the target 130. In particular embodiments, target 130 may include all or part of an object that is moving or stationary relative to lidar system 100. As an example, target 130 may include all or a portion of a person, vehicle, motorcycle, truck, train, bicycle, wheelchair, pedestrian, animal, road sign, traffic light, lane marking, road-surface marking, parking space, pylon, guard rail, traffic barrier, pothole, railroad crossing, obstacle in or near a road, curb, stopped vehicle on or beside a road, utility pole, house, building, trash can, mailbox, tree, any other suitable object, or any suitable combination of all or part of two or more objects. In particular embodiments, a target 130 may be referred to as an object.

In particular embodiments, one or more lidar systems 100 may be integrated into a vehicle. As an example, multiple lidar systems 100 may be integrated into a car to provide a complete 360-degree horizontal FOR around the car. As another example, 4-10 lidar systems 100, each system having a 45-degree to 90-degree horizontal FOR, may be combined together to form a sensing system that provides a point cloud covering a 360-degree horizontal FOR. The lidar systems 100 may be oriented so that adjacent FORs have an amount of spatial or angular overlap to allow data from the multiple lidar systems 100 to be combined or stitched together to form a single or continuous 360-degree point cloud. As an example, the FOR of each lidar system 100 may have approximately 1-15 degrees of overlap with an adjacent FOR. In particular embodiments, a vehicle may refer to a mobile machine configured to transport people or cargo. For example, a vehicle may include, may take the form of, or may be referred to as a car, automobile, motor vehicle, truck, bus, van, trailer, off-road vehicle, farm vehicle, lawn mower, construction equipment, forklift, robot, golf cart, motorhome, taxi, motorcycle, scooter, bicycle, skateboard, train, snowmobile, watercraft (e.g., a ship or boat), aircraft (e.g., a fixed-wing aircraft, helicopter, or dirigible), or spacecraft. In particular embodiments, a vehicle may include an internal combustion engine or an electric motor that provides propulsion for the vehicle.

In particular embodiments, one or more lidar systems 100 may be included in a vehicle as part of an advanced driver assistance system (ADAS) to assist a driver of the vehicle in the driving process. For example, a lidar system 100 may be part of an ADAS that provides information or feedback to a driver (e.g., to alert the driver to potential problems or hazards) or that automatically takes control of part of a vehicle (e.g., a braking system or a steering system) to avoid collisions or accidents. A lidar system 100 may be part of a vehicle ADAS that provides adaptive cruise control, automated braking, automated parking, collision avoidance, alerts the driver to hazards or other vehicles, maintains the vehicle in the correct lane, or provides a warning if an object or another vehicle is in a blind spot.

In particular embodiments, one or more lidar systems 100 may be integrated into a vehicle as part of an autonomous-vehicle driving system. As an example, a lidar system 100 may provide information about the surrounding environment to a driving system of an autonomous vehicle. An autonomous-vehicle driving system may include one or more computing systems that receive information from a lidar system 100 about the surrounding environment, analyze the received information, and provide control signals to the vehicle's driving systems (e.g., steering wheel, accelerator, brake, or turn signal). As an example, a lidar system 100 integrated into an autonomous vehicle may provide an autonomous-vehicle driving system with a point cloud every 0.1 seconds (e.g., the point cloud has a 10 Hz update rate, representing 10 frames per second). The autonomous-vehicle driving system may analyze the received point clouds to sense or identify targets 130 and their respective locations, distances, or speeds, and the autonomous-vehicle driving system may update control signals based on this information. As an example, if lidar system 100 detects a vehicle ahead that is slowing down or stopping, the autonomous-vehicle driving system may send instructions to release the accelerator and apply the brakes.

In particular embodiments, an autonomous vehicle may be referred to as an autonomous car, driverless car, self-driving car, robotic car, or unmanned vehicle. In particular embodiments, an autonomous vehicle may refer to a vehicle configured to sense its environment and navigate or drive with little or no human input. As an example, an autonomous vehicle may be configured to drive to any suitable location and control or perform all safety-critical functions (e.g., driving, steering, braking, parking) for the entire trip, with the driver not expected to control the vehicle at any time. As another example, an autonomous vehicle may allow a driver to safely turn their attention away from driving tasks in particular environments (e.g., on freeways), or an autonomous vehicle may provide control of a vehicle in all but a few environments, requiring little or no input or attention from the driver.

In particular embodiments, an autonomous vehicle may be configured to drive with a driver present in the vehicle, or an autonomous vehicle may be configured to operate the vehicle with no driver present. As an example, an autonomous vehicle may include a driver's seat with associated controls (e.g., steering wheel, accelerator pedal, and brake pedal), and the vehicle may be configured to drive with no one seated in the driver's seat or with little or no input from a person seated in the driver's seat. As another example, an autonomous vehicle may not include any driver's seat or associated driver's controls, and the vehicle may perform substantially all driving functions (e.g., driving, steering, braking, parking, and navigating) without human input. As another example, an autonomous vehicle may be configured to operate without a driver (e.g., the vehicle may be configured to transport human passengers or cargo without a driver present in the vehicle). As another example, an autonomous vehicle may be configured to operate without any human passengers (e.g., the vehicle may be configured for transportation of cargo without having any human passengers onboard the vehicle).

Although this disclosure describes or illustrates example embodiments of lidar systems 100 or light sources 110 that produce light waveforms that include pulses of light, the embodiments described or illustrated herein may also be applied to other types of light waveforms, including continuous-wave (CW) light or modulated light waveforms. For example, a lidar system 100 as described or illustrated herein may include a light source 110 configured to produce pulses of light. Alternatively, a lidar system 100 may be configured to act as a frequency-modulated continuous-wave (FMCW) lidar system and may include a light source 110 configured to produce CW light or a frequency-modulated light waveform.

A pulsed lidar system is one type of lidar system 100 in which the light source 110 emits pulses of light, and the distance to a remote target 130 is determined from the time-of-flight for a pulse of light to travel to the target 130 and back. Another type of lidar system 100 is a frequency-modulated lidar system, which may be referred to as a frequency-modulated continuous-wave (FMCW) lidar system. A FMCW lidar system uses frequency-modulated light to determine the distance to a remote target 130 based on a modulation frequency of the received light (which is scattered from a remote target) relative to the modulation frequency of the emitted light. For example, for a linearly chirped light source (e.g., a frequency modulation that produces a linear change in frequency with time), the larger the frequency difference between the emitted light and the received light, the farther away the target 130 is located. The frequency difference can be determined by mixing the received light with a portion of the emitted light (e.g., by coupling the two beams onto a detector, or mixing analog electric signals corresponding to the received light and the emitted light) and determining the resulting beat frequency. For example, the electrical signal from an APD can be analyzed using a fast Fourier transform (FFT) technique to determine the frequency difference between the emitted light and the received light.

If a linear frequency modulation m (e.g., in units of Hz/s) is applied to a CW laser, then the distance D from the target 130 to the lidar system 100 may be expressed as $D=c \cdot \Delta f/(2m)$, where c is the speed of light and $\Delta f$ is the difference in frequency between the transmitted light and the received light. For example, for a linear frequency modulation of $10^{12}$ Hz/s (or, 1 MHz/μs), if a frequency difference of 330 kHz is measured, then the distance to the target is approximately 50 meters. Additionally, a frequency difference of 1.33 MHz corresponds to a target located approximately 200 meters away.

The light source 110 for a FMCW lidar system can be a fiber laser (e.g., a seed laser diode followed by one or more optical amplifiers) or a direct-emitter laser diode. The seed laser diode or the direct-emitter laser diode can be operated in a CW manner (e.g., by driving the laser diode with a substantially constant DC current), and the frequency modulation can be provided by an external modulator (e.g., an electro-optic phase modulator). Alternatively, the frequency modulation can be produced by applying a DC bias current along with a current modulation to the seed laser diode or the direct-emitter laser diode. The current modulation produces a corresponding refractive-index modulation in the laser diode, which results in a frequency modulation of the light emitted by the laser diode. The current-modulation component (and corresponding frequency modulation) can have any suitable frequency or shape (e.g., piecewise linear, sinusoidal, triangle-wave, or sawtooth).

Figure 2:
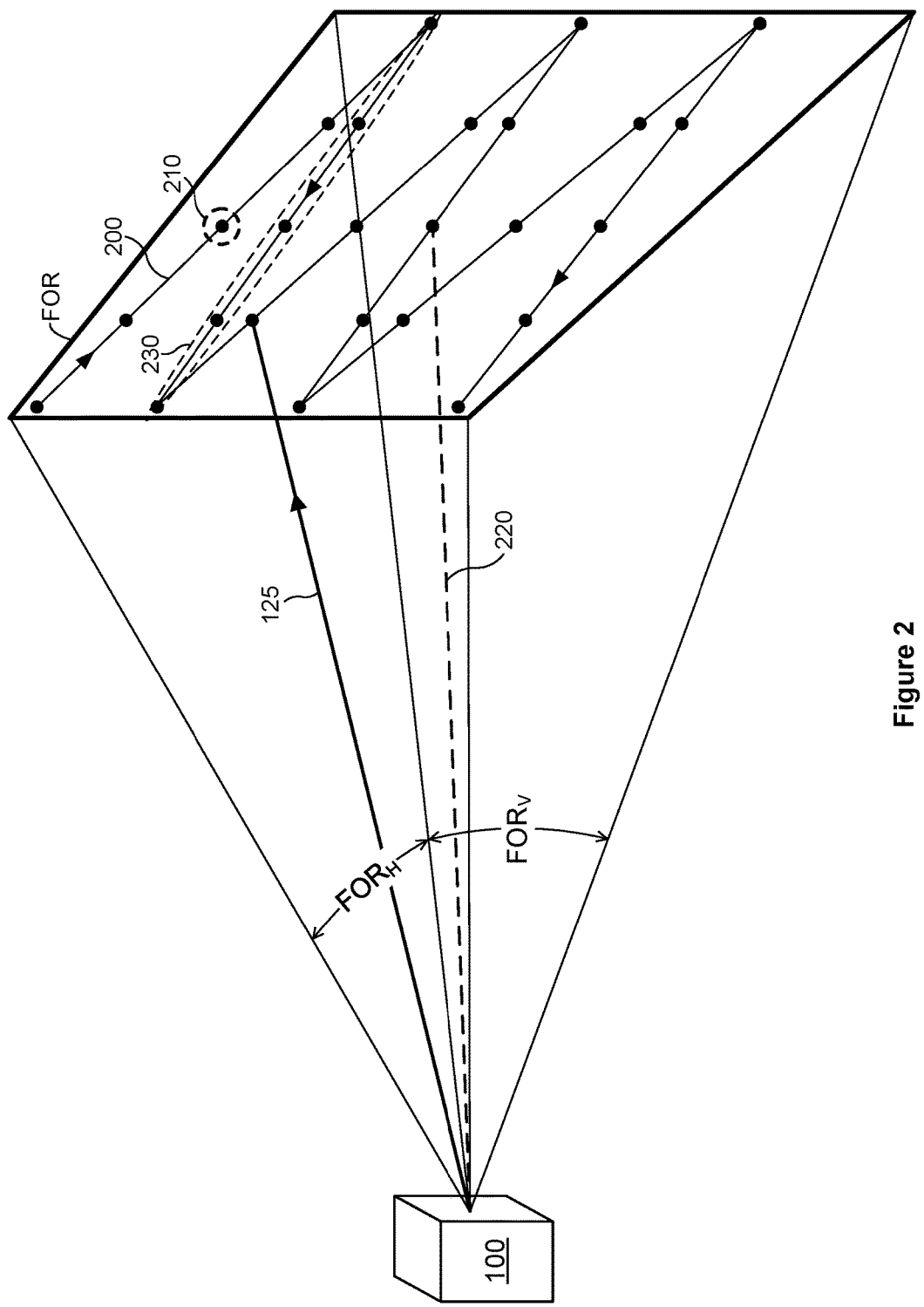
FIG. 2 illustrates an example scan pattern produced by a lidar system.

FIG. 2 illustrates an example scan pattern 200 produced by a lidar system 100. A scan pattern 200 (which may be referred to as an optical scan pattern, optical scan path, scan path, or scan) may represent a path or course followed by output beam 125 as it is scanned across all or part of a FOR. Each traversal of a scan pattern 200 may correspond to the capture of a single frame or a single point cloud. In particular embodiments, a lidar system 100 may be configured to scan output optical beam 125 along one or more particular scan patterns 200. In particular embodiments, a scan pattern 200 may scan across any suitable field of regard (FOR) having any suitable horizontal FOR ($FOR_H$) and any suitable vertical FOR ($FOR_V$). For example, a scan pattern 200 may have a field of regard represented by angular dimensions (e.g., $FOR_H \times FOR_V$) 40°×30°, 90°×40°, or 60°×15°. As another example, a scan pattern 200 may have a $FOR_H$ greater than or equal to 10°, 25°, 30°, 40°, 60°, 90°, or 120°. As another example, a scan pattern 200 may have a $FOR_V$ greater than or equal to 2°, 5°, 10°, 15°, 20°, 30°, or 45°. In the example of FIG. 2, reference line 220 represents a center of the field of regard of scan pattern 200. In particular embodiments, reference line 220 may have any suitable orientation, such as for example, a horizontal angle of 0° (e.g., reference line 220 may be oriented straight ahead) and a vertical angle of 0° (e.g., reference line 220 may have an inclination of 0°), or reference line 220 may have a nonzero horizontal angle or a nonzero inclination (e.g., a vertical angle of +10° or −10°). In FIG. 2, if the scan pattern 200 has a 60°×15° field of regard, then scan pattern 200 covers a ±30° horizontal range with respect to reference line 220 and a ±7.5° vertical range with respect to reference line 220. Additionally, optical beam 125 in FIG. 2 has an orientation of approximately −15° horizontal and +3° vertical with respect to reference line 220. Optical beam 125 may be referred to as having an azimuth of −15° and an altitude of +3° relative to reference line 220. In particular embodiments, an azimuth (which may be referred to as an azimuth angle) may represent a horizontal angle with respect to reference line 220, and an altitude (which may be referred to as an altitude angle, elevation, or elevation angle) may represent a vertical angle with respect to reference line 220.

In particular embodiments, a scan pattern 200 may include multiple pixels 210, and each pixel 210 may be associated with one or more laser pulses and one or more corresponding distance measurements. Additionally, a scan pattern 200 may include multiple scan lines 230, where each scan line represents one scan across at least part of a field of regard, and each scan line 230 may include multiple pixels 210. In FIG. 2, scan line 230 includes five pixels 210 and corresponds to an approximately horizontal scan across the FOR from right to left, as viewed from the lidar system 100. In particular embodiments, a cycle of scan pattern 200 may include a total of $P_x \times P_y$ pixels 210 (e.g., a two-dimensional distribution of $P_x$ by $P_y$ pixels). As an example, scan pattern 200 may include a distribution with dimensions of approximately 100-2,000 pixels 210 along a horizontal direction and approximately 4-400 pixels 210 along a vertical direction. As another example, scan pattern 200 may include a distribution of 1,000 pixels 210 along the horizontal direction by 64 pixels 210 along the vertical direction (e.g., the frame size is 1000×64 pixels) for a total of 64,000 pixels per cycle of scan pattern 200. In particular embodiments, the number of pixels 210 along a horizontal direction may be referred to as a horizontal resolution of scan pattern 200, and the number of pixels 210 along a vertical direction may be referred to as a vertical resolution. As an example, scan pattern 200 may have a horizontal resolution of greater than or equal to 100 pixels 210 and a vertical resolution of greater than or equal to 4 pixels 210. As another example, scan pattern 200 may have a horizontal resolution of 100-2,000 pixels 210 and a vertical resolution of 4-400 pixels 210.

In particular embodiments, each pixel 210 may be associated with a distance (e.g., a distance to a portion of a target 130 from which an associated laser pulse was scattered) or one or more angular values. As an example, a pixel 210 may be associated with a distance value and two angular values (e.g., an azimuth and altitude) that represent the angular location of the pixel 210 with respect to the lidar system 100. A distance to a portion of target 130 may be determined based at least in part on a time-of-flight measurement for a corresponding pulse. An angular value (e.g., an azimuth or altitude) may correspond to an angle (e.g., relative to reference line 220) of output beam 125 (e.g., when a corresponding pulse is emitted from lidar system 100) or an angle of input beam 135 (e.g., when an input signal is received by lidar system 100). In particular embodiments, an angular value may be determined based at least in part on a position of a component of scanner 120. As an example, an azimuth or altitude value associated with a pixel 210 may be determined from an angular position of one or more corresponding scanning mirrors of scanner 120.

Figure 3:
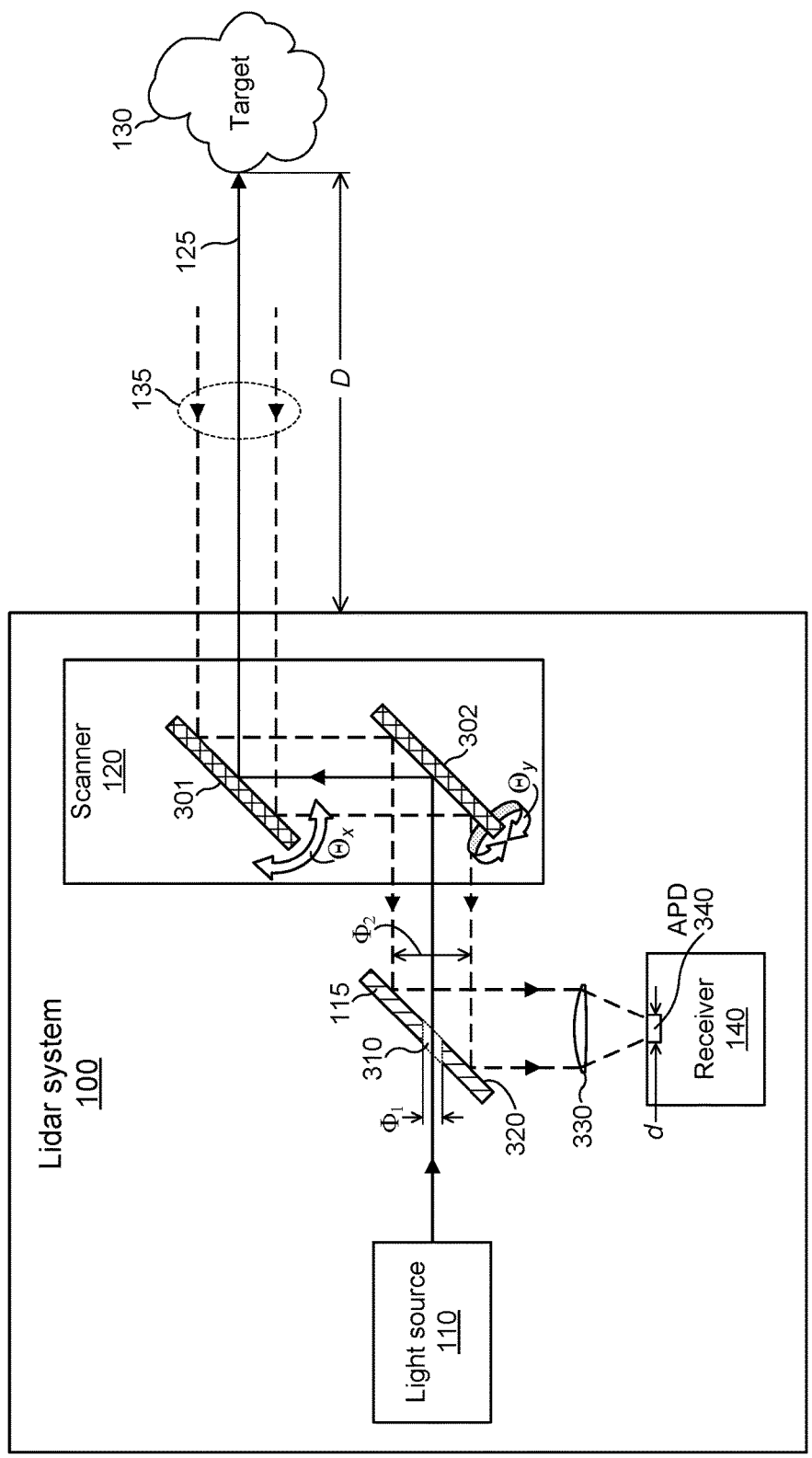
FIG. 3 illustrates an example lidar system with an example overlap mirror.

FIG. 3 illustrates an example lidar system 100 with an example overlap mirror 115. In particular embodiments, a lidar system 100 may include a light source 110 configured to emit pulses of light and a scanner 120 configured to scan at least a portion of the emitted pulses of light across a field of regard. As an example, the light source 110 may include a pulsed solid-state laser or a pulsed fiber laser, and the optical pulses produced by the light source 110 may be directed through aperture 310 of overlap mirror 115 and then coupled to scanner 120. In particular embodiments, a lidar system 100 may include a receiver 140 configured to detect at least a portion of the scanned pulses of light scattered by a target 130 located a distance D from the lidar system 100. As an example, one or more pulses of light that are directed downrange from lidar system 100 by scanner 120 (e.g., as part of output beam 125) may scatter off a target 130, and a portion of the scattered light may propagate back to the lidar system 100 (e.g., as part of input beam 135) and be detected by receiver 140.

In particular embodiments, lidar system 100 may include one or more processors (e.g., a controller 150) configured to determine a distance D from the lidar system 100 to a target 130 based at least in part on a round-trip time of flight for an emitted pulse of light to travel from the lidar system 100 to the target 130 and back to the lidar system 100. The target 130 may be at least partially contained within a field of regard of the lidar system 100 and located a distance D from the lidar system 100 that is less than or equal to a maximum range $R_{MAX}$ of the lidar system 100. In particular embodiments, a maximum range (which may be referred to as a maximum distance) of a lidar system 100 may refer to the maximum distance over which the lidar system 100 is configured to sense or identify targets 130 that appear in a field of regard of the lidar system 100. The maximum range of lidar system 100 may be any suitable distance, such as for example, 25 m, 50 m, 100 m, 200 m, 500 m, or 1 km. As an example, a lidar system 100 with a 200-m maximum range may be configured to sense or identify various targets 130 located up to 200 m away from the lidar system 100. For a lidar system 100 with a 200-m maximum range ($R_{MAX}$=200 m), the time of flight corresponding to the maximum range is approximately $2 \cdot R_{MAX}/c \cong 1.33$ µs.

In particular embodiments, light source 110, scanner 120, and receiver 140 may be packaged together within a single housing, where a housing may refer to a box, case, or enclosure that holds or contains all or part of a lidar system 100. As an example, a lidar-system enclosure may contain a light source 110, overlap mirror 115, scanner 120, and receiver 140 of a lidar system 100. Additionally, the lidar-system enclosure may include a controller 150. The lidar-system enclosure may also include one or more electrical connections for conveying electrical power or electrical signals to or from the enclosure. In particular embodiments, one or more components of a lidar system 100 may be located remotely from a lidar-system enclosure. As an example, all or part of light source 110 may be located remotely from a lidar-system enclosure, and pulses of light produced by the light source 110 may be conveyed to the enclosure via optical fiber. As another example, all or part of a controller 150 may be located remotely from a lidar-system enclosure.

In particular embodiments, light source 110 may include an eye-safe laser, or lidar system 100 may be classified as an eye-safe laser system or laser product. An eye-safe laser, laser system, or laser product may refer to a system that includes a laser with an emission wavelength, average power, peak power, peak intensity, pulse energy, beam size, beam divergence, exposure time, or scanned output beam such that emitted light from the system presents little or no possibility of causing damage to a person's eyes. As an example, light source 110 or lidar system 100 may be classified as a Class 1 laser product (as specified by the 60825-1 standard of the International Electrotechnical Commission (IEC)) or a Class I laser product (as specified by Title 21, Section 1040.10 of the United States Code of Federal Regulations (CFR)) that is safe under all conditions of normal use. In particular embodiments, lidar system 100 may be an eye-safe laser product (e.g., with a Class 1 or Class I classification) configured to operate at any suitable wavelength between approximately 900 nm and approximately 2100 nm. As an example, lidar system 100 may include a laser with an operating wavelength between approximately 1400 nm and approximately 1600 nm, and the laser or the lidar system 100 may be operated in an eye-safe manner. As another example, lidar system 100 may be an eye-safe laser product that includes a scanned laser with an operating wavelength between approximately 1530 nm and approximately 1560 nm. As another example, lidar system 100 may be a Class 1 or Class I laser product that includes a laser diode, fiber laser, or solid-state laser with an operating wavelength between approximately 1400 nm and approximately 1600 nm.

In particular embodiments, scanner 120 may include one or more mirrors, where each mirror is mechanically driven by a galvanometer scanner, a resonant scanner, a MEMS device, a voice coil motor, an electric motor, or any suitable combination thereof. A galvanometer scanner (which may be referred to as a galvanometer actuator) may include a galvanometer-based scanning motor with a magnet and coil. When an electrical current is supplied to the coil, a rotational force is applied to the magnet, which causes a mirror attached to the galvanometer scanner to rotate. The electrical current supplied to the coil may be controlled to dynamically change the position of the galvanometer mirror. A resonant scanner (which may be referred to as a resonant actuator) may include a spring-like mechanism driven by an actuator to produce a periodic oscillation at a substantially fixed frequency (e.g., 1 kHz). A MEMS-based scanning device may include a mirror with a diameter between approximately 1 and 10 mm, where the mirror is rotated back and forth using electromagnetic or electrostatic actuation. A voice coil motor (which may be referred to as a voice coil actuator) may include a magnet and coil. When an electrical current is supplied to the coil, a translational force is applied to the magnet, which causes a mirror attached to the magnet to move or rotate. An electric motor, such as for example, a brushless DC motor or a synchronous electric motor, may be used to continuously rotate a mirror (e.g., a polygon mirror) at a substantially fixed frequency (e.g., a rotational frequency of approximately 1 Hz, 10 Hz, 50 Hz, 100 Hz, 500 Hz, or 1,000 Hz). The mirror may be continuously rotated in one rotation direction (e.g., clockwise or counter-clockwise relative to a particular rotation axis).

In particular embodiments, a scanner 120 may include any suitable number of mirrors driven by any suitable number of mechanical actuators. As an example, a scanner 120 may include a single mirror configured to scan an output beam 125 along a single direction (e.g., a scanner 120 may be a one-dimensional scanner that scans along a horizontal or vertical direction). The mirror may be driven by one actuator (e.g., a galvanometer) or two actuators configured to drive the mirror in a push-pull configuration. As another example, a scanner 120 may include a single mirror that scans an output beam 125 along two directions (e.g., horizontal and vertical). The mirror may be driven by two actuators, where each actuator provides rotational motion along a particular direction or about a particular axis. As another example, a scanner 120 may include two mirrors, where one mirror scans an output beam 125 along a substantially horizontal direction and the other mirror scans the output beam 125 along a substantially vertical direction. In the example of FIG. 3, scanner 120 includes two mirrors, mirror 301 and mirror 302. Mirror 302 rotates along the $\Theta_y$ direction and scans output beam 125 along a substantially vertical direction, and mirror 301 rotates along the $\Theta_x$ direction and scans output beam 125 along a substantially horizontal direction.

In particular embodiments, a scanner 120 may include two mirrors, where each mirror is driven by a corresponding galvanometer scanner. As an example, scanner 120 may include a galvanometer actuator that scans mirror 301 along a first direction (e.g., horizontal), and scanner 120 may include another galvanometer actuator that scans mirror 302 along a second direction (e.g., vertical). In particular embodiments, a scanner 120 may include two mirrors, where one mirror is driven by a galvanometer actuator and the other mirror is driven by a resonant actuator. As an example, a galvanometer actuator may scan mirror 301 along a first direction, and a resonant actuator may scan mirror 302 along a second direction. The first and second scanning directions may be substantially orthogonal to one another. As an example, the first direction may be substantially vertical, and the second direction may be substantially horizontal, or vice versa. In particular embodiments, a scanner 120 may include two mirrors, where one mirror is driven by an electric motor and the other mirror is driven by a galvanometer actuator. As an example, mirror 301 may be a polygon mirror that is rotated about a fixed axis by an electric motor (e.g., a brushless DC motor), and mirror 302 may be driven by a galvanometer or MEMS actuator. In particular embodiments, a scanner 120 may include two mirrors, where both mirrors are driven by electric motors. As an example, mirror 302 may be a polygon mirror driven by an electric motor, and mirror 301 may be driven by another electric motor. In particular embodiments, a scanner 120 may include one mirror driven by two actuators which are configured to scan the mirror along two substantially orthogonal directions. As an example, one mirror may be driven along a substantially horizontal direction by a resonant actuator or a galvanometer actuator, and the mirror may also be driven along a substantially vertical direction by a galvanometer actuator. As another example, a mirror may be driven along two substantially orthogonal directions by two resonant actuators or by two electric motors.

In the example of FIG. 3, lidar system 100 produces an output beam 125 and receives light from an input beam 135. The output beam 125, which includes at least a portion of the pulses of light emitted by light source 110, may be scanned across a field of regard. The input beam 135 may include at least a portion of the scanned pulses of light which are scattered by one or more targets 130 and detected by receiver 140. In particular embodiments, output beam 125 and input beam 135 may be substantially coaxial. The input and output beams being substantially coaxial may refer to the beams being at least partially overlapped or sharing a common propagation axis so that input beam 135 and output beam 125 travel along substantially the same optical path (albeit in opposite directions). As output beam 125 is scanned across a field of regard, the input beam 135 may follow along with the output beam 125 so that the coaxial relationship between the two beams is maintained.

In particular embodiments, a lidar system 100 may include an overlap mirror 115 configured to overlap the input beam 135 and output beam 125 so that they are substantially coaxial. In FIG. 3, the overlap mirror 115 includes a hole, slot, or aperture 310 which the output beam 125 passes through and a reflecting surface 320 that reflects at least a portion of the input beam 135 toward the receiver 140. The overlap mirror 115 may be oriented so that input beam 135 and output beam 125 are at least partially overlapped. In particular embodiments, input beam 135 may pass through a lens 330 which focuses the beam onto an active region of the receiver 140. The active region may refer to an area over which receiver 140 may receive or detect input light. The active region may have any suitable size or diameter d, such as for example, a diameter of approximately 25 µm, 50 µm, 80 µm, 100 µm, 200 µm, 500 µm, 1 mm, 2 mm, or 5 mm. For example, a receiver 140 may include an APD 340 to detect light, and the APD 340 may have an active region with a 100-µm diameter. In particular embodiments, overlap mirror 115 may have a reflecting surface 320 that is substantially flat or the reflecting surface 320 may be curved (e.g., mirror 115 may be an off-axis parabolic mirror configured to focus the input beam 135 onto an active region of the receiver 140). A reflecting surface 320 (which may be referred to as a reflective surface 320) may include a reflective metallic coating (e.g., gold, silver, or aluminum) or a reflective dielectric coating, and the reflecting surface 320 may have any suitable reflectivity R at an operating wavelength of the light source 110 (e.g., R greater than or equal to 70%, 80%, 90%, 95%, 98%, or 99%).

In particular embodiments, aperture 310 may have any suitable size or diameter $\Phi_1$, and input beam 135 may have any suitable size or diameter $\Phi_2$, where $\Phi_2$ is greater than $\Phi_1$. As an example, aperture 310 may have a diameter $\Phi_1$ of approximately 0.2 mm, 0.5 mm, 1 mm, 2 mm, 3 mm, 5 mm, or 10 mm, and input beam 135 may have a diameter $\Phi_2$ of approximately 2 mm, 5 mm, 10 mm, 15 mm, 20 mm, 30 mm, 40 mm, or 50 mm. In particular embodiments, reflective surface 320 of overlap mirror 115 may reflect greater than or equal to 70% of input beam 135 toward the receiver 140. As an example, if reflective surface 320 has a reflectivity R at an operating wavelength of the light source 110, then the fraction of input beam 135 directed toward the receiver 140 may be expressed as $R \times [1-(\Phi_1/\Phi_2)^2]$. For example, if R is 95%, $\Phi_1$ is 2 mm, and $\Phi_2$ is 10 mm, then approximately 91% of input beam 135 may be directed toward the receiver 140 by reflective surface 320.

Figure 4:
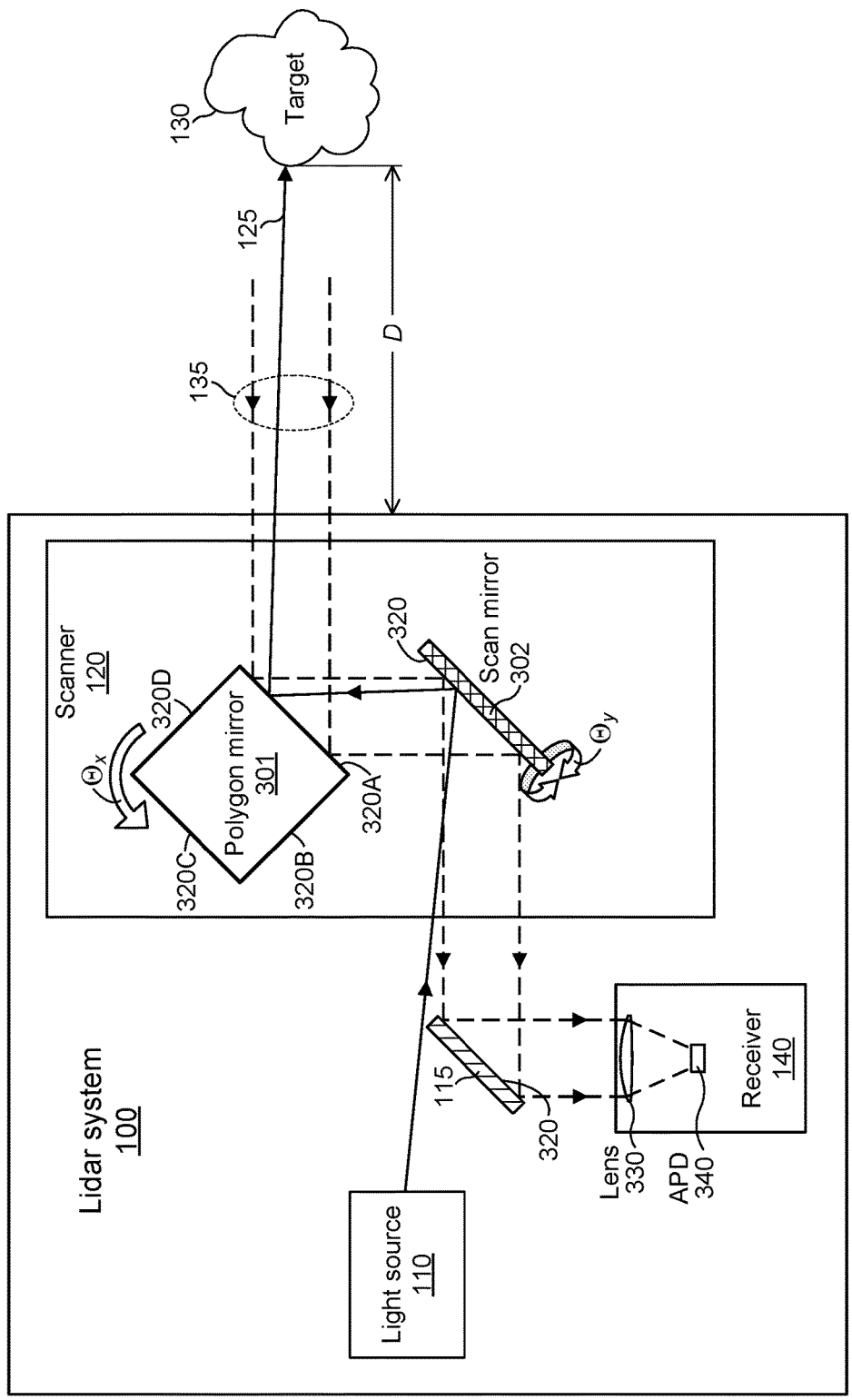
FIG. 4 illustrates an example lidar system with an example rotating polygon mirror.

FIG. 4 illustrates an example lidar system 100 with an example rotating polygon mirror 301. In particular embodiments, a scanner 120 may include a polygon mirror 301 configured to scan output beam 125 along a particular direction. In the example of FIG. 4, scanner 120 includes two scanning mirrors: (1) a polygon mirror 301 that rotates along the $\Theta_x$ direction and (2) a scanning mirror 302 that oscillates back and forth along the $\Theta_y$ direction. The output beam 125 from light source 110, which passes alongside mirror 115, is reflected by reflecting surface 320 of scan mirror 302 and is then reflected by a reflecting surface (e.g., surface 320A, 320B, 320C, or 320D) of polygon mirror 301. Scattered light from a target 130 returns to the lidar system 100 as input beam 135. The input beam 135 reflects from polygon mirror 301, scan mirror 302, and mirror 115, which directs input beam 135 through focusing lens 330 and to the APD 340 of receiver 140.

In particular embodiments, a polygon mirror 301 may be configured to rotate along a $\Theta_x$ or $\Theta_y$ direction and scan output beam 125 along a substantially horizontal or vertical direction, respectively. A rotation along a $\Theta_x$ direction may refer to a rotational motion of mirror 301 that results in output beam 125 scanning along a substantially horizontal direction. Similarly, a rotation along a $\Theta_y$ direction may refer to a rotational motion that results in output beam 125 scanning along a substantially vertical direction. In FIG. 4, mirror 301 is a polygon mirror that rotates along the $\Theta_x$ direction and scans output beam 125 along a substantially horizontal direction, and mirror 302 rotates along the $\Theta_y$ direction and scans output beam 125 along a substantially vertical direction. In particular embodiments, a polygon mirror 301 may be configured to scan output beam 125 along any suitable direction. As an example, a polygon mirror 301 may scan output beam 125 at any suitable angle with respect to a horizontal or vertical direction, such as for example, at an angle of approximately 0°, 10°, 20°, 30°, 45°, 60°, 70°, 80°, or 90° with respect to a horizontal or vertical direction.

In particular embodiments, a polygon mirror 301 may refer to a multi-sided object having reflective surfaces 320 on two or more of its sides or faces. As an example, a polygon mirror may include any suitable number of reflective faces (e.g., 2, 3, 4, 5, 6, 7, 8, or 10 faces), where each face includes a reflective surface 320. A polygon mirror 301 may have a cross-sectional shape of any suitable polygon, such as for example, a triangle (with three reflecting surfaces 320), square (with four reflecting surfaces 320), pentagon (with five reflecting surfaces 320), hexagon (with six reflecting surfaces 320), heptagon (with seven reflecting surfaces 320), or octagon (with eight reflecting surfaces 320). In FIG. 4, the polygon mirror 301 has a substantially square cross-sectional shape and four reflecting surfaces (320A, 320B, 320C, and 320D). The polygon mirror 301 in FIG. 4 may be referred to as a square mirror, a cube mirror, or a four-sided polygon mirror. In FIG. 4, the polygon mirror 301 may have a shape similar to a cube, cuboid, or rectangular prism. Additionally, the polygon mirror 301 may have a total of six sides, where four of the sides are faces with reflective surfaces (320A, 320B, 320C, and 320D).

In particular embodiments, a polygon mirror 301 may be continuously rotated in a clockwise or counter-clockwise rotation direction about a rotation axis of the polygon mirror 301. The rotation axis may correspond to a line that is perpendicular to the plane of rotation of the polygon mirror 301 and that passes through the center of mass of the polygon mirror 301. In FIG. 4, the polygon mirror 301 rotates in the plane of the drawing, and the rotation axis of the polygon mirror 301 is perpendicular to the plane of the drawing. An electric motor may be configured to rotate a polygon mirror 301 at a substantially fixed frequency (e.g., a rotational frequency of approximately 1 Hz (or 1 revolution per second), 10 Hz, 50 Hz, 100 Hz, 500 Hz, or 1,000 Hz). As an example, a polygon mirror 301 may be mechanically coupled to an electric motor (e.g., a brushless DC motor or a synchronous electric motor) which is configured to spin the polygon mirror 301 at a rotational speed of approximately 160 Hz (or, 9600 revolutions per minute (RPM)).

In particular embodiments, output beam 125 may be reflected sequentially from the reflective surfaces (320A, 320B, 320C, and 320D) as the polygon mirror 301 is rotated. This results in the output beam 125 being scanned along a particular scan axis (e.g., a horizontal or vertical scan axis) to produce a sequence of scan lines, where each scan line corresponds to a reflection of the output beam 125 from one of the reflective surfaces of the polygon mirror 301. In FIG. 4, the output beam 125 reflects off of reflective surface 320A to produce one scan line. Then, as the polygon mirror 301 rotates, the output beam 125 reflects off of reflective surfaces 320B, 320C, and 320D to produce a second, third, and fourth respective scan line.

In particular embodiments, output beam 125 may be directed to pass by a side of mirror 115 rather than passing through mirror 115. As an example, mirror 115 may not include an aperture 310, and the output beam 125 may be directed to pass along a side of mirror 115. In the example of FIG. 3, lidar system includes an overlap mirror 115 with an aperture 310 that output beam 125 passes through. In the example of FIG. 4, output beam 125 from light source 110 is directed to pass by mirror 115 (which does not include an aperture 310) and then to polygon mirror 301.

Figure 5:
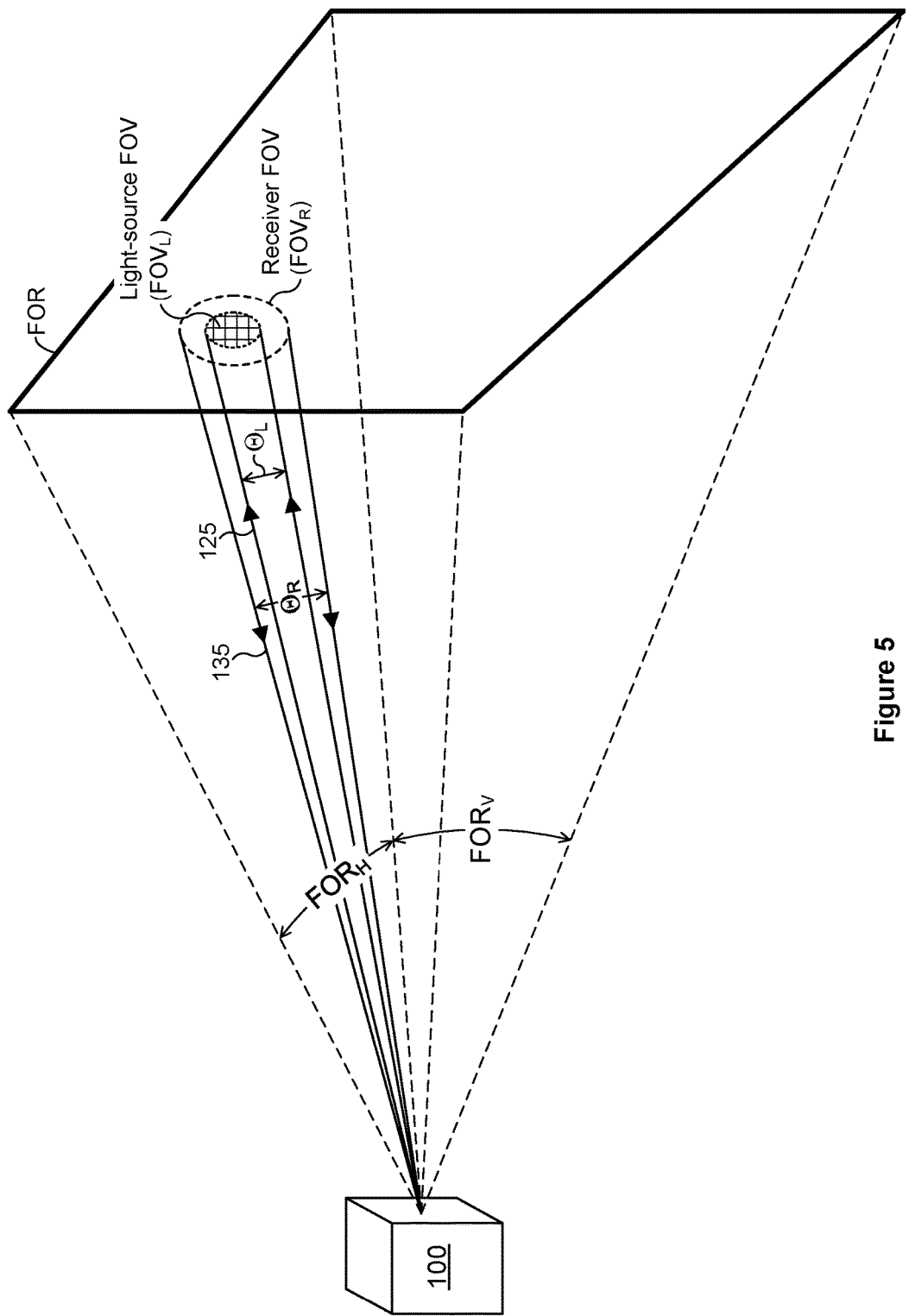
FIG. 5 illustrates an example light-source field of view and receiver field of view for a lidar system.

FIG. 5 illustrates an example light-source field of view ($FOV_L$) and receiver field of view ($FOV_R$) for a lidar system 100. A light source 110 of lidar system 100 may emit pulses of light as the $FOV_L$ and $FOV_R$ are scanned by scanner 120 across a field of regard (FOR). In particular embodiments, a light-source field of view may refer to an angular cone illuminated by the light source 110 at a particular instant of time. Similarly, a receiver field of view may refer to an angular cone over which the receiver 140 may receive or detect light at a particular instant of time, and any light outside the receiver field of view may not be received or detected. As an example, as the light-source field of view is scanned across a field of regard, a portion of a pulse of light emitted by the light source 110 may be sent downrange from lidar system 100, and the pulse of light may be sent in the direction that the $FOV_L$ is pointing at the time the pulse is emitted. The pulse of light may scatter off a target 130, and the receiver 140 may receive and detect a portion of the scattered light that is directed along or contained within the $FOV_R$.

In particular embodiments, scanner 120 may be configured to scan both a light-source field of view and a receiver field of view across a field of regard of the lidar system 100. Multiple pulses of light may be emitted and detected as the scanner 120 scans the $FOV_L$ and $FOV_R$ across the field of regard of the lidar system 100 while tracing out a scan pattern 200. In particular embodiments, the light-source field of view and the receiver field of view may be scanned synchronously with respect to one another, so that as the $FOV_L$ is scanned across a scan pattern 200, the $FOV_R$ follows substantially the same path at the same scanning speed. Additionally, the $FOV_L$ and $FOV_R$ may maintain the same relative position to one another as they are scanned across the field of regard. As an example, the $FOV_L$ may be substantially overlapped with or centered inside the $FOV_R$ (as illustrated in FIG. 5), and this relative positioning between $FOV_L$ and $FOV_R$ may be maintained throughout a scan. As another example, the $FOV_R$ may lag behind the $FOV_L$ by a particular, fixed amount throughout a scan (e.g., the $FOV_R$ may be offset from the $FOV_L$ in a direction opposite the scan direction).

In particular embodiments, the $FOV_L$ may have an angular size or extent $\Theta_L$ that is substantially the same as or that corresponds to the divergence of the output beam 125, and the $FOV_R$ may have an angular size or extent $\Theta_R$ that corresponds to an angle over which the receiver 140 may receive and detect light. In particular embodiments, the receiver field of view may be any suitable size relative to the light-source field of view. As an example, the receiver field of view may be smaller than, substantially the same size as, or larger than the angular extent of the light-source field of view. In particular embodiments, the light-source field of view may have an angular extent of less than or equal to 50 milliradians, and the receiver field of view may have an angular extent of less than or equal to 50 milliradians. The $FOV_L$ may have any suitable angular extent $\Theta_L$, such as for example, approximately 0.1 mrad, 0.2 mrad, 0.5 mrad, 1 mrad, 1.5 mrad, 2 mrad, 3 mrad, 5 mrad, 10 mrad, 20 mrad, 40 mrad, or 50 mrad. Similarly, the $FOV_R$ may have any suitable angular extent OR, such as for example, approximately 0.1 mrad, 0.2 mrad, 0.5 mrad, 1 mrad, 1.5 mrad, 2 mrad, 3 mrad, 5 mrad, 10 mrad, 20 mrad, 40 mrad, or 50 mrad. In particular embodiments, the light-source field of view and the receiver field of view may have approximately equal angular extents. As an example, $\Theta_L$ and $\Theta_R$ may both be approximately equal to 1 mrad, 2 mrad, or 4 mrad. In particular embodiments, the receiver field of view may be larger than the light-source field of view, or the light-source field of view may be larger than the receiver field of view. As an example, $\Theta_L$ may be approximately equal to 3 mrad, and $\Theta_R$ may be approximately equal to 4 mrad. As another example, $\Theta_R$ may be approximately L times larger than $\Theta_L$, where L is any suitable factor, such as for example, 1.1, 1.2, 1.5, 2, 3, 5, or 10.

In particular embodiments, a pixel 210 may represent or may correspond to a light-source field of view or a receiver field of view. As the output beam 125 propagates from the light source 110, the diameter of the output beam 125 (as well as the size of the corresponding pixel 210) may increase according to the beam divergence $\Theta_L$. As an example, if the output beam 125 has a $\Theta_L$ of 2 mrad, then at a distance of 100 m from the lidar system 100, the output beam 125 may have a size or diameter of approximately 20 cm, and a corresponding pixel 210 may also have a corresponding size or diameter of approximately 20 cm. At a distance of 200 m from the lidar system 100, the output beam 125 and the corresponding pixel 210 may each have a diameter of approximately 40 cm.

Figure 6:
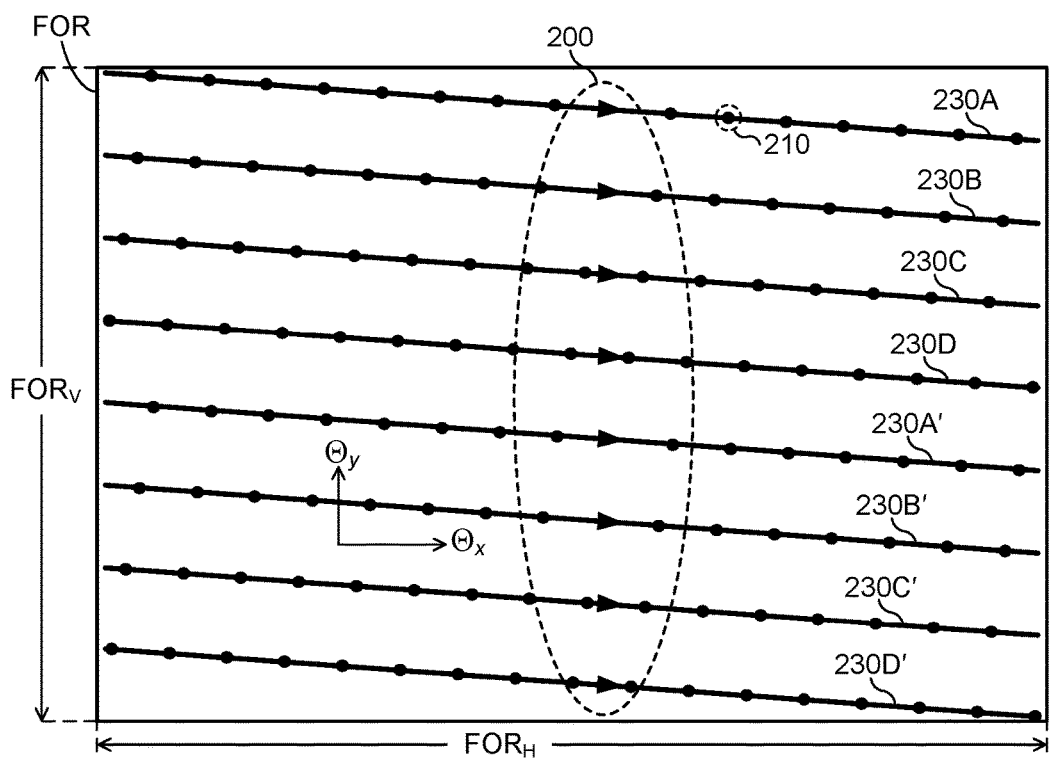
FIG. 6 illustrates an example unidirectional scan pattern that includes multiple pixels and multiple scan lines.

FIG. 6 illustrates an example unidirectional scan pattern 200 that includes multiple pixels 210 and multiple scan lines 230. In particular embodiments, scan pattern 200 may include any suitable number of scan lines 230 (e.g., approximately 1, 2, 5, 10, 20, 50, 100, 500, or 1,000 scan lines), and each scan line 230 of a scan pattern 200 may include any suitable number of pixels 210 (e.g., 1, 2, 5, 10, 20, 50, 100, 200, 500, 1,000, 2,000, or 5,000 pixels). The scan pattern 200 illustrated in FIG. 6 includes eight scan lines 230, and each scan line 230 includes approximately 16 pixels 210. In particular embodiments, a scan pattern 200 where the scan lines 230 are scanned in two directions (e.g., alternately scanning from right to left and then from left to right) may be referred to as a bidirectional scan pattern 200, and a scan pattern 200 where the scan lines 230 are scanned in the same direction may be referred to as a unidirectional scan pattern 200. The scan pattern 200 in FIG. 6 may be referred to as a unidirectional scan pattern 200 where each scan line 230 travels across the FOR in substantially the same direction (e.g., approximately from left to right). In particular embodiments, scan lines 230 of a unidirectional scan pattern 200 may be directed across a FOR in any suitable direction, such as for example, from left to right, from right to left, from top to bottom, from bottom to top, or at any suitable angle (e.g., at a 5°, 10°, 30°, or 45° angle) with respect to a horizontal or vertical axis. In particular embodiments, each scan line 230 in a unidirectional scan pattern 200 may be a separate line that is not directly connected to a previous or subsequent scan line 230.

In particular embodiments, a unidirectional scan pattern 200 may be produced by a scanner 120 that includes a polygon mirror (e.g., polygon mirror 301 of FIG. 4), where each scan line 230 is associated with a particular reflective surface 320 of the polygon mirror. As an example, reflective surface 320A of polygon mirror 301 in FIG. 4 may produce scan line 230A in FIG. 6. Similarly, as the polygon mirror 301 rotates, reflective surfaces 320B, 320C, and 320D may successively produce scan lines 230B, 230C, and 230D, respectively. Additionally, for a subsequent revolution of the polygon mirror 301, the scan lines 230A', 230B', 230C', and 230D' may be successively produced by reflections of the output beam 125 from reflective surfaces 320A, 320B, 320C, and 320D, respectively. In particular embodiments, N successive scan lines 230 of a unidirectional scan pattern 200 may correspond to one full revolution of a N-sided polygon mirror. As an example, the four scan lines 230A, 230B, 230C, and 230D in FIG. 6 may correspond to one full revolution of the four-sided polygon mirror 301 in FIG. 4. Additionally, a subsequent revolution of the polygon mirror 301 may produce the next four scan lines 230A', 230B', 230C', and 230D' in FIG. 6.

Figure 7:
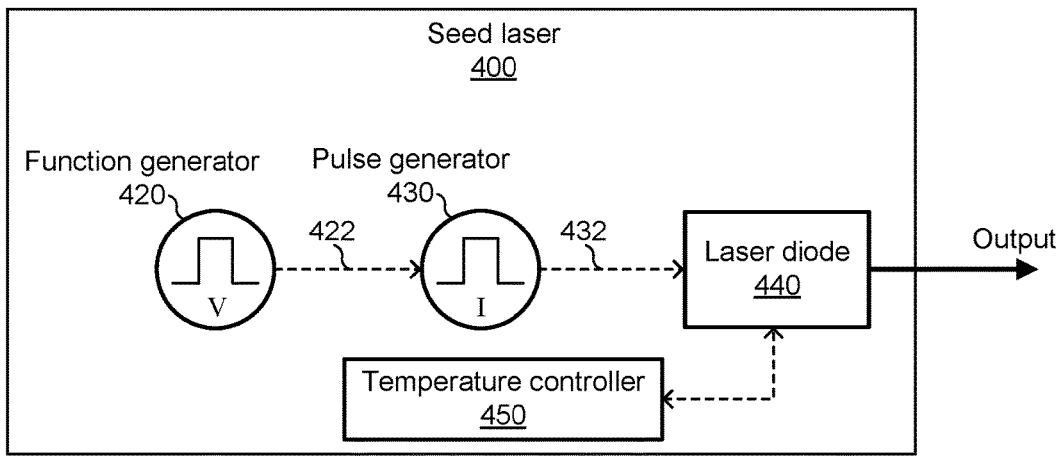
FIG. 7 illustrates an example seed laser that includes a laser diode driven by a pulse generator.

FIG. 7 illustrates an example seed laser 400 that includes a laser diode 440 driven by a pulse generator 430. In particular embodiments, a seed laser 400 may include a function generator 420, a pulse generator 430, a laser diode 440, or a temperature controller 450. In the example of FIG. 7, seed laser 400 includes function generator 420 coupled to pulse generator 430, which is in turn coupled to laser diode 440. Additionally, temperature controller 450 is coupled to laser diode 440. In particular embodiments, all or part of function generator 420, pulse generator 430, or temperature controller 450 may be included in seed laser 400 or may be located remote from seed laser 400. As an example, all or part of function generator 420, pulse generator 430, or temperature controller 450 may be included in controller 150. In particular embodiments, a seed laser 400 or a laser diode 440 may be referred to as a pulsed laser, a pulsed laser diode, a seed laser diode, a seed laser, or a seed.

In particular embodiments, seed laser 400 may produce optical seed pulses, which are emitted at the seed-laser output (which may be a free-space output or a fiber-optic output). In particular embodiments, the optical seed pulses may have a pulse repetition frequency of less than or equal to 100 MHz (e.g., approximately 500 kHz, 640 kHz, 750 kHz, 1 MHz, 2 MHz, 4 MHz, 5 MHz, 10 MHz, 20 MHz, 50 MHz, or 100 MHz), a pulse duration of less than or equal to 100 nanoseconds (e.g., approximately 200 ps, 400 ps, 500 ps, 800 ps, 1 ns, 2 ns, 4 ns, 8 ns, 10 ns, 20 ns, 50 ns, or 100 ns), a duty cycle of less than or equal to 10% (e.g., approximately 0.01%, 0.02%, 0.05%, 0.1%, 0.2%, 0.5%, 1%, 2%, 5%, or 10%), or an operating wavelength between approximately 900 nm and approximately 2100 nm. As an example, the seed pulses may have a pulse repetition frequency of 500-750 kHz, a pulse duration of less than or equal to 2 ns, and a duty cycle of less than or equal to 0.1%. As another example, the seed pulses may have a pulse repetition frequency of approximately 640 kHz and a pulse duration of approximately 1 ns (which corresponds to a duty cycle of approximately 0.064%). As another example, the seed pulses may have a pulse repetition frequency of approximately 750 kHz and a pulse duration of approximately 20 ns (which corresponds to a duty cycle of approximately 1.5%). A duty cycle may be determined from the ratio of pulse duration to pulse period or from the product of pulse duration and pulse repetition frequency. The laser diode 440 may have any suitable operating wavelength between approximately 900 nm and approximately 2100 nm. As an example, the laser diode 440 may have an operating wavelength of approximately 905 nm, 1030-1100 nm, 1400 nm, 1500 nm, 1550 nm, 1600 nm, 1400-1600 nm, 1500-1630 nm, or 1750-2100 nm. In particular embodiments, the seed pulses may be relatively low-power optical pulses, and the seed-laser output may be coupled to one or more optical amplifiers configured to amplify the low-power pulses to produce amplified pulses of light which are emitted by light source 110. As an example, the seed pulses may have an average power of greater than or equal to 1 µW. As another example, the seed pulses may have an average power of between approximately 0.1 µW and 10 µW.

In particular embodiments, seed laser 400 may include a laser diode 440 that is electrically driven by pulse generator 430 to produce optical seed pulses. In the example of FIG. 7, function generator 420 supplies a voltage signal 422 to pulse generator 430, and pulse generator 430 drives laser diode 440 with a current signal 432. As an example, function generator 420 may produce a pulsed voltage signal with a pulse repetition frequency of between approximately 0.5 and 2 MHz and a pulse duration of approximately 1-4 ns. Pulse generator 430 may drive laser diode 440 with a pulsed current signal 432 that corresponds to the voltage signal 422 received from function generator 420. In particular embodiments, voltage signal 422 may include voltage pulses having any suitable shape, such as for example, square-shaped pulses, triangle-shaped pulses, Gaussian-shaped pulses, or pulses having an arbitrary shape or a combination of shapes. In particular embodiments, current signal 432 may have a DC offset or may include current pulses having any suitable shape, such as for example, square-shaped pulses, triangle-shaped pulses, Gaussian-shaped pulses, or pulses having an arbitrary shape or a combination of shapes. The pulses of current signal 432 may have a shape or duration similar to that of voltage signal 422. Additionally, laser diode 440 may emit optical pulses with a shape (e.g., square, triangle, Gaussian, or arbitrary) or duration that at least approximately corresponds to the shape or duration of the current pulses supplied by pulse generator 430.

In particular embodiments, laser diode 440 may include a Fabry-Perot laser diode, a quantum well laser, a DBR laser, a DFB laser, a VCSEL, or a DM laser diode. As an example, laser diode 440 may be a DFB laser coupled to an optical fiber or a DFB laser configured to emit a free-space output beam. Additionally, the light emitted by laser diode 440 may pass through an optical isolator that reduces the amount of back-reflected light that may be coupled back into the laser diode 440. In particular embodiments, seed laser 400 may include a single laser diode 440 having a substantially fixed operating wavelength. As an example, laser diode 440 may be a single-wavelength laser configured to operate at a particular operating wavelength with limited wavelength tunability. As another example, laser diode 440 may include a DFB laser with an operating wavelength between approximately 1400 nm and 1600 nm, and the DFB laser may be wavelength tunable over a range of approximately 4 nm (e.g., by adjusting the operating temperature of the laser diode 440).

In particular embodiments, laser diode 440 may operate without temperature control, or seed laser 400 may include a temperature controller 450 to stabilize the operating temperature of laser diode 440. As an example, the package or the semiconductor substrate of laser diode 440 may be thermally coupled to a thermoelectric cooler (TEC) driven by temperature controller 450 to adjust or stabilize the laser-diode operating temperature. The laser-diode operating temperature may be stabilized to within any suitable range of a target temperature set point, such as for example, within approximately ±0.01° C., ±0.05° C., ±0.1° C., ±0.5° C., or ±1° C. of a target temperature. Stabilization of the temperature of laser diode 440 may provide for the laser-diode operating wavelength to be substantially stable (e.g., the peak wavelength of laser diode 440 may vary by less than any suitable value, such as for example, less than approximately 0.1 nm, 0.5 nm, 1 nm, or 2 nm). If lidar system 100 includes a narrow-band optical filter, then the laser diode 440 may be temperature stabilized so as to match the laser-diode operating wavelength to the passband of the optical filter. In particular embodiments, the temperature controller 450 may be used to adjust the operating wavelength of laser diode 440 by adjusting the laser-diode set-point temperature. As an example, the laser diode 440 may include a DFB laser with an operating wavelength that may be temperature tuned from approximately 1548 nm to approximately 1552 nm by adjusting the temperature set-point of the laser.

In particular embodiments, seed laser 400 may include a wavelength-tunable laser configured to produce light at multiple wavelengths. As an example, a wavelength-tunable laser may produce optical pulses at multiple wavelengths of light which are sent to multiple respective sensor heads of a lidar system 100. In particular embodiments, laser diode 440 may be a wavelength-tunable laser. As an example, laser diode 440 may have an operating wavelength that may be tunable over any suitable wavelength range, such as for example, 1 nm, 10 nm, 20 nm, 50 nm, or 100 nm. As another example, laser diode 440 may be tunable from approximately 1400 nm to approximately 1440 nm or from approximately 1530 nm to approximately 1560 nm. In particular embodiments, laser diode 440 may be an external-cavity diode laser which includes a laser diode and a wavelength-selective element, such as for example, an external diffraction grating or a grating structure integrated within the semiconductor structure of the laser diode. In particular embodiments, laser diode 440 may be configured to produce optical pulses at multiple wavelengths. As an example, laser diode 440 may produce sequences of pulses having N different wavelengths. The pulses may be amplified and each pulse may be conveyed to one or more particular sensor heads based on the wavelength of the pulse.

Figure 8:
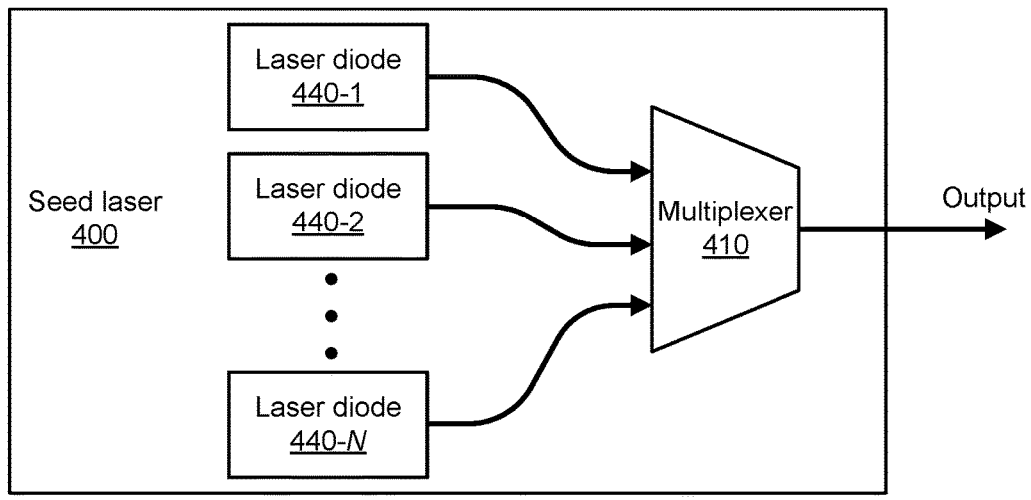
FIG. 8 illustrates an example seed laser with multiple laser diodes that are combined together by a multiplexer.

FIG. 8 illustrates an example seed laser 400 with multiple laser diodes (440-1, 440-2, ..., 440-N) that are combined together by a multiplexer 410. In particular embodiments, seed laser 400 may include multiple laser diodes 440 configured to operate at multiple different wavelengths and an optical multiplexer 410 configured to combine the light produced by each laser diode 440 into a single output optical fiber. As an example, seed laser 400 may include N laser diodes 440 configured to operate at N different wavelengths. In particular embodiments, each laser diode 440 may be a pulsed laser diode driven by a separate pulse generator 430 (not illustrated in FIG. 8). As an example, N separate pulse generators 430 may each be driven or triggered by a separate function generator 420 (not illustrated in FIG. 8). The function generators 420 may operate independently or may be synchronized with respect to one another so that the pulses can be emitted with a particular time delay between successive pulses. As another example, the N pulse generators 430 may be driven by a single function generator 420 that has N trigger-signal outputs. Additionally, the function generator 420 may have N−1 electrical delays so that the pulses from each laser diode 440 can be synchronized or time-delayed with respect to one another. In particular embodiments, any suitable number of function generators 420, pulse generators 430, or electrical delays may be integrated together into a single device.

In particular embodiments, multiplexer 410 may be referred to as a wavelength combiner, a mux, or a wavelength-division multiplexer (WDM). In particular embodiments, multiplexer 410 may include an optical-power splitter, an optical switch, a wavelength multiplexer configured to combine different wavelengths of light, or any suitable combination thereof. Multiplexer 410 may have N input ports coupled to N laser diodes 440, and multiplexer 410 may combine light from the input ports together into a single output port. In particular embodiments, a N×1 multiplexer 410 may perform wavelength combining using a prism, diffractive optical element (e.g., a diffraction grating), holographic element (e.g., a holographic grating), arrayed waveguide grating, or one or more dichroic filters. In particular embodiments, seed laser 400 may include N optical amplifiers (not illustrated in FIG. 8). As an example, each laser diode 440 may be coupled to an optical amplifier located between the laser diode and the multiplexer 410. The optical amplifiers may be configured to amplify the light from each laser diode 440 separately prior to combining in multiplexer 410.

In particular embodiments, the N laser diodes 440 may produce optical pulses at N respective wavelengths, and each laser diode 440 may produce pulses at a pulse repetition frequency f. Additionally, the pulses produced by each of the laser diodes 440 may be synchronized so that after being combined together by multiplexer 410 the output seed pulses include N sets of time-interleaved pulses which are substantially evenly spaced in time. As an example, each laser diode 440 may emit pulses that are delayed with respect to pulses from a preceding laser diode 440 by a time delay of 1/(f×N). The pulses from the N laser diodes 440 may be combined by the N×1 multiplexer 410, resulting in an output seed-laser repetition frequency of f×N. As an example, seed laser 400 may include N=8 laser diodes 440, and each laser diode 440 may produce pulses at a f=640-kHz pulse repetition frequency with a time delay relative to pulses emitted by a preceding laser diode 440 of 1/(640 kHz×8)≅195 ns. This results in an output seed-laser repetition frequency of approximately 5.12 MHz with a pulse period of approximately 195 ns. In particular embodiments, the output seed-laser pulses may be sent to a fiber-optic amplifier for amplification. A fiber-optic amplifier may exhibit improved performance (e.g., reduced amplified spontaneous emission) when amplifying the output seed-laser pulses due to the higher pulse repetition frequency and higher duty cycle provided by combining pulses from multiple laser diodes 440 into a single pulse stream for amplification. Additionally, undesirable nonlinear effects in optical fiber may be reduced or avoided by interleaving the pulses in a time-synchronized manner so that the pulses do not overlap in time.

Figure 9:
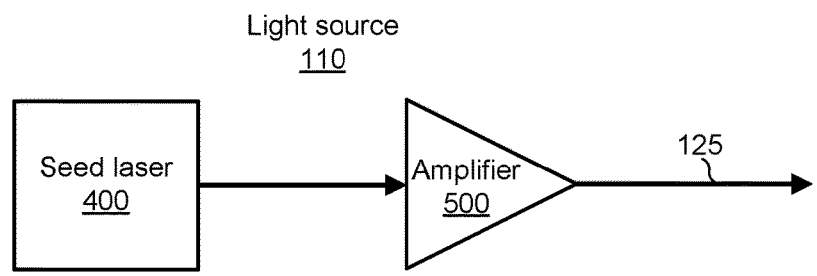
FIG. 9 illustrates an example light source that includes a seed laser and an amplifier.

FIG. 9 illustrates an example light source 110 that includes a seed laser 400 and an amplifier 500. In particular embodiments, a light source 110 may include one or more seed lasers 400 or one or more amplifiers 500. In particular embodiments, seed laser 400 may include (1) a laser diode (e.g., a DFB laser) driven by a pulse generator 430, (2) a wavelength-tunable laser configured to produce light at multiple wavelengths, (3) multiple laser diodes 440 configured to produce light at multiple respective wavelengths, (4) a laser diode configured to produce CW or FMCW light, or (5) any other suitable laser source. In particular embodiments, seed laser 400 may produce low-power light (e.g., optical pulses, CW light, or FMCW light), and one or more optical amplifiers 500 may be configured to amplify the light to produce amplified output light. The amplified light may be emitted as output beam 125. As an example, amplifier 500 may receive input light having an average power of greater than or equal to 1 microwatt, and the amplified output light from the amplifier 500 may have an average power of greater than or equal to 1 mW. As another example, amplifier 500 may receive optical seed pulses having a pulse energy of greater than or equal to 1 pJ, and the amplified output pulses from the amplifier 500 may have a pulse energy of greater than or equal to 0.1 µJ.

In particular embodiments, an amplifier 500 may be referred to as a fiber amplifier, optical amplifier, fiber-optic amplifier, optical amp, or amp. In particular embodiments, all or part of an amplifier 500 may be included in light source 110. In particular embodiments, an amplifier 500 may include any suitable number of optical-amplification stages. As an example, an amplifier 500 of a lidar system 100 may include 1, 2, 3, 4, or 5 optical-amplification stages. In particular embodiments, amplifier 500 may include a single-pass amplifier in which light makes one pass through the amplifier 500. In particular embodiments, amplifier 500 may include a double-pass amplifier in which light makes two passes through the amplifier gain medium. In particular embodiments, amplifier 500 may act as a preamplifier (e.g., an amplifier that amplifies seed pulses from a laser diode 440 or a seed laser 400), a mid-stage amplifier (e.g., an amplifier that amplifies light from another amplifier), or a booster amplifier (e.g., an amplifier that sends a free-space output beam 125 to a scanner 120). A preamplifier may refer to the first amplifier in a series of two or more amplifiers, a booster amplifier may refer to the last amplifier in a series of amplifiers, or a mid-stage amplifier may refer to any amplifier located between a preamplifier and a booster amplifier.

In particular embodiments, amplifier 500 may provide any suitable amount of optical power gain, such as for example, a gain of approximately 5 dB, 10 dB, 20 dB, 30 dB, 40 dB, 50 dB, 60 dB, or 70 dB. As an example, amplifier 500 (which may include two or more separate amplification stages) may receive input light (e.g., pulses of light, CW light, or FMCW light) with a 1-µW average power and produce amplified output light with a 5-W average power, corresponding to an optical power gain of approximately 67 dB. As another example, amplifier 500 may include two or more amplification stages each having a gain of greater than or equal to 20 dB, corresponding to an overall gain of greater than or equal to 40 dB. As another example, amplifier may include three amplification stages (e.g., a preamplifier, a mid-stage amplifier, and a booster amplifier) having gains of approximately 30 dB, 20 dB, and 10 dB, respectively, corresponding to an overall gain of approximately 60 dB.

In particular embodiments, an optical fiber, which may convey, carry, transport, or transmit light from one optical component to another, may be referred to as a fiber-optic cable, a fiber, an optical link, a fiber-optic link, or a fiber link. An optical fiber may include single-mode (SM) fiber, large-mode-area (LMA) fiber, multi-mode (MM) fiber, polarization-maintaining (PM) fiber, photonic-crystal or photonic-bandgap fiber (which may be referred to as holey fiber or microstructure fiber), gain fiber (e.g., rare-earth-doped optical fiber for use in an optical amplifier), multi-clad fiber (e.g., a double-clad fiber having a core, inner cladding, and outer cladding), or any other suitable optical fiber, or any suitable combination thereof. As an example, an optical fiber may include a glass SM fiber with a core diameter of approximately 8 µm and a cladding diameter of approximately 125 µm. As another example, an optical fiber may include a photonic-crystal fiber or a photonic-bandgap fiber in which light is confined or guided by an arrangement of holes distributed along the length of a glass fiber. In particular embodiments, one end of an optical fiber may be coupled to, attached to, or terminated at an output collimator. An output collimator may include a lens, a GRIN lens, or a fiber-optic collimator that receives light from a fiber-optic cable and produces a free-space optical beam 125. In FIG. 9, an optical fiber may convey light amplified by amplifier 500 (e.g., amplified pulses of light, amplified CW light, or amplified FMCW light) to an output collimator that produces a free-space optical beam 125.

Figure 10:
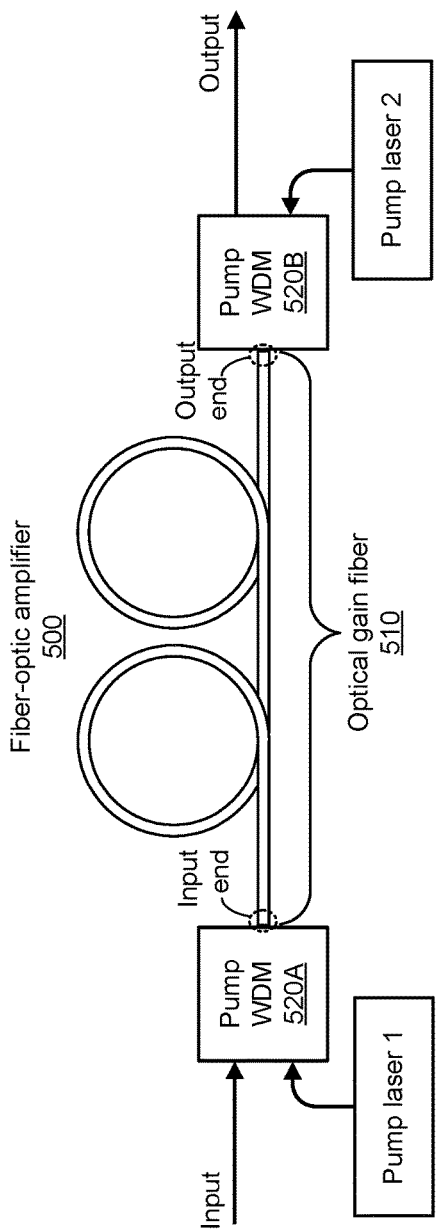
FIG. 10 illustrates an example fiber-optic amplifier with two pump lasers.

FIG. 10 illustrates an example fiber-optic amplifier 500 with two pump lasers. In particular embodiments, a fiber-optic amplifier 500 may include an optical gain fiber 510 that is optically pumped (e.g., provided with energy) by one or more pump lasers (e.g., pump laser 1 or pump laser 2 in FIG. 10). The optically pumped gain fiber 510 provides optical gain to particular wavelengths of input light that travel through the gain fiber 510. Pump laser 1 may be referred to as a first pump laser, a first pump laser diode, an input pump laser, an input pump laser diode, a co-propagating pump laser, or a co-propagating pump laser diode. Pump laser 2 may be referred to as a second pump laser, a second pump laser diode, an output pump laser, an output pump laser diode, a counter-propagating pump laser, or a counter-propagating pump laser diode. In particular embodiments, an optical amplifier 500 may receive light at its input, amplify the input light, and send the amplified light to an output. The received input light may include optical pulses from a seed laser 400 or from a previous amplification stage (e.g., two or more amplifiers 500 may be coupled together in series). The amplified output light may be sent to another amplifier 500 (e.g., to provide another stage of amplification), a demultiplexer (e.g., for distribution to multiple optical links or multiple sensor heads), an optical link (e.g., a fiber-optic cable), a sensor head, or a scanner 120. As an example, the output of a fiber-optic amplifier 500 may be a fiber-optic cable that is spliced to an input fiber-optic cable for a subsequent amplifier stage. As another example, the output of a fiber-optic amplifier 500 may be a fiber-optic cable terminated at an output collimator that produces a free-space optical beam 125 that is sent to a scanner 120.

In particular embodiments, a fiber-optic core of a gain fiber 510 may be doped with a gain material that absorbs pump light and provides optical gain to the input light as it propagates through the gain fiber 510. A fiber-optic core may be referred to as a fiber core or a core. An optical gain fiber 510 (which may be referred to as gain fiber or active fiber) may be a single-clad or multi-clad optical fiber with a core that is doped with rare-earth ions, such as for example, erbium ($Er^{3+}$), ytterbium ($Yb^{3+}$), neodymium ($Nd^{3+}$), praseodymium ($Pr^{3+}$), holmium ($Ho^{3+}$), thulium ($Tm^{3+}$), dysprosium ($Dy^{3+}$), or any other suitable rare-earth element, or any suitable combination thereof. The rare-earth dopants (which may be referred to as gain material) absorb light from the pump laser and are "pumped" or promoted into excited states that provide amplification to particular wavelengths of light through stimulated emission. The rare-earth ions in excited states may also emit photons through spontaneous emission, resulting in the production of amplified spontaneous emission (ASE) light by amplifier 500.

In particular embodiments, the length of gain fiber 510 in an amplifier 500 may be approximately 0.5 m, 1 m, 2 m, 4 m, 6 m, 10 m, 20 m, or any other suitable gain-fiber length. In particular embodiments, gain fiber 510 may be a single-mode optical fiber, large-mode-area optical fiber, single-clad optical fiber, or multi-clad optical fiber with a core diameter of approximately 7 µm, 8 µm, 9 µm, 10 µm, 12 µm, 20 µm, 25 µm, or any other suitable core diameter. For a single-clad gain fiber 510, the pump light and the input light (which is amplified while propagating through the gain fiber) may both propagate substantially through the core of the gain fiber 510. For a multi-clad gain fiber, the pump light may propagate substantially through the inner cladding and the core, and the input light may propagate substantially through the core. An optical gain fiber 510 may have any suitable type of dopant, dopant concentration, core diameter, cladding diameter, refractive index profile, or numerical aperture (NA). For example, the core diameter, the core refractive index, the cladding diameter, and the cladding refractive index may be configured so that the input light propagates in the core in a single transverse optical mode.

In the example of FIG. 10 (as well as some of the other figures described herein), a line or arrow between two optical components may represent a fiber-optic cable or a free-space optical beam. As an example, the arrow between pump laser 1 and pump WDM 520 may represent a fiber-optic cable that conveys the pump light from pump laser 1 to pump WDM 520. Alternatively, the arrow between pump laser 1 and pump WDM 520 may represent a free-space optical beam emitted by pump laser 1. As another example, the input port or the output port illustrated in FIG. 10 may represent a fiber-optic cable. Alternatively, the input port or the output port may represent a free-space optical beam.

In particular embodiments, a fiber-optic amplifier 500 may refer to an amplifier where input light is amplified while propagating through an optical gain fiber 510 (e.g., the light is not amplified while propagating as a free-space beam). An amplifier 500 where the light being amplified makes one pass through a gain fiber 510 may be referred to as a single-pass amplifier 500 (as illustrated in FIG. 10), and an amplifier where the light being amplified makes two passes through a gain fiber 510 may be referred to as a double-pass amplifier. The input light, the light being amplified, or the output light may be referred to as signal light. In particular embodiments, an amplifier 500 may be part of a master oscillator power amplifier (MOPA) or master oscillator fiber amplifier (MOFA) in which a master oscillator (e.g., a seed laser 400) sends relatively low-power optical pulses to one or more optical amplifiers 500 for amplification. As an example, an amplifier 500 may receive pulses with an input pulse energy ($E_{in}$) of approximately 20 pJ and produce amplified pulses with an output pulse energy ($E_{out}$) of approximately 5 nJ. The optical gain (G) of the amplifier 500 in decibels, which may be determined from the expression G=10 log($E_{out}/E_{in}$), is approximately 24 dB. As another example, an amplifier 500 may receive input pulses with a peak power ($P_{in}$) of approximately 10 mW and produce amplified output pulses with a peak power ($P_{out}$) of approximately 10 W. The optical gain (G) of the amplifier 500, which may be determined from the expression G=10 log ($P_{out}/P_{in}$), is approximately 30 dB. As another example, an amplifier 500 may receive input light with an average power ($P_{avg1}$) of approximately 0.1 mW and produce amplified output light with an average power ($P_{avg2}$) of approximately 50 mW. The optical gain (G) of the amplifier 500, which may be determined from the expression G=10 log($P_{avg2}/P_{avg1}$), is approximately 27 dB.

In particular embodiments, a pump laser may produce light at any wavelength suitable to provide optical excitation to the dopants of gain fiber 510. As an example, pump laser 1 or pump laser 2 may be a fiber-coupled or free-space laser diode with an operating wavelength of approximately 790-820 nm, 900-1000 nm, or 1440-1540 nm. As another example, pump laser 1 or pump laser 2 may be a fiber-coupled or free-space laser diode with an operating wavelength of approximately 793 nm, 808 nm, 910 nm, 915 nm, 940 nm, 960 nm, 976 nm, 980 nm, 1050 nm, 1064 nm, 1018 nm, 1450 nm, 1480 nm, 1530 nm, 1550 nm, or 1900 nm. Pump laser 1 and pump laser 2 may operate at approximately the same wavelength (e.g., 940 nm), or pump laser 1 and pump laser 2 may operate at different wavelengths (e.g., 976 nm and 940 nm, respectively). In particular embodiments, a pump laser may be operated as a CW light source and may produce any suitable amount of average optical pump power, such as for example, approximately 100 mW, 500 mW, 1 W, 2 W, 5 W, 10 W, 15 W, 20 W, 50 W, 100 W, 500 W, or 1 kW of pump power. As an example, in FIG. 10, pump laser 1 may produce approximately 2 W of pump power, and pump laser 2 may produce approximately 10 W of pump power. In particular embodiments, a pump laser diode may be referred to as a pump diode laser, a pump laser, a pump diode, a laser diode, or a pump.

In particular embodiments, pump laser 1 and pump laser 2 may each include one or more distinct laser diodes. As an example, pump laser 1 may include one pump laser diode that supplies pump light to the input end of optical gain fiber 510, and pump laser 2 may include another pump laser diode that supplies pump light to the output end of optical gain fiber 510. As another example, pump laser 1 may include one pump laser diode, and pump laser 2 may include two pump laser diodes. The two pump laser diodes may be combined together to produce a single free-space optical beam or a fiber-coupled beam that is supplied to the output end of optical gain fiber 510. In particular embodiments, the light for pump laser 1 and pump laser 2 may be supplied by a single laser diode. As an example, a single pump laser diode may be split into two free-space optical beams or two fiber-coupled beams that are supplied to the input and output ends of the optical gain fiber 510. For example, a 12-watt pump laser diode may be split into a 2-watt beam that is sent to the input end and a 10-watt beam that is sent to the output end.

In particular embodiments, light from a pump laser may be coupled into gain fiber 510 via a pump wavelength-division multiplexer (WDM) 520. A pump WDM 520 (which may be referred to as a pump-signal combiner, a pump combiner, a wavelength combiner, a combiner, a multiplexer, a demultiplexer, or a WDM) may be used to combine or multiplex pump light with input light that is to be amplified. Alternatively, a pump WDM 520 may be used to separate or demultiplex pump light and amplified output light. In FIG. 10, pump WDM 520A combines input light (e.g., light from a seed laser 400) with light from pump laser 1, and the combined pump-signal light is coupled into the optical gain fiber 510 via the input end. In FIG. 10, pump WDM 520B is used to separate the output light (e.g., the amplified signal light) and the light from pump laser 2. The pump WDM 520B receives the amplified signal light from the output end of the optical gain fiber 510, and the amplified signal light is sent to the output port of the fiber-optic amplifier 500. Additionally, the pump WDM 520B couples the light from pump laser 2 into the output end of the optical gain fiber 510.

In particular embodiments, a pump WDM 520 may be a fiber-optic component or a free-space optical component. As an example, pump WDM 520A in FIG. 10 may be a fiber-optic component (e.g., a dichroic filter in a fiber-optic package or a fused fiber-optic coupler), and the input light and pump light from pump laser 1 may be delivered to pump WDM 520A by optical fiber. Additionally, the combined pump-signal light from pump WDM 520A may be delivered to the input end of the optical gain fiber 510 by optical fiber. As another example, pump WDM 520A in FIG. 10 may be a free-space optical component (e.g., a free-space dichroic filter or beam splitter), and the input light and the pump light from pump laser 1 may be free-space optical beams. Additionally, the combined pump-signal light from pump WDM 520A may be a free-space optical beam that is coupled into the input end of the optical gain fiber 510 by a lens.

In particular embodiments, a pump WDM 520 may combine or separate light based on polarization or wavelength. As an example, the input light and the pump light from pump laser 1 may be orthogonally polarized, and pump WDM 520A may include a polarization-dependent optical element (e.g., a polarizing beam splitter) configured to combine the two orthogonally polarized beams into a single beam that is coupled into the optical gain fiber 510. As another example, the input light and the pump light may have different wavelengths, and pump WDM 520A may include a wavelength-dependent optical element (e.g., a filter or a dichroic beam splitter) configured to combine the input light and the pump light into a single beam that is coupled into the optical gain fiber 510. The input light may have a wavelength of 1400-1600 nm and may be combined by pump WDM 520A with pump light from pump laser 1 having a wavelength of 900-1000 nm.

In particular embodiments, a pump laser may be co-propagating or counter-propagating with respect to the input light that is amplified by a fiber-optic amplifier 500. A co-propagating pump laser provides pump light that propagates along the optical gain fiber 510 in the same direction as the light that is amplified by the amplifier 500. A counter-propagating pump laser provides pump light that propagates along the optical gain fiber 510 in the opposite direction as the light that is amplified by the amplifier 500. In FIG. 10, pump laser 1 is a co-propagating pump laser that produces pump light that propagates along the optical gain fiber 510 in the same direction as the input light. Additionally, pump laser 2 is a counter-propagating pump laser that produces pump light that propagates along the optical gain fiber 510 in the opposite direction as the input light. In particular embodiments, an optical gain fiber 510 may include in input end and an output end. The input end may be configured to receive input light (e.g., seed-laser input light) and co-propagating pump light. The output end may be configured to produce amplified output light and receive counter-propagating pump light, and the amplified output light may include the seed-laser input light which is amplified as it propagates along the optical gain fiber 510.

In particular embodiments, a fiber-optic amplifier 500 may include an optical gain fiber 510 and two pump laser diodes (e.g., pump laser 1 and pump laser 2). The optical gain fiber 510 may be configured to amplify input light (e.g., input light received from a seed laser). Additionally, pump laser 1 may provide co-propagating pump light to the optical gain fiber 510, and pump laser 2 may provide counter-propagating pump light to the optical gain fiber 510. In particular embodiments, co-propagating pump light and counter-propagating pump light may each have a wavelength between 900 nm and 1000 nm, and the seed-laser input light may have a wavelength between 1400 nm and 1600 nm. As an example, the co-propagating pump light from pump laser 1 may have a wavelength of approximately 970-980 nm, and the counter-propagating pump light from pump laser 2 may have a wavelength of approximately 930-950 nm. The seed-laser input light which is amplified by the optical gain fiber 510 may have a wavelength of approximately 1530-1560 nm.

In particular embodiments, at least a portion of gain fiber 510 may include a fiber-optic core doped with erbium. A fiber-optic amplifier 500 that includes a gain fiber 510 with a fiber-optic core doped with erbium may be referred to as an erbium-doped fiber amplifier (EDFA) and may be used to amplify seed-laser input light having one or more wavelengths between approximately 1500 nm and approximately 1630 nm. As an example, a seed laser 400 may supply seed-laser input light at a wavelength of approximately 1550 nm. In particular embodiments, the co-propagating pump light or the counter-propagating pump light used to pump the erbium dopants may have a wavelength between approximately 970 nm and approximately 980 nm. As an example, pump laser 1 may provide co-propagating pump light with a wavelength of approximately 976 nm. In particular embodiments, the co-propagating pump light or the counter-propagating pump light used to pump the erbium dopants may have a wavelength between approximately 1440 nm and approximately 1540 nm. As an example, pump laser 1 may provide co-propagating pump light with a wavelength of approximately 1480 nm.

In particular embodiments, at least a portion of gain fiber 510 may include a fiber-optic core doped with a combination of erbium and ytterbium. A gain fiber 510 with a combination of erbium and ytterbium dopants may be referred to as a Er:Yb co-doped fiber, Er:Yb:glass fiber, Er:Yb fiber, Er:Yb-doped fiber, erbium/ytterbium-doped fiber, or Er/Yb gain fiber. A fiber-optic amplifier 500 that includes Er:Yb co-doped fiber may be referred to as an erbium/ytterbium-doped fiber amplifier (EYDFA) and may be used to amplify seed-laser input light having one or more wavelengths between approximately 1500 nm and approximately 1630 nm. As an example, a seed laser diode may supply seed-laser input light at a wavelength between 1530 nm and 1560 nm. In particular embodiments, the co-propagating pump light or the counter-propagating pump light used to pump a Er:Yb co-doped fiber may have a wavelength between approximately 915 nm and approximately 970 nm. As an example, pump laser 2 may provide counter-propagating pump light with a wavelength of approximately 940 nm.

In particular embodiments, at least a portion of gain fiber 510 may include a fiber-optic core doped with ytterbium. A fiber-optic amplifier 500 that includes a gain fiber 510 with a fiber-optic core doped with ytterbium may be referred to as a ytterbium-doped fiber amplifier (YDFA) and may be used to amplify seed-laser input light having one or more wavelengths between approximately 970 nm and approximately 1120 nm. As an example, a seed laser 400 may supply seed-laser input light at a wavelength of approximately 1080 nm. In particular embodiments, the co-propagating pump light or the counter-propagating pump light used to pump the ytterbium dopants may have a wavelength between approximately 900 nm and approximately 1040 nm. As an example, pump laser 1 may provide co-propagating pump light with a wavelength of approximately 930-950 nm, and pump laser 2 may provide counter-propagating pump light with a wavelength of approximately 930-950 nm. The wavelengths of pump laser 1 and pump laser 2 may be approximately the same, or the wavelengths of the two pump lasers may be different (e.g., the wavelengths may differ by approximately 2 nm, 5 nm, 10 nm, 20 nm, 30 nm, 50 nm, or 70 nm).

In particular embodiments, at least a portion of gain fiber 510 may include a fiber-optic core doped with thulium. A fiber-optic amplifier 500 that includes a gain fiber 510 with a fiber-optic core doped with thulium may be referred to as a thulium-doped fiber amplifier (TDFA) and may be used to amplify seed-laser input light having one or more wavelengths between approximately 1750 nm and approximately 2100 nm. As an example, a seed laser 400 may supply seed-laser input light at a wavelength of approximately 2000 nm. In particular embodiments, the co-propagating pump light or the counter-propagating pump light used to pump the thulium dopants may have a wavelength between approximately 790 nm and approximately 800 nm or a wavelength between approximately 1400 nm and approximately 1600 nm. As an example, pump laser 1 may provide co-propagating pump light with a wavelength of approximately 793 nm, and pump laser 2 may provide counter-propagating pump light with a wavelength of approximately 793 nm. As another example, pump laser 1 may provide co-propagating pump light with a wavelength of approximately 795 nm, and pump laser 2 may provide counter-propagating pump light with a wavelength of approximately 793 nm. As another example, pump laser 1 or pump laser 2 may provide pump light with a wavelength of approximately 1480 nm or 1550 nm.

In particular embodiments, at least a portion of gain fiber 510 may include a fiber-optic core doped with neodymium. A fiber-optic amplifier 500 that includes a gain fiber 510 with a fiber-optic core doped with neodymium may be referred to as a neodymium-doped fiber amplifier (NDFA) and may be used to amplify seed-laser input light having one or more wavelengths between approximately 1050 nm and approximately 1090 nm or between approximately 1300 nm and approximately 1330 nm. As an example, a seed laser 400 may supply seed-laser input light at a wavelength of approximately 1060 nm or 1310 nm. In particular embodiments, the co-propagating pump light or the counter-propagating pump light used to pump the neodymium dopants may have a wavelength between approximately 800 nm and approximately 820 nm or between approximately 870 nm and approximately 890 nm. As an example, pump laser 1 may provide co-propagating pump light with a wavelength of approximately 808 nm, and pump laser 2 may provide counter-propagating pump light with a wavelength of approximately 808 nm. As another example, pump laser 1 may provide co-propagating pump light with a wavelength of approximately 815 nm, and pump laser 2 may provide counter-propagating pump light with a wavelength of approximately 808 nm. As another example, pump laser 1 or pump laser 2 may provide pump light with a wavelength of approximately 880 nm.

In particular embodiments, at least a portion of gain fiber 510 may include a fiber-optic core doped with holmium. A fiber-optic amplifier 500 that includes a gain fiber 510 with a fiber-optic core doped with holmium may be referred to as a holmium-doped fiber amplifier (HDFA) and may be used to amplify seed-laser input light having one or more wavelengths between approximately 2050 nm and approximately 2200 nm. As an example, a seed laser 400 may supply seed-laser input light at a wavelength of approximately 2100 nm. In particular embodiments, the co-propagating pump light or the counter-propagating pump light used to pump the holmium dopants may have a wavelength between approximately 1900 nm and approximately 2000 nm. As an example, pump laser 1 may provide co-propagating pump light with a wavelength of approximately 1940 nm, and pump laser 2 may provide counter-propagating pump light with a wavelength of approximately 1960 nm. As another example, pump laser 1 or pump laser 2 may provide pump light with a wavelength of approximately 2000 nm.

Figure 11:
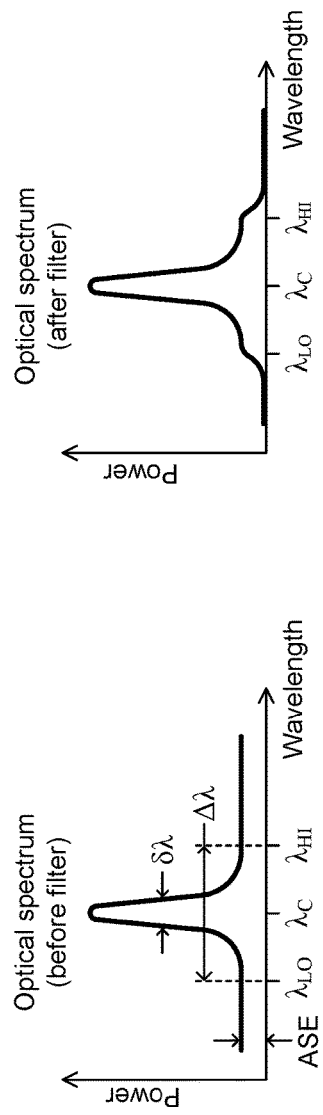
FIG. 11 illustrates an example spectrum of an optical signal before and after passing through a filter.

FIG. 11 illustrates an example spectrum of an optical signal before and after passing through an optical filter. In particular embodiments, an optical filter (which may be referred to as a filter, a spectral filter, or an ASE filter) may include an absorptive filter, dichroic filter, long-pass filter, short-pass filter, bandpass filter, notch filter, or fiber Bragg grating (FBG). An optical filter may be substantially transmissive to light over a particular range of wavelengths (e.g., a pass-band) and may substantially block (e.g., through absorption or reflection) the transmission of light outside of the pass-band range. As an example, a filter may include a dichroic filter (which may be referred to as a reflective filter, thin-film filter, or interference filter) which includes a substantially transparent optical substrate (e.g., glass or fused silica) with a series of thin-film optical coatings configured to transmit light over a particular wavelength range and reflect other wavelengths of light. As another example, a filter may include a FBG configured to transmit light over a particular pass-band and substantially block light outside of the pass-band. In the example of FIG. 11, the filter is a bandpass filter with a center wavelength of $\lambda_C$ and a pass-band from $\lambda_{LO}$ to $\lambda_{HI}$, which corresponds to a filter bandwidth of $\Delta\lambda = \lambda_{HI} - \lambda_{LO}$. In particular embodiments, a filter may substantially block light over a particular range of wavelengths (e.g., a rejection band) and may be substantially transmissive to light outside of the rejection-band range. As an example, a notch filter may reflect or absorb light over a particular wavelength range (e.g., light at 935-945 nm from pump laser 2) and may transmit light at other wavelengths (e.g., input light at 1530-1560 nm and light from pump laser 1 at 970-980 nm). As another example, a filter may include a FBG configured to reflect light over a particular wavelength range and transmit light outside of the reflection band.

In particular embodiments, a filter may have an optical transmission (e.g., within a pass-band) of greater than or equal to 50%, 70%, 80%, 90%, 95%, 99%, or any other suitable transmission value. Additionally, a filter may have an optical transmission of less than or equal to 50%, 20%, 10%, 1%, 0.5%, 0.1%, or any other suitable transmission value for wavelengths in a rejection band or outside the pass-band. The optical transmission in a rejection band or outside the pass-band may also be expressed in terms of decibels (dB) of attenuation. For example, the filter attenuation for wavelengths outside the pass-band may be greater than or equal to 3 dB, 10 dB, 15 dB, 20 dB, 30 dB, or any other suitable attenuation value. An attenuation value of 20 dB corresponds to blocking approximately 99% of the incident light power and transmission of approximately 1% of incident light. In particular embodiments, a filter may transmit light at one or more operating wavelengths of a lidar system 100 and block or attenuate light away from the transmitted wavelengths by greater than or equal to 3 dB, 10 dB, 15 dB, 20 dB, 30 dB, or any other suitable attenuation value. The light that is away from the transmitted wavelengths may refer to light with a wavelength outside of a pass-band of the filter. As an example, a filter may transmit greater than or equal to 90% of incident light within a filter pass-band and may block or attenuate light outside of the pass-band by 20 dB. As another example, a filter may have a filter attenuation of greater than or equal to 20 dB for wavelengths between approximately [$\lambda_{LO}$–100 nm] and $\lambda_{LO}$ and wavelengths between approximately $\lambda_{HI}$ and [$\lambda_{HI}$+100 nm].

In particular embodiments, a filter may have any suitable filter bandwidth $\Delta\lambda$, such as for example, a filter bandwidth of 0.1 nm, 0.2 nm, 0.5 nm, 1 nm, 2 nm, 5 nm, or 10 nm. As an example, a filter may have a pass-band with a 1-nm bandwidth that is centered about center wavelength 1554.9 nm. In particular embodiments, a filter may have a relatively narrow pass-band (e.g., a filter bandwidth $\Delta\lambda$, of less than or equal to 0.05 nm, 0.1 nm, 0.2 nm, 0.5 nm, 1 nm, or 2 nm), and a laser diode 440 may be temperature stabilized so that the laser-diode operating wavelength is matched to the filter pass-band. In particular embodiments, a filter may have a relatively broad pass-band (e.g., a filter bandwidth $\Delta\lambda$, of greater than or equal to 2 nm, 5 nm, 10 nm, 20 nm, or 50 nm), and a laser diode 440 may not require temperature stabilization to maintain its operating wavelength within the filter pass-band.

In particular embodiments, an optical spectrum before passing through a filter may include a signal spectrum along with background optical noise, which may include amplified spontaneous emission (ASE) originating from an amplifier 500. The signal spectrum may represent the optical spectrum for input light supplied to an amplifier 500, light being amplified by an amplifier 500, or output light from an amplifier 500. In FIG. 11, the signal spectrum, which may represent the spectrum for a series of optical pulses, is centered at wavelength $\lambda_C$ and has a bandwidth of $\delta\lambda$. The signal spectrum is contained within the pass-band of the filter (e.g., $\delta\lambda \le \Delta\lambda$) and passes through the filter with little or no attenuation (e.g., ≤10% attenuation). Similarly, the optical pulses associated with the signal spectrum may pass through the filter with little or no attenuation or temporal distortion to their shape. In FIG. 11, the optical spectrum before passing through the filter includes a broadband offset associated with ASE. In particular embodiments, an ASE spectrum may extend over a wavelength range of approximately 20 nm, 40 nm, 60 nm, or 80 nm (e.g., from approximately 1510 nm to approximately 1590 nm). The portion of the ASE that falls outside the filter pass-band may be substantially attenuated, as indicated by the after-filter spectrum illustrated in FIG. 11 where wavelengths less than $\lambda_{LO}$ and greater than $\lambda_{HI}$ are attenuated after passing through the filter. In particular embodiments, a filter may be used to reduce or substantially remove unwanted optical signals or noise (e.g., ASE) from a light source 110, seed laser 400, or amplifier 500 of a lidar system 100. As an example, a filter may be located at or near an output of an optical amplifier 500, and the filter may be configured to remove any suitable amount of the ASE from the amplifier output, such as for example, 50%, 60%, 80%, 90%, 95%, or 99% of the ASE. As another example, a filter with a 1-nm bandwidth that receives a signal with background optical noise that extends over approximately 50 nm may remove approximately 90% to 99% of the background noise from the signal.

In particular embodiments, a filter may have a single pass-band (e.g., 1550-1552 nm) or two or more distinct pass-bands (e.g., 1550-1552 nm and 1555-1557 nm). As an example, for a lidar system 100 with N operating wavelengths, a filter may have N pass-bands corresponding to each of the N operating wavelengths. In particular embodiments, the center wavelength $\lambda_C$ or the bandwidth $\Delta\lambda$, of a filter may be substantially fixed. In particular embodiments, a filter may have an adjustable center wavelength $\lambda_C$ or an adjustable bandwidth $\Delta\lambda$. As an example, the center wavelength of a filter may be dynamically changed to match the changing wavelength of a wavelength-tunable seed laser 400 or laser diode 440.

In particular embodiments, a filter may be a free-space optical component (e.g., a free-space dichroic filter) or a fiber-optic component (e.g., a fiber Bragg grating). A fiber Bragg grating (FBG) may refer to a fiber-optic component that includes a periodic variation in the refractive index of the fiber core or cladding. The periodic refractive-index variation may act as a wavelength-dependent reflector or filter and may include a distributed Bragg reflector, an apodized grating, or a chirped fiber Bragg grating. A FBG may be configured to reflect light at one or more wavelengths and transmit light at one or more other wavelengths. As an example, a FBG located at the output port of fiber-optic amplifier 500 in FIG. 10 may transmit light (e.g., amplified optical pulses from amplifier 500) over a 1548-1552 nm wavelength range and reflect light (e.g., ASE produced by gain fiber 510) outside this wavelength range. In particular embodiments, a FBG may be configured to transmit seed-laser input light and reflect or transmit pump light from pump laser 1 or pump laser 2. As an example, a FBG located near the input end of optical gain fiber 510 in FIG. 10 may transmit seed-laser input light (e.g., light at 1530-1560 nm) and pump light from pump laser 1 (e.g., light at 970-980 nm), and the FBG may reflect light from pump laser 2 (e.g., light at 930-950 nm). The FBG may reflect most of the residual pump light from pump laser 2 back into the optical gain fiber 510, which prevents the residual pump light from propagating to pump laser 1 or to the input port of fiber-optic amplifier 500.

In particular embodiments, a FBG may have any suitable reflectively (e.g., reflectivity greater than or equal to 50%, 75%, 90%, 95%, 99%, or 99.9%) over any suitable reflection band (e.g., a reflection band may have a width of approximately 0.1 nm, 0.2 nm, 0.5 nm, 1 nm, 5 nm, 10 nm, 20 nm, or 50 nm). As an example, a FBG may have a reflectivity of greater than or equal to 99% over a 2-nm reflection band centered at 1552 nm. As another example, a FBG may have a reflectivity of greater than or equal to 90% over a 10-nm reflection band centered at 940 nm.

Figure 12:
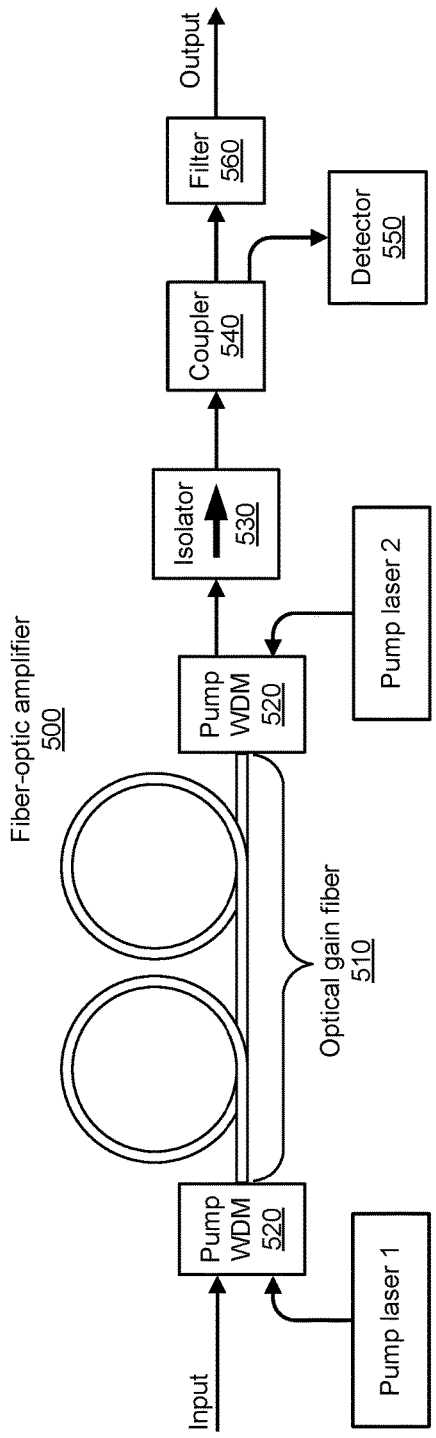
FIG. 12 illustrates an example fiber-optic amplifier with several optical components located at the output side of the amplifier.

FIG. 12 illustrates an example fiber-optic amplifier 500 with several optical components located at the output side of the amplifier 500. In particular embodiments, a fiber-optic amplifier 500 may include one or more pump lasers (e.g., pump laser 1 or pump laser 2), one or more pump WDMs 520, one or more optical gain fibers 510, one or more optical isolators 530, one or more couplers 540, one or more detectors 550, or one or more optical filters 560. In FIG. 12, the optical components located at the output side of the optical amplifier 500 include isolator 530, coupler 540, detector 550, filter 560, and pump laser 2 and its associated pump WDM 520.

Figure 13:
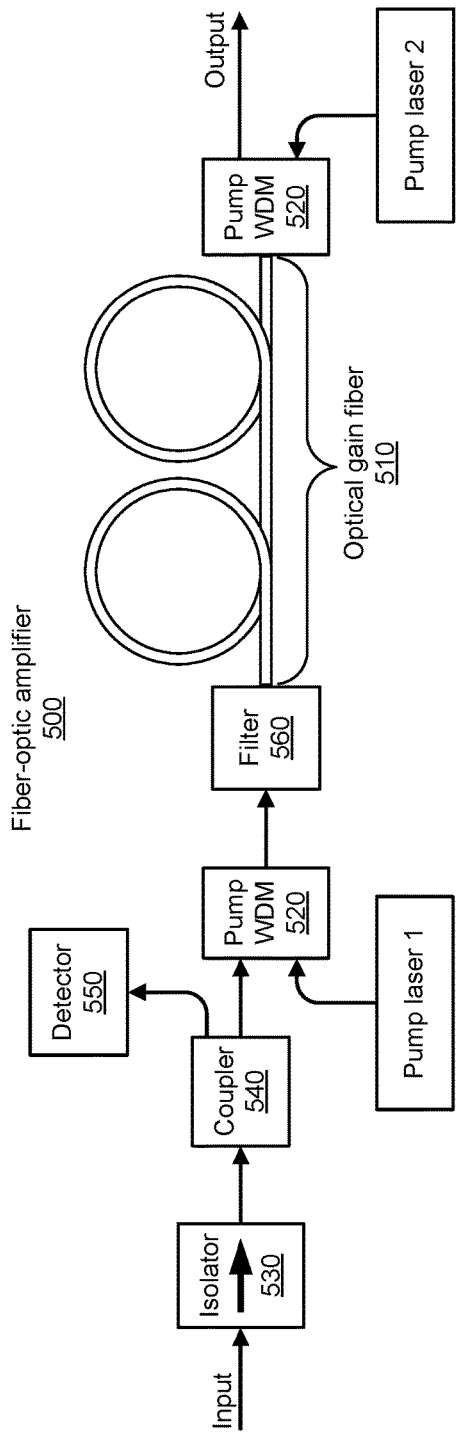
FIG. 13 illustrates an example fiber-optic amplifier with several optical components located at the input side of the amplifier.

FIG. 13 illustrates an example fiber-optic amplifier 500 with several optical components located at the input side of the amplifier 500. In FIG. 13, the optical components located at the input side of the optical amplifier 500 include isolator 530, coupler 540, detector 550, filter 560, and pump laser 1 and its associated pump WDM 520. Each of the fiber-optic amplifiers 500 illustrated in FIG. 12 and FIG. 13 is a single-pass amplifier where input light makes a single pass through the optical gain fiber 510, and then, after traveling through the optical gain fiber 510, the amplified input light is sent to the output port. Additionally, in FIG. 12 and FIG. 13, pump laser 1 provides co-propagating pump light to the optical gain fiber 510, and pump laser 2 provides counter-propagating pump light to the optical gain fiber 510.

In particular embodiments, a fiber-optic amplifier 500 may include an optical isolator 530 (which may be referred to as an isolator). Isolator 530 in FIG. 12 and FIG. 13 may be configured to allow light to pass in the direction of the arrow drawn in the isolator and block light propagating in the reverse direction. An optical isolator 530 may include a Faraday rotator, and the operation of an optical isolator may be based on the Faraday effect where the polarization of light traveling through the isolator is rotated in the same direction regardless of the direction of travel of the light. In particular embodiments, an optical isolator 530 may be a free-space optical component or a fiber-coupled component configured to reduce or attenuate backward-propagating light. Backward-propagating light (which may destabilize or cause damage to a seed laser 400, laser diode 440, pump laser 1, pump laser 2, or amplifier 500) may originate from ASE light from a gain fiber 510, counter-propagating pump light (e.g., light from pump laser 2), or optical reflections at one or more optical interfaces of the amplifier 500. An optical isolator 530 may prevent the destabilization or damage associated with backward-propagating light by blocking most of the backward-propagating light (e.g., by attenuating backward-propagating light by greater than or equal to 5 dB, 10 dB, 20 dB, 30 dB, 40 dB, 50 dB, or any other suitable attenuation value). In FIG. 12, the output of amplifier 500 may be coupled to a second amplifier, and isolator 530 may reduce the amount of light that propagates from the second amplifier back into the amplifier 500. In FIG. 13, a laser diode 440 may provide the input light to amplifier 500, and isolator 530 may significantly reduce the amount of backward-propagating light that travels back to the laser diode 440. A pump laser (e.g., pump laser 1 or pump laser 2) may have an isolator 530 positioned at or near its output to prevent light from propagating back into the pump laser.

In particular embodiments, a fiber-optic amplifier 500 may include a coupler 540 configured to split off a portion of received light and direct the split-off portion to a detector 550. In FIG. 12, the coupler 540 splits off a portion of amplified light from the optical gain fiber 510 and sends it to detector 550. The remaining amplified light that is not split off continues on to filter 560 and to the output of amplifier 500. In FIG. 13, the coupler 540 splits off a portion of the input light and sends it to detector 550. The remaining input light that is not split off continues on to the optical gain fiber 510 (after traveling through the pump WDM 520 and filter 560). A coupler 540 may be a fiber-optic component (e.g., a fiber-optic tap coupler) or a free-space component (e.g., a beam splitter) that splits off approximately 0.5%, 1%, 2%, 3%, 5%, 10%, or any other suitable percentage of received light. In FIG. 12, the coupler 540 may split off approximately 1% of the amplified light received from the gain fiber 510 (and direct it to detector 550) and send the remaining approximately 99% of the amplified light on to the filter 560. In FIG. 13, the coupler 540 may split off approximately 10% of the input light (and direct it to detector 550) and send the remaining approximately 90% of input light on to the pump WDM 520.

In particular embodiments, a fiber-optic amplifier 500 may include one or more detectors 550 configured to monitor input light coming into the amplifier 500 or monitor the light after amplification. In FIG. 13, detector 550 may be used to monitor the input light, and in FIG. 12, detector 550 may be used to monitor the light after amplification. A detector 550 may receive the split-off input light from a coupler 540, and the detector 550 may generate an electrical signal based on the received light. The electrical signal from detector 550 may be sent to a processor or controller 150 for monitoring the status of the input or output light. In particular embodiments, detector 550 may be a silicon, germanium, or InGaAs PN or PIN photodiode. As an example, the light amplified by the optical gain fiber 510 may have a wavelength of 1400-1600 nm, and detector 550 may be an InGaAs PIN photodiode that monitors a portion of the input light or output light.

In particular embodiments, a detector 550 may be used to monitor the performance or health of a fiber-optic amplifier 500. In FIG. 12, if a voltage or current of the electrical signal from detector 550 drops below a particular threshold level, then a processor or controller 150 may determine that there is a problem with amplifier 500 (e.g., there may be a broken optical fiber, a pump laser may be failing, or one of the other components in amplifier 500 may be failing). In response to determining that there is a problem with the amplifier 500, the processor or controller 150 may shut down or disable the amplifier 500 or may send a notification that the amplifier 500 is in need of service or repair. In FIG. 13, if a voltage or current of the electrical signal from detector 550 drops below a particular threshold level, then a processor or controller 150 may determine that there is insufficient input light coming into the amplifier 500. The amplifier 500 may be shut down or disabled (e.g., pump laser 1 or pump laser 2 may be turned off, or the amount of light produced by pump laser 1 or pump laser 2 may be reduced) to avoid possible damage to the amplifier 500. Additionally, the processor or controller 150 may send a notification that the amplifier 500 is in need of service or repair.

In particular embodiments, a signal from one or more detectors 550 may be used to adjust or monitor the gain or output power of amplifier 500. As an example, an amplifier 500 may have two detectors 550, one located at the input side and another located at the output side. A ratio of the signals from the two detectors 550 may be used to determine the gain of amplifier 500, and the amplifier gain may be adjusted by changing the current supplied to pump laser 1 or pump laser 2 (which changes the amount of pump power provided by the pump lasers). As another example, a signal from detector 550 in FIG. 12 may be used to determine the output power of amplifier 500, and the amplifier output power may be adjusted by changing the current supplied to pump laser 1 or pump laser 2.

In particular embodiments, a fiber-optic amplifier 500 may include one or more optical filters 560. An optical filter 560 (which may include an absorptive filter, dichroic filter, long-pass filter, short-pass filter, bandpass filter, notch filter, or fiber Bragg grating) may be located at the input side or output side of an amplifier 500 or may be located within the optical gain fiber 560. In particular embodiments, an optical filter 560 located at the input side of a fiber-optic amplifier 500 may reduce the amount of optical noise (e.g., ASE from a previous amplifier stage) at the input to the amplifier 500. For example, the optical filter 560 in FIG. 13 may remove optical noise from the input light so that the optical noise does not propagate into the optical gain fiber 510. In particular embodiments, an optical filter 560 located at the output side of a fiber-optic amplifier 500 may reduce the amount of optical noise accompanying the amplified light that propagates out of the fiber-optic amplifier 500. Additionally or alternatively, an optical filter 560 located at the output side may prevent backward-propagating light (e.g., ASE from a subsequent amplifier stage) from reaching the gain fiber 510. In FIG. 12, the filter 560 located at the output may be configured to remove greater than 80% of the optical noise (e.g., ASE produced by the gain fiber 510) from the output of amplifier 500.

In particular embodiments, an optical filter 560 may reduce the amount of residual pump light from pump laser 1 or pump laser 2. As an example, the fiber-optic amplifier 500 in FIG. 13 may include a filter 560 located between the optical gain fiber 510 and pump laser 2. The filter may transmit the counter-propagating pump light from pump laser 2 and absorb or reflect the residual pump light from pump laser 1 (which may prevent the residual pump light from damaging or destabilizing pump laser 2). In FIG. 13, filter 560 located at the input side may be configured to transmit the input light (e.g., light at 1530-1560 nm) and the pump light from pump laser 1. Additionally, the filter 560 may be configured to block the residual pump light from pump laser 2 (which may prevent the residual pump light from damaging or destabilizing pump laser 1). For example, pump laser 1 may produce pump light at 970-980 nm, and pump laser 2 may produce pump light at 930-950 nm. The filter 560 in FIG. 13 may transmit light at 970-980 nm and 1530-1560 nm, and the filter 560 may reflect or absorb light at 930-950 nm.

In particular embodiments, a fiber-optic amplifier 500 may include any suitable arrangement of any suitable optical components (e.g., isolator 530, coupler 540, detector 550, pump laser, pump WDM 520, filter 560, lens, mirror, polarizer, or wave plate) at the input or output sides of the amplifier 500. As an example, at the input or output side of amplifier 500, filter 560 may be located before or after isolator 530, or the input or output side of amplifier 500 may include two filters 560, one located before isolator 530 and another located after pump WDM 520. As another example, an isolator 530 may be located between pump laser 1 and pump WDM 520, and the isolator 530 may prevent light from propagating into pump laser 1 (which could damage or destabilize pump laser 1). As another example, filter 560 in FIG. 12 or FIG. 13 may be located before coupler 540. As another example, a detector 550 may be positioned behind pump laser 1 or within the pump laser 1 package, and the detector 550 (which may be referred to as a back-facet monitor or back-facet detector) may be configured to receive light emitted from the back facet of pump laser 1 (e.g., to monitor the health or performance of pump laser 1).

In particular embodiments, two or more optical components of a fiber-optic amplifier 500 may be separate optical components, or two or more components may be combined together into a single package or integrated assembly. As an example, a pump WDM 520 and a coupler 540 may be combined together into a single free-space or fiber-coupled package or assembly. As another example, a pump WDM 520 and an isolator 530 may be combined together into a single free-space or fiber-coupled package or assembly. As another example, a coupler 540 and a filter 560 may be combined together into a single free-space or fiber-coupled package or assembly. As another example, a pump WDM 520, isolator 530, and coupler 540 may be combined together into a single free-space or fiber-coupled package or assembly.

As used herein, a free-space optical beam may refer to an optical beam that propagates in a non-confined or unguided manner. For example, a free-space optical beam (which may be referred to as a beam or a free-space beam) may propagate through air (or some other gas or a vacuum), and a free-space beam may not be confined to propagate in a waveguide or an optical fiber. Additionally, fiber-coupled light (which may be referred to as a fiber-coupled beam) may refer to light that propagates in a guided manner through an optical fiber (e.g., the light is confined to propagate substantially in the core or cladding of the optical fiber). Optically guided light (which may be referred to as guided light) may refer to light that is confined to propagate in an optical fiber or an optical waveguide (e.g., a planar lightwave circuit). A free-space optical component (e.g., a lens, mirror, or free-space filter) may refer to an optical component configured to receive or transmit a free-space input optical beam or produce a free-space output optical beam. As an example, a lens may receive a collimated free-space optical beam and focus the beam into the input end of an optical gain fiber 510. A free-space optical component, which may be referred to as a free-space component, a bulk component, a bulk optic, or a bulk optical component, may not include a fiber-optic cable. A fiber-optic component or a fiber-coupled optical component (e.g., a fiber Bragg grating or a tap coupler) may refer to an optical component configured to receive input light via an optical fiber or produce output light via an optical fiber. As an example, a fiber-coupled optical isolator may be a two-port device with an input optical fiber and an output optical fiber. As another example, a fiber-optic tap coupler may be a three-port device with an input optical fiber, a tap fiber output, and a primary output fiber. A tap coupler may split off a portion of input light and direct it to the tap fiber output, and the remaining input light may propagate to the primary output fiber.

In particular embodiments, the optical components of a fiber-optic amplifier 500 may be free-space components, fiber-coupled components, or a combination of free-space and fiber-coupled components. As an example, each optical component in FIG. 12 or FIG. 13 may be a free-space optical component or a fiber-coupled optical component. As another example, the input beam in FIG. 13 may be a free-space optical beam, and isolator 530, coupler 540, pump WDM 520, and filter 560 may each be free-space optical components. Additionally, the input beam and the pump-laser beam from pump laser 1 may be coupled into optical gain fiber 510 via a lens. As another example, pump laser 1 or pump laser 2 may be a free-space laser diode, and a lens may be used to collimate the free-space pump-laser beam. As another example, pump laser 1 or pump laser 2 may be a fiber-coupled laser diode, and the output fiber from pump laser 1 or pump laser 2 may be terminated by a collimator that generates a free-space pump-laser beam that is sent to a free-space pump WDM 520.

Figure 14:
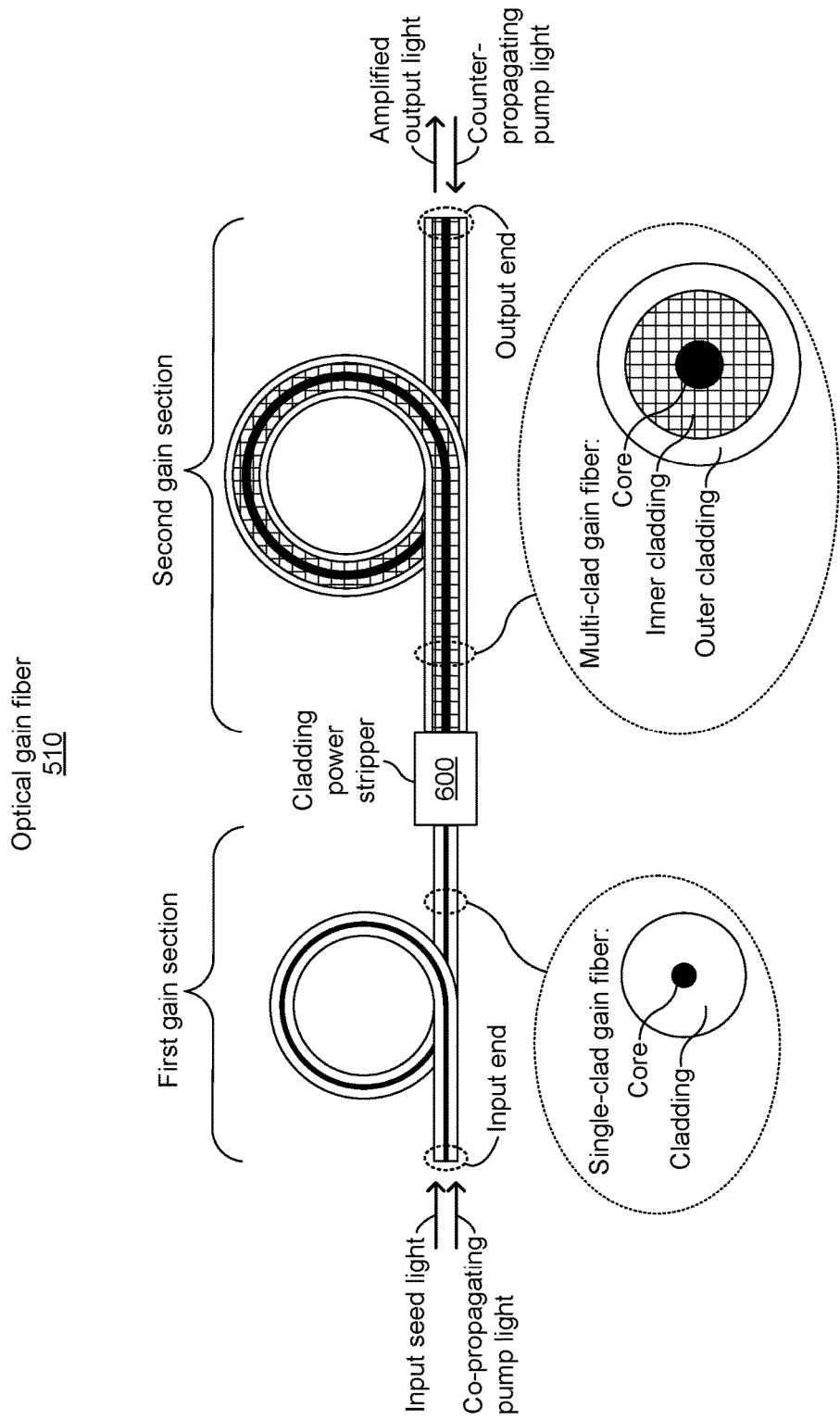
FIGS. 14-15 each illustrate an example optical gain fiber with two gain sections.
Figure 15:
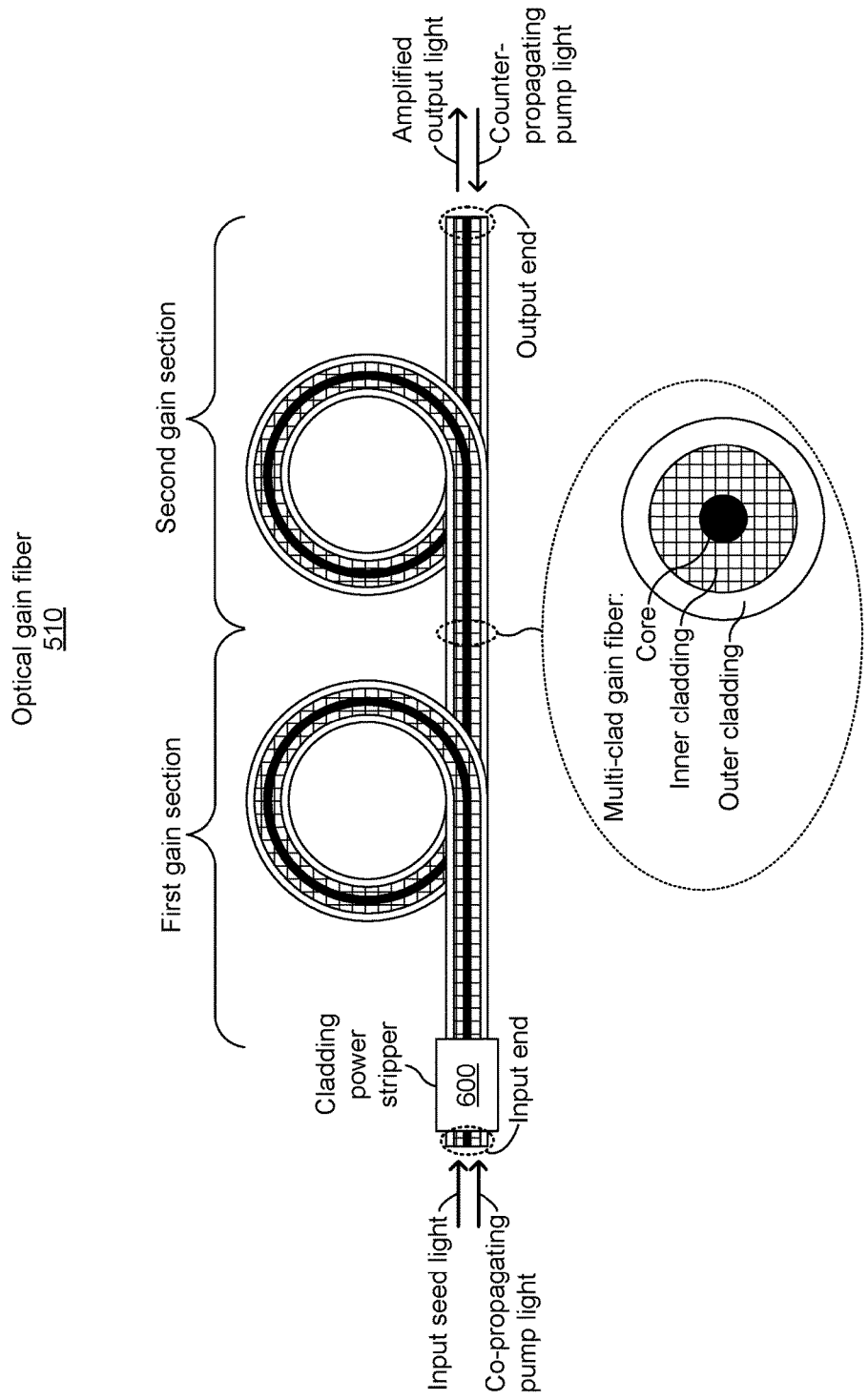

FIGS. 14-15 each illustrate an example optical gain fiber 510 with two gain sections. In particular embodiments, a fiber-optic amplifier 500 with an optical gain fiber 510 that has two gain sections may be referred to as a two-stage fiber-optic amplifier, a dual-stage fiber-optic amplifier, a hybrid fiber-optic amplifier, or a fiber-optic amplifier with a core-pumped section and a cladding-pumped section. In particular embodiments, an optical gain fiber 510 may include a first gain section and a second gain section. The first gain section may be a co-propagating core-pumped section, and the second gain section may be a counter-propagating cladding-pumped section. A first pump laser diode (e.g., pump laser 1) may be configured to provide co-propagating pump light to the first gain section, and a second pump laser diode (e.g., pump laser 2) may be configured to provide counter-propagating pump light to the second gain section. The first gain section may be configured to receive seed-laser input light and co-propagating pump light and amplify the seed-laser input light as it propagates along the first gain section. The seed-laser input light and the co-propagating pump light may propagate along the first gain section in the same direction. The second gain section may be configured to receive the amplified input light (e.g., from the first gain section) and counter-propagating pump light and further amplify the input light as it propagates along the second gain section. The amplified input light and the counter-propagating pump light may propagate along the second gain section in opposite directions.

The fiber-optic amplifiers 500 illustrated in FIG. 10, FIG. 12, or FIG. 13 may each include an optical gain fiber 510 similar to that illustrated in FIG. 14 or FIG. 15. The optical gain fibers 510 in FIG. 14 and FIG. 15 each include a first gain section with an input end configured to receive input seed light (e.g., input light provided by a seed laser 400) and co-propagating pump light (e.g., pump light supplied by pump laser 1). Additionally, the optical gain fibers 510 in FIG. 14 and FIG. 15 each include a second gain section with an output end configured to produce amplified output light (e.g., the input seed light which has been amplified while propagating through the optical gain fiber 510) and receive counter-propagating pump light (e.g., pump light supplied by pump laser 2). The co-propagating pump light is absorbed primarily by the gain material in the first gain section, and the counter-propagating pump light is absorbed primarily by the gain material in the second gain section. The first gain section may include a gain fiber with length approximately 0.2 m, 0.5 m, 1 m, 2 m, 4 m, 6 m, 10 m, 20 m, or any other suitable gain-fiber length, and the second gain section may include another gain fiber (similar to or different from the gain fiber of the first gain section) with length approximately 0.2 m, 0.5 m, 1 m, 2 m, 4 m, 6 m, 10 m, 20 m, or any other suitable gain-fiber length.

In particular embodiments, the input end of the first gain section or the output end of the second gain section may be coupled to another optical fiber by a fiber-optic splice. A fiber-optic splice (which may be referred to as a splice, a fiber splice, or a fusion splice) may refer to a process performed by a fusion splicer where the ends of two optical fibers are joined together by applying heat to melt or fuse the two ends together. A fiber-optic splice may join two optical fibers together so that light propagates from one optical fiber to the other with a minimum of optical loss (e.g., the optical loss associated with a splice may be less than 0.1 dB). As an example, the input light and co-propagating pump light may be delivered from a pump WDM 520 to the input end of the first gain section via an optical fiber that is spliced to the input end. As another example, the amplified output light and the counter-propagating pump light may be delivered into or out of the output end of the second gain section via an optical fiber that is spliced to the output end.

In particular embodiments, the input end of the first gain section or the output end of the second gain section may include a cleaved or polished end of the optical gain fiber 510. As an example, the input light and co-propagating pump light may be received as free-space optical beams that are focused onto the cleaved or polished input end of the first gain section. As another example, the amplified output light and the counter-propagating pump light may be free-space optical beams that are delivered to or produced from the cleaved or polished output end of the second gain section. A cleaved end of an optical fiber may refer to a controlled break of an optical fiber (e.g., by scribing the fiber and applying tension) that produces an optical quality end face suitable for coupling light into or out of the optical fiber. A polished end of an optical fiber may refer to an end face of an optical fiber that is mechanically polished to produce an optical quality end face suitable for coupling light into or out of the optical fiber.

In particular embodiments, an end face of an optical fiber may be cleaved or polished so that it is substantially normal to an input or output optical beam, or an end face may be cleaved or polished at an angle (e.g., 1°, 2°, or 5°). In particular embodiments, an end face of an optical fiber may include an anti-reflection (AR) coating having a low optical reflectivity at a wavelength of a seed laser 400 or a pump laser. As an example, an end face may be cleaved or polished, and then a dielectric coating may be deposited onto the end face. The dielectric coating may be an AR coating with a low optical reflectivity (e.g., R<1%) at the seed-laser wavelength (e.g., 1545-1555 nm) or at the pump-laser wavelength (e.g., 940-980 nm). Angling an input face or applying an AR coating to the input face may reduce the amount of reflected light from the input face that propagates back to a seed laser 400 or to pump laser 1. Additionally, applying an AR coating to an input face may increase the amount of light from the seed laser 400 or pump laser 1 that is coupled into the optical gain fiber 510.

In particular embodiments, a cleaved or polished input end or output end may be attached (e.g., with adhesive or epoxy, or by splicing with a fusion splicer) to a piece of glass. As an example, instead of the output end of the second gain section being directly coupled to air to produce a free-space output beam, the output end may be attached to a bulk piece of glass (e.g., fused silica) having any suitable length (e.g., approximately 1 mm, 2 mm, 5 mm, 10 mm, or 20 mm). The piece of glass (which may be referred to as an end cap, endcap, fiber-optic end cap, termination optical fiber, or coreless termination fiber) may allow the amplified output light from the second gain section to spread out in a transverse direction as the light propagates through the length of the glass, which reduces the optical intensity of the output light. After the beam of amplified output light spreads out, it may be emitted from an end of the piece of glass as a free-space optical beam. The reduced intensity may prevent the occurrence of optical damage at the air-glass interface where the free-space amplified output beam is produced. Additionally, the end of the piece of glass may be angled or may have an AR coating to reduce the amount of back-reflected light.

In FIG. 14, the first gain section includes a single-clad gain fiber. In particular embodiments, a single-clad gain fiber may include a core and a cladding that surrounds the core. The core and the cladding may each be made from a glass material (e.g., a silicate-based glass, such as for example, silica, which may include silicon dioxide and one or more dopants to alter the refractive index of the glass), and the core may be configured to have a higher refractive index than the cladding so that light is confined to propagate substantially within the core. Additionally, the core of a single-clad gain fiber may be doped with a gain material that absorbs the co-propagating pump light and provides optical gain to the input seed light as it propagates along the single-clad gain fiber. In particular embodiments, a single-clad gain fiber may have one or more additional layers (e.g., a buffer or a jacket) that surround the cladding and provide mechanical or environmental protection for the single-clad gain fiber. For example, the cladding of a single-clad gain fiber may be coated with a protective polymer buffer layer. In the first gain section of FIG. 14, the input seed light and the co-propagating pump light may be guided by and may propagate substantially within the core of the single-clad gain fiber, and the guiding of the input light and the pump light may be provided by a refractive index difference between the core and cladding. For example, the input light or the pump light may propagate along the single-clad gain fiber in a transverse mode where greater than 75% of the light is confined to the core, and less than 25% of the transverse mode extends into the cladding. As another example, the input light may propagate in an approximately Gaussian-shaped single transverse mode where part of the tails of the Gaussian mode extend into the cladding.

In FIG. 14, the second gain section includes a multi-clad gain fiber, and in FIG. 15, the first and second gain sections each includes a multi-clad gain fiber. In particular embodiments, a multi-clad gain fiber may include a core doped with gain material and two or more cladding layers that surround the core. As an example, the second gain section in FIG. 14 and the first and second gain sections in FIG. 15 each includes a double-clad gain fiber with two cladding layers: (1) an inner cladding (which may be referred to as a first cladding) that surrounds the core and (2) an outer cladding (which may be referred to as a second cladding) that surrounds the inner cladding. As another example, a multi-clad gain fiber may be a triple-clad gain fiber with three cladding layers that surround the core. For example, the second gain section in FIG. 14 may include a triple-clad gain fiber with an inner cladding, an outer cladding, and a third cladding layer (not shown in FIG. 14) that surrounds the outer cladding layer. A multi-clad gain fiber may also have one or more additional layers (e.g., a buffer or a jacket) that surround the outermost cladding and provide mechanical or environmental protection for the multi-clad fiber. The core of a multi-clad gain fiber may be doped with a gain material that absorbs co-propagating or counter-propagating pump light and provides optical gain to input light (e.g., input seed light or amplified input light) as the input light propagates along the multi-clad gain fiber.

In particular embodiments, the core, inner cladding, and outer cladding of a multi-clad gain fiber 510 may each include or be made from a glass material. As an example, the core may include a silica glass doped with gain material, and the inner cladding and outer cladding may each include a silica glass. Additionally, the core, the inner cladding, or the outer cladding may be doped with a material to change the refractive index. The core may be configured to have a higher refractive index than the inner cladding, and the inner cladding may have a higher refractive index than the outer cladding. As an example, the outer cladding may be a silica glass doped with fluorine to decrease the refractive index of the glass. As another example, the core or inner cladding may be a silica glass doped with germanium to increase the refractive index of the glass. In a multi-clad gain fiber, the input light that is being amplified may be guided by and may propagate substantially within the core. The pump light may be guided by and may propagate substantially within the core, or the pump light may be guided by the inner cladding and may propagate substantially within the inner cladding and the core. Rather than having one or more cladding layers which are made from a polymer material (e.g., acrylate or fluoroacrylate), a multi-clad gain fiber 510 may have an all-glass design where the core is made from glass doped with a gain material, and the two or more cladding layers are each made from a glass material. A gain fiber that includes a cladding made from polymer may be susceptible to degradation associated with exposure to elevated temperatures (e.g., the degradation may cause unwanted absorption of pump light in the polymer region of the gain fiber). An all-glass multi-clad gain fiber 510 may be able to operate for thousands of hours without experiencing significant performance degradation associated with elevated temperatures. Additionally, an all-glass multi-clad gain fiber 510 may be coated with one or more outer layers of polymer material (e.g., a high-temperature polymer). A polymer coating may provide mechanical or environmental protection for an all-glass multi-clad gain fiber 510 and may not be involved in the propagation or confinement of light within the core or cladding layers.

In the second gain section of FIG. 14, the amplified input light (received from the first gain section) is guided by and propagates substantially within the core of the multi-clad gain fiber, and the counter-propagating pump light is guided at least in part by the inner cladding and propagates substantially within the inner cladding and the core. The amplified input light may propagate along the core of the multi-clad fiber in a single transverse mode and may be guided by a refractive index difference between the core and the inner cladding. The counter-propagating pump light may propagate in a multi-mode pattern that is confined to propagate in the inner cladding by the refractive index difference between the inner cladding and outer cladding. For example, the pump light may propagate along the multi-clad gain fiber in a multi-mode pattern where greater than 75% of the pump light is contained within the inner cladding and core, and less than 25% of the pump light extends into the outer cladding.

In particular embodiments, a first gain section and a second gain section may be coupled together by one or more fiber-optic splices. For example, in FIG. 14, the first gain section may be spliced to the second gain section by a fiber-optic splice that couples the single-clad gain fiber to the multi-clad gain fiber. In particular embodiments, the core of the second gain section may be larger than the core of the first gain section, and this mismatch in core sizes may be associated with a directionally dependent loss for light propagating in the core of the first and second gain sections. The light propagating from the smaller core of the single-clad gain fiber to the larger core of the multi-clad gain fiber may experience relatively low loss since the mode size of the light in the core of the single-clad fiber may be well matched to the mode size in the multi-core fiber. The light propagating in the opposite direction may experience a relatively high loss since the light propagating in the larger core of the multi-clad gain fiber may have a larger mode size (or may propagate in a higher-order mode) and only a small portion of the light may be coupled into the smaller core of the single-clad gain fiber due to a mode mismatch between the larger core and the smaller core. For example, the first and second gain sections may be coupled together by a fiber-optic splice that provides a relatively low optical loss for light propagating from the smaller core of the first gain section to the larger core of the second gain section (e.g., amplified input light or co-propagating pump light). The amplified input light or the co-propagating pump light may experience a relatively low optical loss of less than or equal to 0.02 dB, 0.1 dB, 0.2 dB, 0.5 dB, 1 dB, or 2 dB. Additionally, the fiber-optic splice may provide a relatively high optical loss for light propagating in the opposite direction from the larger core of the second gain section to the smaller core of the first gain section (e.g., back-reflected light, counter-propagating pump light, or ASE). For example, ASE light produced in the second gain may experience a relatively high optical loss (e.g., an optical loss of greater than or equal to 3 dB, 5 dB, 10 dB, 20 dB, or 30 dB) when propagating from the core of the multi-clad gain fiber to the core of the single-clad gain fiber via an optical splice. In particular embodiments, a splice that joins together the first and second gain sections may help reduce the susceptibility of a fiber-optic amplifier to optical feedback (e.g., from back-reflected light or ASE) by increasing the optical loss experienced by light propagating from the second gain section to the first gain section.

In FIG. 15, the first gain section includes a multi-clad gain fiber, and the second gain section also includes a multi-clad gain fiber. In the first and second gain sections, the input seed light may be guided by and may propagate substantially within the core of the multi-clad gain fiber. In the first gain section, the co-propagating pump light may be guided by and may propagate substantially within the core of the multi-clad gain fiber, or the co-propagating pump light may be guided at least in part by the inner cladding and may propagate substantially within the inner cladding and the core. In the second gain section, the counter-propagating pump light may be guided at least in part by the inner cladding and may propagate substantially within the inner cladding and the core. The first and second gain sections in FIG. 15 may be made from different multi-clad gain fibers that are spliced together (e.g., the two sections may have different types of dopants, different dopant concentrations, different core diameters, different cladding diameters, different refractive index profiles, or different numerical apertures). Alternatively, the first and second gain sections in FIG. 15 may be part of the same multi-clad gain fiber (e.g., no splices are needed to join the two gain sections together). For example, the optical gain fiber 510 in FIG. 15 may include a single continuous length of multi-clad gain fiber, where the first gain section corresponds to a first portion of the multi-clad gain fiber, and the second gain section corresponds to a second portion of the multi-clad gain fiber.

In particular embodiments, the first gain section or the second gain section of an optical gain fiber 510 may include any suitable type of gain fiber, such as for example, a single-clad gain fiber, a multi-clad gain fiber, a photonic-crystal gain fiber, an air-clad gain fiber, a pedestal gain fiber, a large-mode area (LMA) gain fiber, a fluoride glass gain fiber, a chalcogenide glass gain fiber, or any suitable combination thereof. As an example, the second gain section in FIG. 14 may include a double-clad photonic-crystal gain fiber where the core, inner cladding, or outer cladding includes a periodic arrangement of holes (e.g., a triangular arrangement of round air holes) extending along the length of the fiber. As another example, the first gain section or the second gain section may include an air-clad gain fiber where one of the cladding layers is mostly made up of air (e.g., an air cladding region may include >50% air along with some support structures). The second gain section in FIG. 14 may be an air-clad gain fiber where the outer cladding includes an air cladding region made up of air along with some support structures that provide support for the core and inner cladding. The support structures may connect the inner cladding to an exterior part of the outer cladding or to a third cladding layer (not shown in FIG. 14) that surrounds the outer cladding. As another example, the first gain section or the second gain section may include a pedestal gain fiber having a "pedestal region" located between the core and cladding. The pedestal region may have a refractive greater than the cladding refractive index and less than the core refractive index, and the pedestal may act as an intermediate cladding-type layer located between the core and cladding. As another example, the second gain section in FIG. 14 or FIG. 15 may include a LMA gain fiber with a core diameter greater than 12 µm. Using a LMA gain fiber in the second gain section may allow the amplified light in the fiber-optic core to propagate in a larger optical mode which reduces the intensity of the amplified light. Reducing the intensity of the amplified light may reduce or eliminate problems with undesirable nonlinear effects in the gain fiber (e.g., stimulated Brillouin scattering or stimulated Raman scattering). Additionally, the reduced intensity of the amplified light may reduce or eliminate problems with optical damage at the air-glass interface of the output end of the second gain section. As another example, the first gain section or the second section may include a fluoride glass gain fiber made up of one or more metal fluorides (e.g., a heavy metal fluoride glass (HMFG) fiber, such as a ZBLAN glass fiber made up of zirconium, barium, lanthanum, aluminum, and sodium fluorides). As another example, the first gain section or the second gain section may include a chalcogenide glass gain fiber that includes sulfur, selenium, or tellurium (e.g., a chalcogenide glass fiber that includes arsenic sulfide ($As_2S_3$) or arsenic selenide ($As_2Se_3$)).

In particular embodiments, co-propagating pump light pump light and counter-propagating pump light may each provide any suitable amount of optical power to an optical gain fiber 510. As an example, the co-propagating pump light supplied to the input end of the first gain section by pump laser 1 may have an optical power of approximately 1 W, 2 W, 5 W, or 10 W. As another example, the counter-propagating pump light supplied to the output end of the second gain section by pump laser 2 may have an optical power of approximately 2 W, 5 W, 10 W, or 20 W.

In particular embodiments, the optical power gain provided by a fiber-optic amplifier 500 may be approximately 10 dB, 20 dB, 30 dB, 40 dB, 50 dB, or 60 dB. As an example, the optical gain fiber 510 in FIG. 14 may be part of a fiber-optic amplifier 500 that provides an optical power gain to the input seed light of greater than or equal to 40 dB. The optical power gain provided by the first gain section may be approximately 20 dB, 30 dB, or 40 dB, and the optical power gain provided by the second gain section may be approximately 10 dB, 20 dB, or 30 dB. As an example, the first gain section may provide a power gain of greater than or equal to 25 dB, and the second gain section may provide a power gain of greater than or equal to 15 dB (corresponding to a total gain for the optical gain fiber 510 of greater than or equal to 40 dB). As another example, the input seed light may include optical pulses with a pulse energy of approximately 100 pJ, and after the first gain section, the pulses may have a pulse energy of approximately 64 nJ (corresponding to a gain for the first gain section of approximately 28 dB). After the second gain section, the pulses may have a pulse energy of approximately 3.2 µJ, corresponding to a gain for the second gain section of approximately 17 dB and an overall gain for the optical gain fiber 510 of approximately 45 dB.

In particular embodiments, the input seed light supplied to the input end of an optical gain fiber 510 may include optical pulses having a pulse duration between approximately 100 ps and approximately 10 ns, and the amplified optical pulses produced after propagating through the optical gain fiber 510 may have approximately the same pulse duration. As an example, the input optical pulses may have a duration of approximately 2 ns, and the amplified output pulses may have a duration of approximately 1.8 ns (e.g., gain saturation during the optical-amplification process may cause some narrowing of the optical pulses). In particular embodiments, the input seed light supplied to the input end of an optical gain fiber 510 may include optical pulses having a wavelength between approximately 1400 nm and approximately 1600 nm, a pulse duration less than or equal to 100 ns, and a pulse repetition frequency less than 100 MHz. As an example, a pulsed laser diode 440 may provide input seed light having a wavelength of approximately 1550 nm, a pulse duration of approximately 4 ns, and a pulse repetition frequency of approximately 600 kHz. In particular embodiments, the amplified output pulses produced at the output end of the second gain section of an optical gain fiber 510 may have a pulse energy of greater than or equal to 10 nJ. As an example, a fiber-optic amplifier 500 that includes an optical gain fiber 510 may receive input optical pulses from a pulsed laser diode 440 and may produce output optical pulses having a pulse energy of approximately 10 nJ, 20 nJ, 50 nJ, 100 nJ, 200 nJ, 500 nJ, or 1 µJ.

In particular embodiments, the input seed light supplied to an optical gain fiber 510 may be supplied by a laser diode 440. As an example, the input seed light may be supplied by a Fabry-Perot laser diode, a quantum well laser, a DBR laser, a DFB laser, or a VCSEL. As another example, the input seed light may be supplied by a DM laser diode. The DM laser diode may be pulsed and may produce light at a discrete-mode wavelength as well as light at one or more side-mode wavelengths. The side-mode wavelengths may be undesirable (e.g., the side-mode wavelengths may act as optical noise, or they may not contribute to the formation of the optical pulses), and so, before being sent to the input end of an optical gain fiber 510, the pulses from the DM laser diode may be sent through an optical filter to remove some or all of the optical power in the side-mode wavelengths. The optical filter may be configured to transmit the discrete-mode wavelength and absorb or reflect light at the one or more side-mode wavelengths.

In particular embodiments, a light source 110 may include a seed laser 400 and a fiber-optic amplifier 500, where the seed laser 400 supplies input light to the fiber-optic amplifier 500. As an example, a light source 110 may be part of a FMCW lidar system, and the seed laser 400 may supply CW or FMCW light to the fiber-optic amplifier 500. As another example, a light source 110 may be part of a pulsed lidar system, and a pulsed laser diode 440 may supply input optical pulses which are amplified by a fiber-optic amplifier 500. The fiber-optic amplifier 500 may be a two-stage fiber-optic amplifier that includes an optical gain fiber 510 with two gain sections. The output amplified light from the light source 110 (which may include amplified pulses of light, amplified CW light, or amplified FMCW light) may be supplied as fiber-coupled light or as a free-space output beam. In particular embodiments, a lidar system may include a light source 110, a scanner 120, and a receiver 140, and the light source 110 may include a fiber-optic amplifier 500 with an optical gain fiber 510 that has two gain sections. As an example, the light source 110 may supply amplified light (e.g., amplified pulses of light, amplified CW light, or amplified FMCW light) to the scanner 120, and the scanner 120 may scan at least a portion of the amplified light across a field of regard of the lidar system 100. The receiver 140 may detect at least a portion of the amplified light scattered by a target 130 located a distance from the lidar system 100.

In particular embodiments, a fiber-optic amplifier may include one or more cladding power strippers 600. A cladding power stripper 600 (which may be referred to as a cladding mode stripper, a cladding light stripper, a pump light stripper, or a pump stripper) may be used to absorb or remove light from a cladding layer of a multi-clad fiber. The light propagating in the core of the multi-clad gain fiber (e.g., input seed light or co-propagating pump light) may not be significantly affected by a cladding power stripper 600 and may propagate through a cladding power stripper 600 without significant attenuation. In particular embodiments, a cladding power stripper 600 may be positioned at any suitable location in a fiber-optic amplifier 500. For example, a cladding power stripper may be located in the first gain section, in the second gain section, between the first and second gain sections, or at or near an input end or output end of a gain section.

In particular embodiments, a cladding power stripper 600 may be a fiber-optic component that is attached or spliced to a part of an optical gain fiber 510. As an example, the cladding power stripper 600 in FIG. 14 may be a fiber-optic component that is spliced between the first and second gain sections. As another example, the cladding power stripper 600 in FIG. 15 may be a fiber-optic component that is spliced to the input end of the first gain section. In particular embodiments, a cladding power stripper 600 may be formed by removing (e.g., by chemical etching) all or part of one or more cladding layers from a multi-clad gain fiber. As an example, the cladding power stripper 600 in FIG. 14 or FIG. 15 may be formed by removing all or part of the outer cladding from a portion of the multi-clad gain fiber or by removing the outer cladding as well as all or part of the inner cladding from a portion of the multi-clad gain fiber. When all or part of one or more cladding layers are removed, the pump light may no longer be confined to the inner cladding, and the pump light may leak out of the fiber.

In particular embodiments, a cladding power stripper 600 may be used to remove residual pump-laser light that propagates through a cladding layer of a multi-clad gain fiber without being absorbed. As an example, a cladding power stripper 600 may be used to remove residual pump light from the inner cladding of a double-clad gain fiber. Residual pump light may refer to leftover pump light that reaches an end of an optical gain fiber 510 or an end of a first or second gain section without being absorbed while propagating through the gain fiber. The residual pump light may correspond to approximately 10%, 5%, 2%, 1%, 0.5%, 0.1%, or any other suitable percentage of the pump power provided to an optical gain fiber 510. In the example of FIG. 14, if 10 W of counter-propagating pump light is provided at the output end of the second gain section, then approximately 9.7 W of the pump light (or, 97% of the pump light) may be absorbed while propagating through the second gain section. At or near the cladding power stripper 600 located between the first and second gain sections, there may be approximately 300 mW of residual counter-propagating pump light, which corresponds to 3% of the input pump power. In the example of FIG. 15, if 10 W of counter-propagating pump light is provided at the output end of the second gain section, then approximately 9.9 W of the pump light may be absorbed while propagating through the optical gain fiber 510. At or near the cladding power stripper 600 located near the input end of the first gain section, there may be approximately 100 mW of residual counter-propagating pump light, which corresponds to 1% of the input pump power.

The cladding power strippers 600 in FIG. 14 and FIG. 15 may each remove unabsorbed counter-propagating pump light from the multi-clad gain fiber. In FIG. 14, a cladding power stripper 600 is located between the first and second gain sections, and the cladding power stripper 600 is configured to remove residual counter-propagating pump light. The amplified input light from the first gain section passes through the cladding power stripper 600 with little or no attenuation and proceeds to the second gain section. The cladding power stripper 600 in FIG. 14 may be located in the second gain section and near the interface between the first and second gain sections (e.g., the cladding power stripper 600 may be formed by removing a portion of the multi-clad gain fiber cladding located near the first gain section). In FIG. 15, a cladding power stripper 600 is located near the input end of the first gain section, and the cladding power stripper 600 is configured to remove residual counter-propagating pump light from the inner cladding. The cladding power stripper 600 may be located any suitable distance from the input end, such as for example, approximately 0 mm, 1 mm, 2 mm, 5 mm, 10 mm, 20 mm, 50 mm, or 100 mm from the input end. In FIG. 15, the co-propagating pump light will not be removed by the cladding power stripper 600 since the co-propagating pump light may propagate in the core of the multi-clad fiber and may be unaffected by the cladding power stripper 600.

In particular embodiments, a cladding power stripper 600 may prevent counter-propagating pump light from damaging or destabilizing a seed laser 400, a laser diode 440, or a pump laser diode (e.g., pump laser 1). As an example, residual counter-propagating pump light from pump laser 2 may cause damage to pump laser 1 or may destabilize pump laser 1. If pump laser 1 is destabilized, the power or wavelength of the pump light provided by pump laser 1 may fluctuate, which may cause noise, instability, or gain fluctuations in a fiber-optic amplifier 500. The cladding power strippers 600 in FIG. 14 and FIG. 15 may prevent damage or destabilization of pump laser 1 by blocking most of the residual counter-propagating pump light from reaching pump laser 1. As another example, residual counter-propagating pump light from pump laser 2 may cause damage to or may destabilize a laser diode 440 that provides the input seed light to an optical gain fiber 510. A cladding power stripper 600 may prevent most of the residual counter-propagating pump light from reaching the laser diode 400, and the laser diode may not experience damage or destabilization associated with residual counter-propagating pump light.

In particular embodiments, most of the co-propagating pump light may be absorbed in the first gain section, and most of the counter-propagating pump light may be absorbed in the second gain section. The co-propagating pump light may be substantially absorbed in the first gain section of optical gain fiber 510, and a small amount (e.g., less than 10%) of residual co-propagating pump light may reach the second gain section. Alternatively, the co-propagating pump light may propagate through both the first and second gain sections, and a small amount (e.g., less than 10%) of residual co-propagating pump light may reach the output end of the second gain section. The counter-propagating pump light may be substantially absorbed in the second gain section, and a small amount (e.g., less than 10%) of residual counter-propagating pump light may reach the first gain section or a cladding power stripper 600 located between the first and second gain sections. Alternatively, the counter-propagating pump light may propagate through both the first and second gain sections, and a small amount (e.g., less than 10%) of residual counter-propagating pump light may reach the input end of the first gain section or a cladding power stripper 600 located near the input end.

In particular embodiments, a fiber-optic amplifier 500 may include an optical filter configured to absorb or reflect residual pump light. As an example, an optical filter may be used (instead of or in addition to an isolator 530 or a cladding power stripper 600) to block or reduce the amount of residual co-propagating pump light or residual counter-propagating pump light. An optical filter that blocks or reduces residual pump light may be a fiber-optic component (e.g., a FBG located in or near a first gain section or a second gain section) or a free-space optical component (e.g., a dichroic filter located at the input side or the output side of a fiber-optic amplifier 500). In particular embodiments, pump laser 1 and pump laser 2 of a fiber-optic amplifier 500 may operate at different wavelengths, and an optical filter may be used to block the counter-propagating light from pump laser 2. As an example, the input side of a fiber-optic amplifier 500 may include an optical filter that reflects or absorbs light from pump laser 2 (e.g., light at 930-950 nm) and transmits the input light (e.g., light at 1530-1560 nm) and light from pump laser 1 (e.g., light at 970-980 nm). As another example, an optical filter may be located between the first and second gain sections, and the filter may reflect the counter-propagating pump light at 935-945 nm and may transmit light at 974-978 nm and light at 1548-1552 nm. The filter may prevent most of the residual counter-propagating pump light from reaching pump laser 1 or the source of the input light. In particular embodiments, an optical filter may be used to block ASE as well as light from a pump laser. As an example, the input side of a fiber-optic amplifier 500 may include an optical filter that blocks at least part of the ASE produced by the optical gain fiber 510 and blocks the residual counter-propagating pump light from pump laser 2.

In particular embodiments, a first gain section of an optical gain fiber 510 may be coupled to a second gain section by one or more fiber-optic splices. As an example, a first gain section may be directly spliced to a second gain section. Additionally, the second gain section may have a portion of cladding removed to form a cladding power stripper 600 (e.g., in FIG. 14, the first gain section may be directly spliced to the second gain section, and the cladding power stripper 600 may be formed by etching away a portion of cladding from the multi-clad gain fiber). As another example, a first gain section may be spliced to one end of a tapered fiber, and the other end of the tapered fiber may be spliced to the second gain section. The tapered fiber may be used as a mode converter between the first gain section and the second gain section when the first and second gain sections have different core diameters or different mode field diameters. In the example of FIG. 14, the cladding power stripper 600 may be a fiber-optic component that couples the first and second gain sections. The first gain section may be spliced to one end of the cladding power stripper 600, and the other end of the cladding power stripper 600 may be spliced to the second gain section. In the example of FIG. 15, the first gain section and the second gain section may be different types of multi-clad gain fibers, and the first gain section may be directly spliced to the second gain section (or the first and second gain sections may each be spliced to an end of a tapered fiber that couples the two gain sections together). Alternatively, the optical gain fiber in FIG. 15 may be a single continuous length of multi-clad gain fiber, and there may be no fiber-optic splice between the first and second gain sections.

In particular embodiments, the output side of a fiber-optic amplifier 500 may include an optical fiber terminated by an output collimator that produces a free-space output beam that includes the seed-laser input light after propagating through and being amplified by the amplifier. The free-space output beam may be provided to a scanner 120 of a lidar system 100, and the scanner 120 may scan the free-space output beam across a field of regard of the lidar system 100. In particular embodiments, the amplified output light from a fiber-optic amplifier 500 may be coupled to a booster amplifier. As an example, a light source 110 may include a fiber-optic amplifier 500 followed by a booster amplifier. The booster amplifier may provide additional amplification to the amplified output light received from the fiber-optic amplifier 500. For example, a fiber-optic amplifier 500 may amplify input seed-laser pulses by approximately 40 dB, and a booster amplifier may provide an additional 10 dB of gain. The output of the booster amplifier may be terminated in a collimator or lens that produces a free-space output beam. The free-space output beam may be sent to a scanner 120 of a lidar system 100, and the scanner 120 may scan the free-space output beam across a field of regard of the lidar system 100.

In particular embodiments, the first gain section and the second gain section of an optical gain fiber 510 may each include any suitable gain material, and the fiber-optic cores of the first and second gain sections may be doped with the same gain material or different gain material. The first gain section may be doped with erbium, ytterbium, neodymium, praseodymium, holmium, thulium, dysprosium, or any other suitable rare-earth element, or any suitable combination thereof, and the second gain section may be doped with erbium, ytterbium, neodymium, praseodymium, holmium, thulium, dysprosium, or any other suitable rare-earth element, or any suitable combination thereof. Additionally or alternatively, the first gain section or the second gain section may be doped with bismuth. As an example, the first gain section may include a fiber-optic core doped with erbium, and the second gain section may include a fiber-optic core doped with a combination of erbium and ytterbium. The co-propagating pump light used to pump the erbium in the first gain section may have a wavelength between approximately 970 nm and approximately 980 nm (e.g., pump laser 1 may have an operating wavelength of approximately 976 nm) or a wavelength between approximately 1440 nm and approximately 1540 nm (e.g., pump laser 1 may have an operating wavelength of approximately 1480 nm). Additionally, the counter-propagating pump light used to pump the Er:Yb co-doped fiber in the second gain section may have a wavelength between approximately 930 nm and approximately 950 nm (e.g., pump laser 2 may have an operating wavelength of approximately 940 nm). As another example, the first and second gain sections may each include a fiber-optic core doped with erbium, and the co-propagating and counter-propagating pump light may each have a wavelength between approximately 970 nm and approximately 980 nm or a wavelength between approximately 1440 nm and approximately 1540 nm. As another example, the first and second gain sections may each include a fiber-optic core doped with ytterbium, and the co-propagating and counter-propagating pump light may each have a wavelength between approximately 900 nm and approximately 1040 nm. As another example, the first and second gain sections may each include a fiber-optic core doped with thulium, and the co-propagating and counter-propagating pump light may each have a wavelength between approximately 790 nm and approximately 800 nm or between approximately 1400 nm and approximately 1600 nm. As another example, the first and second gain sections may each include a fiber-optic core doped with neodymium, and the co-propagating and counter-propagating pump light may each have a wavelength between approximately 800 nm and approximately 820 nm or between approximately 870 nm and approximately 890 nm. As another example, the first and second gain sections may each include a fiber-optic core doped with holmium, and the co-propagating and counter-propagating pump light may each have a wavelength between approximately 1900 nm and approximately 2000 nm.

Figure 16:
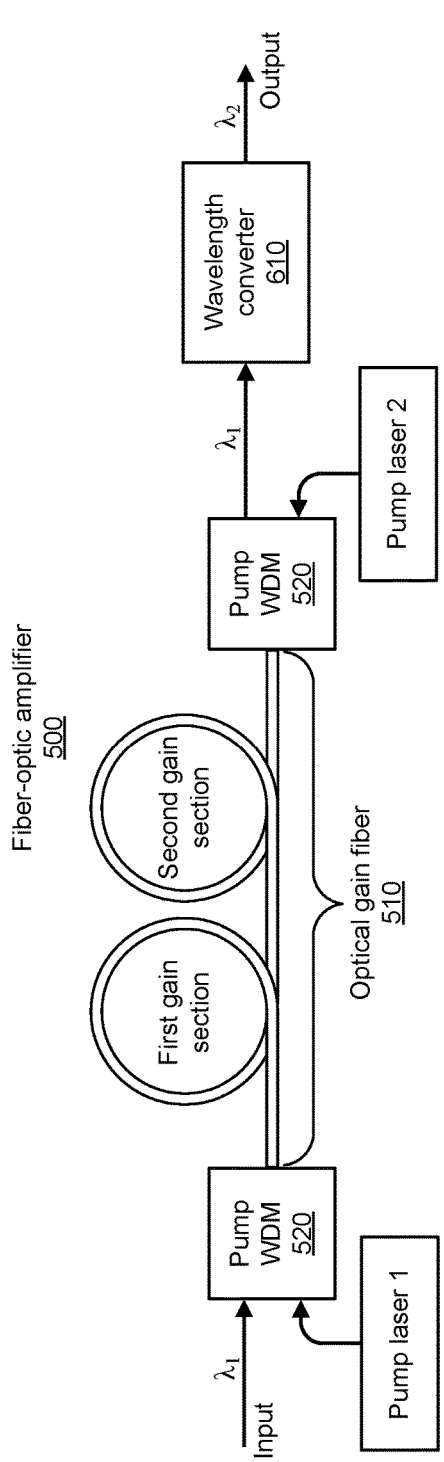
FIG. 16 illustrates an example fiber-optic amplifier with a wavelength converter located at the output side of the amplifier.

FIG. 16 illustrates an example fiber-optic amplifier 500 with a wavelength converter 610 located at the output side of the amplifier. In particular embodiments, a wavelength converter 610 (which may be referred to as a wavelength-conversion stage) may be configured to receive amplified output light from an optical gain fiber 510 of a fiber-optic amplifier 500 and convert the received light into light having a different wavelength (e.g., a longer wavelength or a shorter wavelength). For example, pulses of light with a wavelength of approximately 1000-1100 nm may be converted to pulses of light with a longer wavelength of approximately 1300-2000 nm. In FIG. 16, the amplified output light from the second gain section of the optical gain fiber 510 passes through a pump WDM 520 and then propagates to the wavelength converter 610. The amplified output light has a wavelength $\lambda_1$, and the wavelength-converted light has a wavelength $\lambda_2$ which is different from $\lambda_1$ (e.g., $\lambda_2 > \lambda_1$ or $\lambda_2 < \lambda_1$). As an example, the first and second gain sections may each include a fiber-optic core doped with ytterbium, and $\lambda_1$ may be between approximately 970 nm and approximately 1120 nm. The wavelength-converted output light may have a longer wavelength $\lambda_2$ between approximately 1300 nm and approximately 2000 nm (e.g., $\lambda_2$ may be between 1500 nm and 1600 nm). As another example, the amplified output light may include pulses with a wavelength $\lambda_1$ of approximately 1080 nm, and the wavelength-converted light may include pulses with a longer wavelength $\lambda_2$ of approximately 1550 nm.

In particular embodiments, a wavelength converter 610 may include an optical parametric oscillator (OPO). An OPO may refer to an optical cavity that includes a material that produces wavelength-shifted light through a parametric-amplification process. The material in the optical cavity (which may be referred to as an OPO medium, an OPO crystal, or a nonlinear crystal) may convert amplified optical pulses received from an optical gain fiber 510 into two longer wavelengths of light by means of a nonlinear-optical interaction in the OPO medium. The OPO medium may convert at least part of each received pulse into two longer-wavelength pulses, which may be referred to as signal and idler pulses. Additionally, the OPO may emit at least a portion of the signal pulses as wavelength-converted output light having a wavelength $\lambda_2$. In particular embodiments, an OPO medium of an OPO may be configured to produce signal light at a wavelength $\lambda_2$ between approximately 1400 nm and approximately 1600 nm. The associated idler light may have a wavelength between approximately 2.7 μm and approximately 3 μm.

In particular embodiments, the OPO medium of an OPO may include a periodically poled crystal material, such as for example, periodically poled potassium titanyl phosphate (periodically poled KTiOPO$_4$, or PPKTP), periodically poled potassium titanyl arsenate (periodically poled KTiOAsO$_4$, or PPKTA), periodically poled rubidium titanyl arsenate (periodically poled RbTiOAsO$_4$, or PPRTA), periodically poled lithium niobate (periodically poled LiNbO$_3$, or PPLN), periodically poled lithium tantalate (periodically poled LiTaO$_3$, or PPLT), or periodically poled stoichiometric lithium tantalate (PPSLT). A periodically poled crystal material may refer to a crystal material (e.g., potassium titanyl phosphate) which undergoes a periodic-poling process that produces a spatially periodic reversal of the orientation of the ferroelectric domains in the crystal. The periodic-poling process may ensure that the received light at wavelength $\lambda_1$ and the light at the signal and idler wavelengths are quasi-phase matched while propagating in the OPO medium. In particular embodiments, the OPO medium of an OPO may include an orientation-patterned crystal, such as for example, orientation-patterned gallium arsenide (OP-GaAs), orientation-patterned gallium phosphide (OP-GaP), or orientation-patterned gallium nitride (OP-GaN).

In particular embodiments, a wavelength converter 610 may include a Raman-active material. A Raman-active material may refer to a crystal or an optical fiber that exhibits the Raman effect in which incident photons may be inelastically scattered by the crystal or optical fiber to produce lower-energy scattered photons. An inelastic scattering process may cause an incident photon (e.g., at wavelength $\lambda_1$) to be scattered and produce a photon with a lower energy (e.g., a longer wavelength $\lambda_2$), where the energy difference between the incident and scattered photons is referred to as the Stokes shift. Pulses of light at wavelength $\lambda_1$ from the optical gain fiber 510 may be received by the wavelength converter 610, and at least a portion of each received pulse may be Raman-shifted in a Raman-active material to a longer wavelength $\lambda_2$. The Raman-shifted pulses at wavelength $\lambda_2$ may be emitted by the wavelength converter 610 as an output beam. In particular embodiments, a Raman-active material may include glass (e.g., an optical fiber), diamond, any suitable orthovanadate material, any suitable tungstate material, or any other suitable material. For example, the Raman-active material in wavelength converter 610 may include yttrium orthovanadate (YVO$_4$), calcium tungstate (CaWO$_4$), potassium-gadolinium tungstate (KGd(WO$_4$)$_2$), barium tungstate (BaWO$_4$), strontium tungstate (SrWO$_4$), barium nitrate (Ba(NO$_3$)$_2$), or lead molybdate (Nd:PbMoO$_4$).

In particular embodiments, a wavelength converter 610 may be configured to convert input light at wavelength $\lambda_1$ to shorter wavelength output light at wavelength $\lambda_2$, where $\lambda_2 < \lambda_1$. For example, a wavelength converter 610 may include a nonlinear crystal (e.g., PPLN, PPLT, or PPKTP) that converts input light to shorter-wavelength output light through second harmonic generation (SHG) or sum-frequency generation. The nonlinear crystal may be contained within a resonant optical cavity similar to an OPO. In a nonlinear crystal configured for second harmonic generation, two input photons at wavelength $\lambda_1$ may be converted into a single output photon at wavelength $\lambda_1/2$. As another example, a wavelength converter 610 may include a Raman-active material that converts input light to shorter-wavelength output light by applying an anti-Stokes shift to input photons. The input photons may be converted to higher-energy photons by scattering and absorbing vibrational energy (e.g., phonons) from the Raman-active material.

Figure 17:
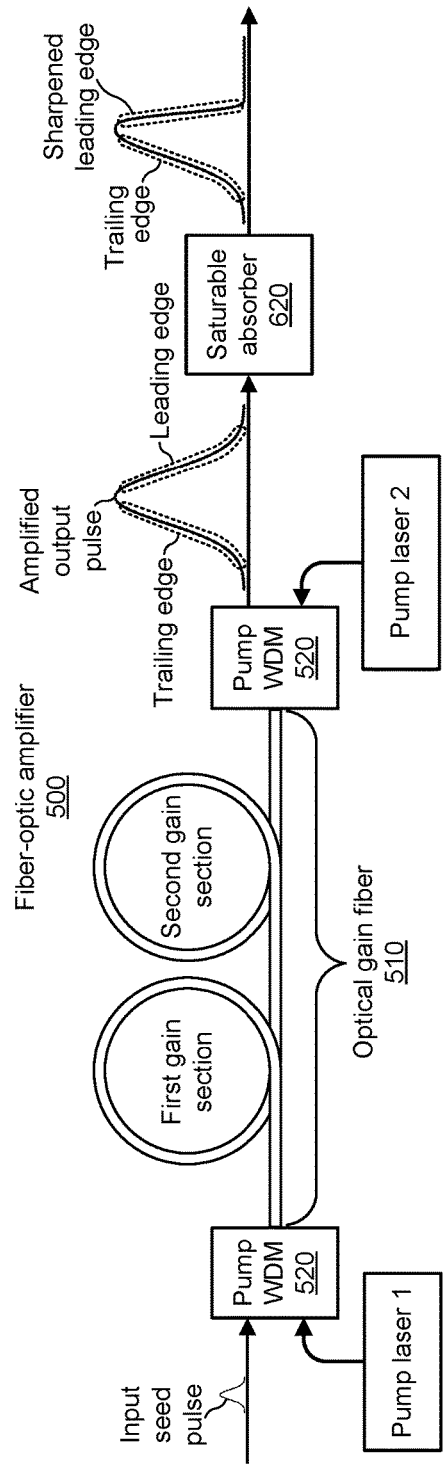
FIG. 17 illustrates an example fiber-optic amplifier with a saturable absorber located at the output side of the amplifier.

FIG. 17 illustrates an example fiber-optic amplifier 500 with a saturable absorber 620 located at the output side of the amplifier. In particular embodiments, a saturable absorber 620 may be configured to receive amplified output pulses from an optical gain fiber 510 of a fiber-optic amplifier 500 and sharpen the leading edges of the output pulses by absorbing at least a portion of light from the leading edge of each of the output pulses. In FIG. 17, the optical gain fiber 510 receives an input seed pulse and amplifies the pulse to produce an amplified output pulse. The amplified output pulse in FIG. 17 has a substantially symmetric, Gaussian temporal shape with a leading edge that is approximately the same shape as the trailing edge of the pulse. For example, the amplified output pulse may have a duration of approximately 4 ns and a rise-time and fall-time of approximately 2 ns. After passing through the saturable absorber 620, the pulse has a sharpened leading edge, and the trailing edge is substantially unchanged. As an example, the pulse after passing through the saturable absorber 620 may have a rise-time of approximately 1 ns and a fall time of approximately 2 ns. As another example, an amplified output pulse may have an asymmetric shape with a sharpened leading edge (e.g., a rise-time of approximately 1 ns and a fall-time of approximately 3 ns), and after passing through a saturable absorber 620, the leading edge of the pulse may be further sharpened (e.g., the rise-time may be approximately 0.5 ns and the fall-time may be approximately 3 ns).

In particular embodiments, a saturable absorber 620 may include an optical material that becomes more optically transparent as the intensity or energy of light incident on the saturable absorber 620 increases (e.g., the optical loss of the saturable absorber 620 decreases as incident light intensity or energy increases). In FIG. 17, the saturable absorber 620 may be substantially absorbing or opaque when the amplified output pulse is initially incident on the saturable absorber 620. As a result, most of the light from the leading edge of the amplified output pulse may be absorbed by the saturable absorber 620. The saturable absorber 620 may be configured (e.g., by setting the length or dopant density of the saturable absorber 620) to saturate before the peak of the pulse is reached. As an example, the amplified output pulse may have a pulse energy of 1 µJ, and the saturable absorber 620 may be configured to saturate after absorbing approximately 0.2 µJ of pulse energy. After absorbing 0.2 µJ of pulse energy (mostly from the leading edge of the amplified output pulse), the saturable absorber 620 may become substantially transparent, and the remaining portion of the amplified output pulse may pass through the saturable absorber 620 with minimal absorption. This saturable-absorption process may result in an output pulse with a sharpened leading edge as illustrated in FIG. 17.

In particular embodiments, a saturable absorber 620 may include a length of unpumped optical gain fiber. The unpumped optical gain fiber may include a gain material (e.g., rare-earth dopants) configured to absorb light at the wavelength of the amplified output pulse. The optical gain fiber may not be pumped by a pump laser, and the unpumped gain material may be in a substantially absorbing state (rather than an excited state that results when the gain material is pumped by light from a pump laser). The dopant density or the length of the unpumped optical gain fiber may be configured to absorb at least part of the light from the leading edge of an optical pulse and then saturate so that the remainder of the pulse passes through the unpumped optical gain fiber with minimal absorption. After a pulse passes through the saturable absorber 620, the gain material in the saturable absorber 620 may relax back to its non-saturated absorbing state in time to receive the next amplified output pulse from the optical gain fiber. 510. In particular embodiments, a fiber-optic amplifier 500 in which the amplified output pulses are passed through a saturable absorber 620 may produce output pulses with a sharpened leading edge (e.g., the pulse rise-time is reduced). The sharpened leading edges may provide for improved timing accuracy in a lidar system 100 and an associated improvement in the accuracy of determining the distance to a remote target 130.

In particular embodiments, a saturable absorber 620 may be configured to receive output light from an optical gain fiber 510 of a fiber-optic amplifier 500 and absorb at least a portion of ASE from the output light. The output light may include optical pulses amplified while propagating through the optical gain fiber along with ASE light produced by the optical gain fiber. The ASE light is generally considered optical noise that is unwanted or undesirable, and the saturable absorber may remove at least a portion of the ASE from the output light. Between any two successive optical pulses, the saturable absorber 620 may be in a substantially absorbing state, and the saturable absorber 620 may absorb at least a portion of the ASE light that is produced by the gain fiber 510 between the two optical pulses. For example, the saturable absorber 620 may absorb greater than 25%, 50%, 75%, 80%, 90%, 95%, or any other suitable percentage of the ASE light.

Figure 18:
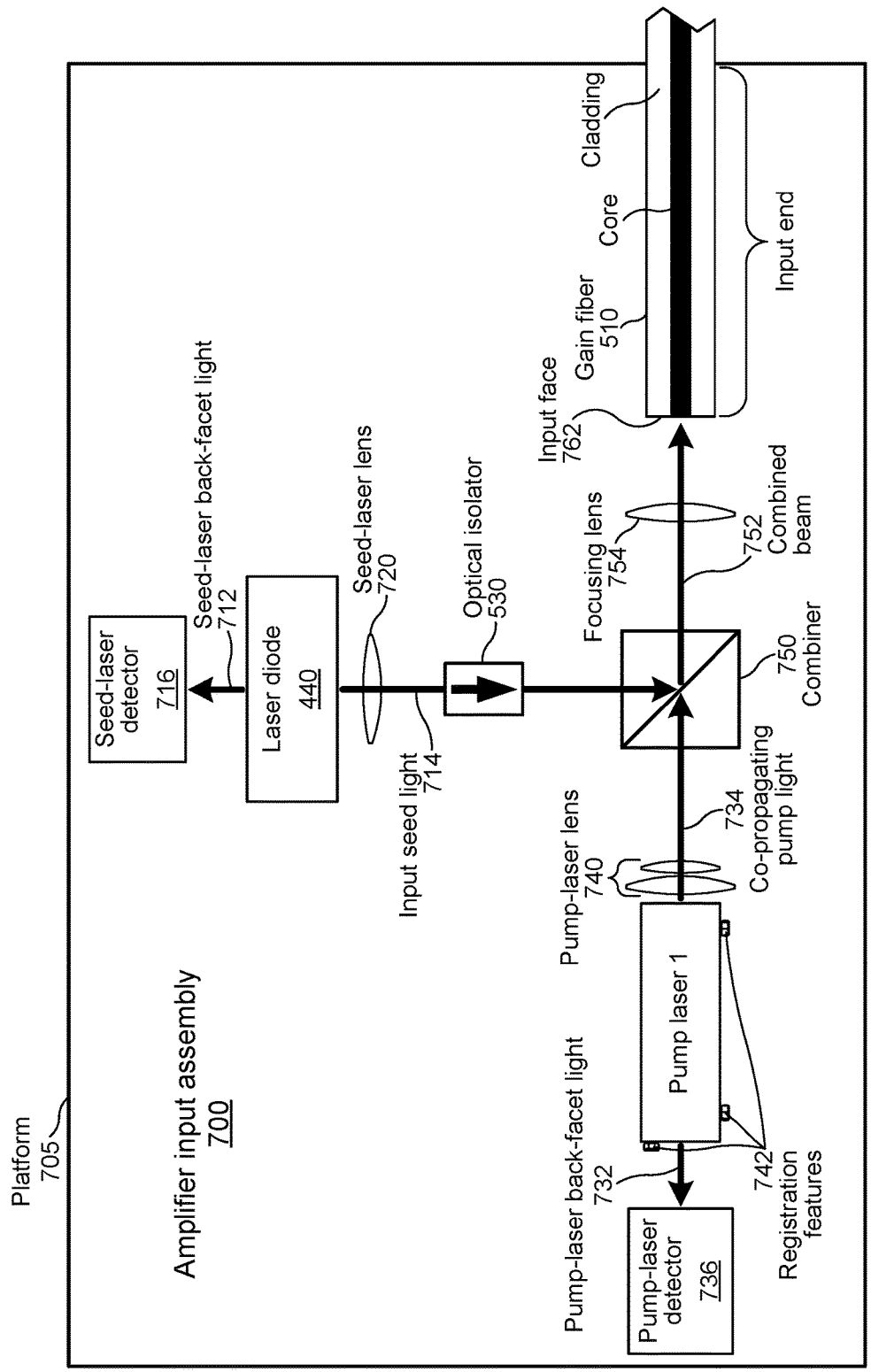
FIG. 18 illustrates an example free-space amplifier input assembly for a fiber-optic amplifier.

FIG. 18 illustrates an example free-space amplifier input assembly 700 for a fiber-optic amplifier. In particular embodiments, a light source 110 may include a fiber-optic amplifier 500 and a laser diode 440 configured to supply seed-laser input light to the fiber-optic amplifier 500. The light source 110 may include an amplifier input assembly 700 with one or more free-space optical components that are mechanically attached to a mounting platform 705. In FIG. 18, pump laser 1, laser diode 440, and the input end of gain fiber 510 may be mechanically attached to the mounting platform 705. The co-propagating pump light 734 is provided by pump laser 1 as a free-space pump-laser beam that is coupled into the first gain section of the gain fiber 510 via the input face 762 of the input end. The input seed light 714 is provided by laser diode 440 as a free-space seed-laser beam that is coupled into the first gain section of the gain fiber 510 via the input face 762 of the input end.

In particular embodiments, a free-space amplifier input assembly 700 may include a seed laser diode 440 configured to produce a free-space optical beam (e.g., input seed light 714). The seed laser diode 440 in FIG. 18 may be any suitable type of laser diode, such as for example a Fabry-Perot laser diode, a quantum well laser, a DBR laser, a DFB laser, a VCSEL, or a DM laser diode. The seed laser diode 440 may be configured to produce light at any suitable wavelength, such as for example, at one or more wavelengths between approximately 1400 nm and approximately 1600 nm. Rather than being packaged in a fiber-pigtailed assembly where the seed-laser beam is coupled into an optical fiber, the laser diode 440 in FIG. 18 may include a laser-diode chip that directly emits a free-space optical beam. As an example, the seed laser diode 440 may be mounted to a chip carrier, and the input seed light 714 may be directly emitted from a front facet of the seed laser diode 440.

In particular embodiments, a free-space amplifier input assembly 700 may include a pump laser diode (e.g., pump laser 1) configured to produce a free-space pump-laser beam (e.g., co-propagating pump light 734). Pump laser 1 in FIG. 18 may be any suitable type of free-space laser diode configured to produce light at any suitable pump wavelength (e.g., 790-820 nm, 900-1000 nm, or 1440-1540 nm). Rather than being packaged in a fiber-pigtailed package, pump laser 1 in FIG. 18 may include a laser-diode chip that directly emits a free-space optical beam (e.g., co-propagating pump light 734) from a front facet of pump laser 1. The seed laser diode 440 and pump laser 1 in FIG. 18 may each be referred to as a free-space laser diode or a direct-emitter laser diode.

In particular embodiments, a free-space amplifier input assembly 700 may include a seed-laser lens 720 configured to collect, collimate, or focus a free-space beam emitted by seed laser diode 440. As an example, the laser diode 440 in FIG. 18 may emit light that diverges into an elliptical cone shape, and the seed-laser lens 720 may collect the light emitted by the laser diode 440 and produce a collimated optical beam (e.g., input seed light 714). In particular embodiments, an amplifier input assembly 700 may include a pump-laser lens 740 configured to collect, collimate, or focus a free-space pump-laser beam (e.g., co-propagating pump light 734) emitted by pump laser 1. The seed-laser lens 720 and pump-laser lens 740 may each include any suitable type of lens, such as for example, a spherical lens (e.g., a lens having one or more concave, convex, or planar surfaces), a cylindrical lens, an aspheric lens, a gradient-index (GRIN) lens (which may be referred to as a graded-index lens), or any suitable combination thereof. As an example, the seed-laser lens 720 may include a spherical lens or an aspheric lens configured to produce a collimated beam having a substantially circular or elliptical shape. The seed-laser lens 720 and pump-laser lens 740 may each include a lens having any suitable size or diameter, such as for example, a diameter of approximately 1 µm, 10 µm, 100 µm, 200 µm, 0.5 mm, 1 mm, 2 mm, 5 mm, or 10 mm.

In particular embodiments, due to the rectangular shape of the active area from which a beam is emitted, the output beam from laser diode 440 or pump laser 1 may have a substantially elliptical shape with different divergence angles along two directions. For example, pump laser 1 may emit light having a 5°-10° divergence along a horizontal axis and a 20°-40° divergence along a vertical axis. The axis with the larger divergence may be referred to as the "fast axis," and the axis with the smaller divergence may be referred to as the "slow axis." In particular embodiments, seed-laser lens 720 or pump-laser lens 740 may be referred to as a lens assembly and may include one, two, three, or any other suitable number of lenses. As an example, the pump-laser lens 740 in FIG. 18 may include two lenses, such as for example: a spherical lens and a cylindrical lens; two cylindrical lenses; or a fast-axis collimating lens and a slow-axis collimating lens. The two lenses may be packaged together into a single lens assembly that is installed or aligned as one unit, or the two lenses may be discrete elements that are installed or aligned separately. The pump-laser lens 740 may include a first cylindrical lens that collimates the pump light 734 along the fast axis followed by a second cylindrical lens that collimates the pump light 734 along the slow axis. The first cylindrical lens may be referred to as a fast-axis collimating lens, and the second cylindrical lens may be referred to as a slow-axis collimating lens.

In particular embodiments, seed-laser lens 720 or pump-laser lens 740 may include a micro-optic lens incorporated into or attached to the front facet of laser diode 440 or pump laser 1, respectively. For example, a small cylindrical lens epoxied to the front facet of laser diode 440 may be configured to act as a fast-axis collimating lens by collimating the seed-laser beam along the fast axis. A second lens may be located external to the seed laser diode 440 and may be configured to act as a slow-axis collimating lens.

In particular embodiments, an amplifier input assembly 700 may include a free-space optical-beam combiner 750 configured to combine the input seed light 714 and the co-propagating pump light 734 into a combined free-space beam 752. An optical-beam combiner 750 may be referred to as a beam combiner, a wavelength combiner, a polarization beam combiner, a combiner, a wavelength multiplexer, a pump-signal combiner, a pump combiner, a dichroic beam combiner, or a WDM. An optical-beam combiner 750 may be a free-space optical component that combines two beams having two different wavelengths (e.g., a seed-light beam 714 and a pump-light beam 734), and an optical-beam combiner 750 may operate in a manner similar to a pump WDM 520 described above. Alternatively, an optical-beam combiner 750 may combine two beams that have orthogonal polarizations (e.g., one beam may be horizontally polarized, and the other beam may be vertically polarized).

In particular embodiments, combiner 750, which may be referred to as a dichroic beam combiner, may be a dichroic beam splitter cube or dichroic beam splitter plate. As an example, the combiner 750 may be a dichroic beam splitter configured to reflect light from the seed laser diode 440 and transmit light from pump laser 1 (or vice versa). In FIG. 18, the combiner 750 is a dichroic beam splitter cube that reflects the free-space seed-light beam 714 and transmits the free-space pump-light beam 734 to produce the combined free-space beam 752. For example, the combiner 750 may reflect light at approximately 1530-1560 nm and transmit light at approximately 970-980 nm. As another example, the combiner 750 may reflect input seed light 714 at approximately 1545-1555 nm and transmit pump-laser light at approximately 1480 nm. The combined beam 752 includes most or all of the light from the seed-light beam 714 and most or all of the light from the pump-light beam 734, and the two beams may be combined or overlapped so that they are substantially coaxial or coaligned (e.g., the two beams propagate along substantially the same propagation axis). The combiner 750 may have any suitable size or shape, such as for example, a cuboid shape with a side length of approximately 0.5 mm, 1 mm, 2 mm, 5 mm, or 10 mm. As another example, the combiner 750 may be a beam splitter plate with a diameter or side length of approximately 0.5 mm, 1 mm, 2 mm, 5 mm, or 10 mm and a thickness of approximately 0.1 mm, 1 mm, 2 mm, or 5 mm.

In particular embodiments, an amplifier input assembly 700 may include a focusing lens 754 configured to focus a combined beam 752. Additionally, an amplifier input assembly 700 may include the input end of an optical gain fiber 510, and the focusing lens 754 may focus the combined beam 752 into the core of the optical gain fiber 510 via the input face 762. The input end may be part of the first gain section of the optical gain fiber 510, and the first gain section may be a single-clad or multi-clad optical gain fiber. The input face may be a cleaved or polished end face of the optical gain fiber 510. The combined beam 752 that is coupled into the optical gain fiber 510 may include the input seed light 714 and the co-propagating pump light 734.

In particular embodiments, the focusing lens 754 may include one or more lenses (e.g., one or more spherical lenses or aspheric lenses) having any suitable size or diameter, such as for example, a diameter of approximately 1 µm, 10 μm, 100 μm, 200 μm, 0.5 mm, 1 mm, 2 mm, 5 mm, or 10 mm. The focusing lens 754 may be similar to seed-laser lens 720 or pump-laser lens 740. The focusing lens 754 may be a discrete optical element located some distance (e.g., 1 mm, 2 mm, 5 mm, or 10 mm) from the input face 762 of gain fiber 510. In particular embodiments, all or part of the focusing lens 754 may be combined with or attached to the input face 762. As an example, the focusing lens 754 may include a GRIN lens connected or attached to the input face 762, and the GRIN lens may receive the collimated combined beam 752 and focus it into the gain fiber 510. As another example, the input end of gain fiber 510 may include a lensed fiber (e.g., at least part of the focusing lens 754 is integrated into the input face 762) where the input face 762 is shaped, tapered, or rounded to act as a lens so that the combined beam 752 is received and focused into the gain fiber 510.

In particular embodiments, an amplifier input assembly 700 may include an input end of the first gain section of an optical gain fiber 510. The input end of the gain fiber 510 may refer to a length of the end of the gain fiber 510 that is part of, attached to, located above, or contained within a platform 705 of an amplifier input assembly 700. As an example, the first gain section of gain fiber 510 may include a 2-6 meter length of optical gain fiber, and a 1-100 mm end portion of the gain fiber 510 may be attached to the platform 705 and may be referred to as the input end of the gain fiber 510. The input end of the gain fiber 510 may be attached to or located on or above the platform 705, and the remaining length of the gain fiber 510 may be located outside of or beyond the boundaries of the platform 705.

In particular embodiments, gain fiber 510 may include a section of relay fiber that is spliced to the gain fiber. The relay fiber may be a length of standard optical fiber (e.g., optical fiber that is not doped with gain material) that receives the light from the combined beam 752 and conveys that light to the first gain section of the gain fiber 510. As used herein, a gain fiber 510 may refer to a length of optical fiber doped with gain material, or a gain fiber 510 may refer to a combination of relay fiber and gain fiber (e.g., a length of relay fiber that is spliced to a length of optical fiber doped with gain material). The undoped relay fiber and the doped fiber together may be referred to as a gain fiber 510. As an example, the relay fiber may include the input face 762 and the input end that is attached to or located on or above the platform 705, and the other end of the relay fiber may be spliced the first gain section. The relay fiber may have any suitable length, such as for example, a length of approximately 0.1 m, 0.5 m, 1 m, 2 m, or 5 m.

In particular embodiments, gain fiber 510 may include a FBG configured to reflect a portion of the co-propagating pump light 734 back to pump laser 1. As an example, the FBG may be located approximately 1 meter from the input face 762 in the relay-fiber portion or the gain-fiber portion of gain fiber 510. The FBG may be configured to stabilize the wavelength of pump laser 1 by reflecting back a portion (e.g., approximately 0.1%, 1%, 2%, 5%, or 10%) of the pump-laser light at a specific wavelength. For example, the FBG may reflect light at 976 nm±0.5 nm, which acts to stabilize the pump-laser wavelength to within this same wavelength range. Additionally, the FBG may be substantially transparent to the input seed light 714 produced by laser diode 440 and may reflect little or none of the input seed light 714.

In particular embodiments, an amplifier input assembly 700 may include one or more free-space optical filters. For example, an amplifier input assembly 700 may include a bandpass filter that transmits the input seed light 714 and reflects or attenuates light at other wavelengths. The laser diode 440 may operate at approximately 1550 nm, and a free-space bandpass filter with a 1548-1552 nm pass-band may be located between the laser diode 440 and the combiner 750. The bandpass filter may reduce the amount of potentially destabilizing or damaging light (e.g., stray light from pump laser 1, counter-propagating pump light from pump laser 2, or ASE from the gain fiber 510) that is coupled to the seed laser diode 440. As another example, a pre-amplifier assembly 700 may include a free-space filter that transmits the co-propagating pump light 734 and reflects or absorbs light at other wavelengths. Pump laser 1 may operate at approximately 976 nm, and a bandpass filter with a 970-980 nm pass-band may be located between pump laser 1 and the combiner 750. As another example, a pre-amplifier assembly 700 may include a free-space filter that transmits the input seed light 714 (e.g., light at approximately 1545-1555 nm) and the co-propagating pump light 734 (e.g., light at approximately 970-980 nm). Additionally, the filter may reflect the residual counter-propagating pump light from pump laser 2, which may have a wavelength of approximately 930-950 nm. The filter may be located between the combiner 750 and the input face 762. As an example, the filter may be a discrete optical component, or the filter may be integrated into a surface of the combiner 750, the focusing lens 754 or the input face 762 (e.g., the filter may be a dielectric coating deposited onto a surface of combiner 750).

In particular embodiments, an amplifier input assembly 700 may include a seed-laser detector 716 configured to receive light emitted from a back facet of the seed laser diode 440. The seed-laser detector 716 (which may be referred to as a back-facet detector or a back-facet monitor) may be positioned directly behind laser diode 440 (e.g., approximately 0.1 mm, 1 mm, 2 mm, 5 mm, or 10 mm from the back facet) to receive at least part of the seed-laser back-facet light 712. In particular embodiments, an amplifier input assembly 700 may include a pump-laser detector 736 configured to receive light emitted from a back facet of pump laser 1. The pump-laser detector 736 (which may be referred to as a back-facet detector or a back-facet monitor) may be positioned directly behind pump laser 1 to receive at least part of the pump-laser back-facet light 732. The seed laser diode 440 or pump laser 1 may include a semiconductor structure with two cleaved surfaces (referred to as a front facet and a back facet) from which laser light is emitted. The front facet or back facet may have a dielectric coating that configures the seed laser diode 440 or pump laser 1 to emit most of the light from the front facet. For example, the back facet of pump laser 1 may include a high-reflectivity dielectric coating (e.g., $R \geq 90\%$) that reflects most of the pump-laser light. The pump-light beam 734 may include $\geq 90\%$ of the total optical power emitted by pump laser 1, and the pump-laser back-facet light 732 may include $\leq 10\%$ of the total optical power.

The seed-laser detector 716 or the pump-laser detector 736 may include a PN or PIN photodiode (e.g., an InGaAs PIN photodiode). The seed-laser detector 716 may be a separate component, or the seed-laser detector 716 may be combined with the seed laser diode 440 into a single assembly (e.g., the seed-laser detector 716 and the seed laser diode 440 may be mounted onto the same chip carrier). Similarly, the pump-laser detector 736 may be a separate component, or the pump-laser detector 736 may be combined with pump laser 1 into a single assembly. The seed-laser detector 716 may receive some or all of the light emitted by the seed laser diode 440 from the back facet, and the seed-laser detector 716 may produce an electrical signal (e.g., a current or a voltage) corresponding to the received seed-laser back-facet light 712. Similarly, the pump-laser detector 736 may receive some or all of the light emitted by pump laser 1 from the back facet, and the pump-laser detector 736 may produce an electrical signal corresponding to the received pump-laser back-facet light 732.

In particular embodiments, the seed-laser detector 716 may be used to monitor the performance of seed laser diode 440. Similarly, the pump-laser detector 736 may be used to monitor the performance of pump laser 1. As an example, the performance of pump laser 1 may degrade over time (e.g., the output optical power produced by pump laser 1 may gradually decrease over tens, hundreds, or thousands of hours of operation). The amount of optical power in the pump-light beam 734 may be proportional to the amount of power in the pump-laser back-facet light 732 (e.g., the pump-laser back-facet light 732 may have approximately 1% of the power of the pump-light beam 734). As the amount of optical power in the pump-light beam 734 drops, the corresponding electrical signal produced by the pump-laser detector 736 may also decrease. The driver that supplies electrical current to pump laser 1 may increase the drive current in response to the decrease in signal from the pump-laser detector 736. Increasing the pump-laser drive current may stabilize or maintain the power of the pump-light beam 734 at a particular level (e.g., 8 watts). If the performance of pump laser 1 continues to degrade, a controller 150 may send a notification indicating that pump laser 1 is degrading or may be close to failure. For example, if the current required to maintain the power of the pump-light beam 734 at 8 watts exceeds a particular threshold value (e.g., 10 amps), then a notification may be sent indicating the status of pump laser 1. The controller 150 may send a notification indicating that pump laser 1 is degrading or may soon fail and the light source 110 should be taken in for repair or service (e.g., to replace pump laser 1 or to replace the amplifier input assembly 700).

In particular embodiments, two or more components of an amplifier input assembly 700 may be combined together into an integrated optical assembly. As an example, two lenses may be combined together into a single lens assembly to form a seed-laser lens 720, pump-laser lens 740, or focusing lens 754. Rather than separately positioning and attaching the two lenses to the platform 705, the two lenses may first be installed into a mechanical lens holder, and then the lens assembly may be positioned and attached to the platform 705 as a single optical unit. As another example, the combiner 750 and the focusing lens 754 may be combined together into a single optical assembly, which may be aligned and attached to the platform 705 as a single unit. As another example, the optical isolator 530, combiner 750, and focusing lens 754 may be combined together into a single optical assembly. The isolator-combiner-lens assembly may be built using a manufacturing station that is separate from the pre-amplifier assembly 700, and then the combined assembly may be aligned and attached to the platform 705 as a single unit. As another example, the pump-laser lens 740, the combiner 750, and the focusing lens 754 may first be aligned and packaged together into a single optical assembly, and then the optical assembly may be aligned and installed onto the platform 705 as a single optical unit.

In particular embodiments, an amplifier input assembly 700 may include a platform 705 (which may be referred to as a mounting platform, a micro-bench, an optical bench, a micro-optical bench, or a silicon optical bench), where one or more optical components are mechanically attached to the platform 705. In the example of FIG. 18, one or more of the following free-space optical components may be mechanically attached to the platform 705: laser diode 440, seed-laser lens 720, pump laser 1, pump-laser lens 740, optical-beam combiner 750, focusing lens 754, optical isolator 530, seed-laser detector 716, pump-laser detector 736, and the input end of optical gain fiber 510. Additionally, an optical filter, a polarizing beam splitter, a wave plate, or an optical assembly (e.g., a combination of two or more optical components) may be attached to a platform 705.

In particular embodiments, an optical component being attached or mechanically attached to a mounting platform 705 may refer to an optical component being epoxied, bonded, welded, soldered, or mechanically fastened to the mounting platform 705. An optical component may be mechanically attached to a mounting platform 705 by any suitable attachment technique, such as for example, by bonding with an adhesive or epoxy (e.g., using an ultraviolet-cure (UV-cure) adhesive, a two-part epoxy, a thermally conductive epoxy, or an electrically conductive epoxy), welding, brazing, soldering, mechanical fastening (e.g., with one or more screws), or any suitable combination thereof. As an example, a laser diode 440 may be attached to a chip carrier with solder, and the chip carrier may be attached to the platform 705 with solder or thermally conductive epoxy. As another example, a lens or a combiner 750 may be directly attached to the platform 705 by a UV-cure adhesive. Alternatively, a lens or a combiner 750 may first be attached to a carrier (e.g., a block, mount, or spacer that the lens or combiner 750 is epoxied to) and then the carrier may be attached to the platform 705 by epoxy, solder, or one or more mechanical fasteners.

In particular embodiments, being attached or mechanically attached to a mounting platform 705 may refer to an optical component being directly or indirectly attached, coupled, or secured to the mounting platform 705. As an example, pump laser 1 may be directly attached to the platform 705, or pump laser 2 may be attached in an indirect manner (e.g., pump laser 1 may be attached to a chip carrier, thermoelectric cooler, or other intermediate component which in turn is directly mounted to the platform 705). As another example, a seed-laser lens 720 may be directly attached to the platform 705, or a seed-laser lens 720 may be attached to a carrier which in turn is directly attached to the platform 705. Alternatively, the carrier may first be attached to the platform 705, and then the seed-laser lens 720 may be aligned and attached to the carrier. As another example, the input end of the gain fiber 510 may be inserted into a sleeve assembly (e.g., a ferrule, mechanical block, or tube with a small hole that the input end is inserted into) and affixed to the sleeve assembly, and then the sleeve assembly may be directly attached to the platform 705. Alternatively, the sleeve assembly may be attached to a spacer that is attached to the platform 705.

In particular embodiments, a platform 705 may be made from or may include any suitable material, such as for example, glass (e.g., borosilicate or fused silica), a ceramic material (e.g., aluminum oxide or a lithium-aluminosilicate glass-ceramic), a semiconductor material (e.g., silicon or polysilicon), metal (e.g., aluminum, copper, or a nickel-iron alloy, such as for example Invar), carbon fiber, or any suitable combination thereof. In particular embodiments, the material for a platform 705 may be selected to have a relatively low coefficient of thermal expansion (CTE) or a relatively high thermal conductivity. For example, the platform 705 may be made from a material having a CTE of less than $4 \times 10^{-6}$ K$^{-1}$, such as for example, a glass material, a lithium-aluminosilicate glass-ceramic, Invar, or a silicon-based material. Having a relatively low CTE may allow the optical components mounted to the platform 705 to maintain optical alignment in the presence of environmental temperature variations. As a result, the overall performance of the amplifier input assembly 700 may remain substantially constant (e.g., less than 1%, 5%, or 10% variation in optical power produced at the output end of the gain fiber 510) as the environmental temperature changes. As another example, the platform 705 may be made from a material with a thermal conductivity of greater than 5 W·m$^{-1}$·K$^{-1}$, such as for example, aluminum, copper, or aluminum oxide (Al$_2$O$_3$). Having a relatively high thermal conductivity may allow the platform 705 to dissipate or remove heat produced by some of the electrical components mounted to the platform 705, such as for example, the laser diode 440 or pump laser 1. The platform 705 may be in thermal contact with a second material (e.g., a heat sink, heat pipe, heat spreader, another thermally conductive material, a TEC, or forced air from a fan) so that the excess heat flows from the electrical components to the platform 705, and then to the second material away from the platform 705. As another example, the platform 705 may be made from a material having both a relatively low CTE and a relatively high thermal conductivity, such as for example, silicon or polysilicon. Additionally, a silicon or polysilicon material may be doped to provide an increased amount of thermal conductivity.

In particular embodiments, a platform 705 may have any suitable length, width, diameter, or thickness. As an example, a platform 705 may have a length, width, or diameter of approximately 10 mm, 20 mm, 50 mm, 100 mm, or 200 mm, and a platform 705 may have a thickness of approximately 0.1 mm, 0.5 mm, 1 mm, 2 mm, 5 mm, or 10 mm. As another example, a platform 705 may be made from silicon or polysilicon and have dimensions of approximately 60 mm×40 mm×1 mm. As another example, a platform 705 may be made from Invar or aluminum oxide and have dimensions of approximately 80 mm×80 mm×4 mm.

Figure 19:
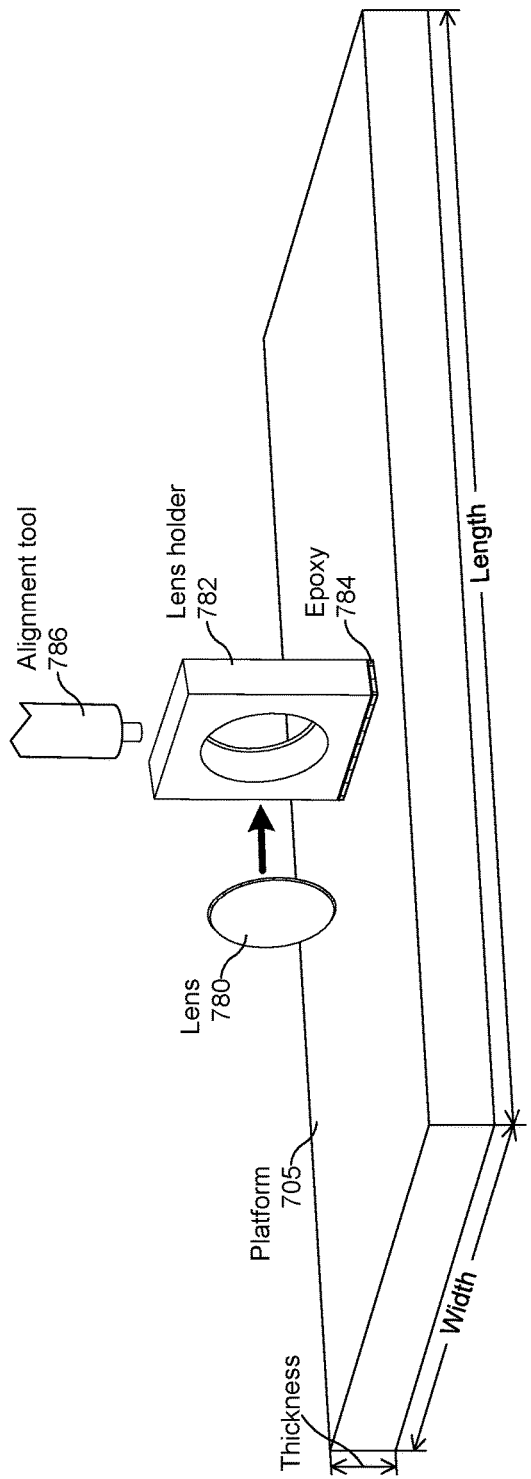
FIG. 19 illustrates an example mechanical-attachment technique based on active alignment of an optical component.

FIG. 19 illustrates an example mechanical-attachment technique based on active alignment of an optical component. An active-alignment technique may refer to the installation and attachment of an optical component onto a platform 705 using some form of electrical or optical feedback (e.g., a reading on a voltmeter or an optical-power meter). For example, the position of a lens 780 may be adjusted until a beam is aligned through an aperture or until the amount of optical power coupled into an optical fiber is maximized. In particular embodiments, one or more optical components may be attached to platform 705 using an active-alignment technique. As an example, an optical component may be attached to a mechanical alignment tool 786 which is used to precisely adjust the location or angle of the optical component on the platform 705. Once the optical component is positioned in a desired location, the optical component may be attached to the platform 705 by any suitable attachment technique (e.g., adhesive, epoxy, welding, brazing, soldering, or mechanical fastening).

In the example of FIG. 19, an optomechanical lens assembly is prepared by first attaching a lens 780 to a lens holder 782. As an example, in a separate assembly operation away from the platform 705, the lens 780 (which may be a seed-laser lens, a pump-laser lens, or a focusing lens) may be epoxied into a lens holder 782 (which may be made from aluminum, ceramic, glass, or any other suitable material). Next, the optomechanical lens assembly may be temporarily attached to an alignment tool 786 (e.g., using a vacuum or mechanical attachment technique). The alignment tool 786 may be coupled to a mechanical positioning fixture (e.g., a multi-axis alignment stage configured to translate or adjust the angle of the lens holder 782). The alignment of the lens 780 may be adjusted with the mechanical positioning fixture while making near-field or far-field measurements (e.g., with a camera or other viewing device) that provide feedback to help optimize the lens alignment. The position or angular alignment of the optomechanical assembly may be adjusted until the lens 780 is positioned in a desired location (e.g., the position of the lens 780 may be adjusted until an optical beam achieves a desired alignment, collimation, or focusing or until a particular amount of light is coupled into an optical fiber). For example, the lens 780 may be moved to optimize the coupling of combined beam 752 into the gain fiber 510 or to optimize the alignment or collimation of the input seed light 714 or the co-propagating pump light 734. A layer of epoxy 784 may be applied between the platform 705 and the lens holder 782, and when the epoxy 784 is cured, the alignment tool 786 may be removed, leaving the optomechanical assembly (including the lens 780 and the lens holder 782) attached to the platform 705.

Figure 20:
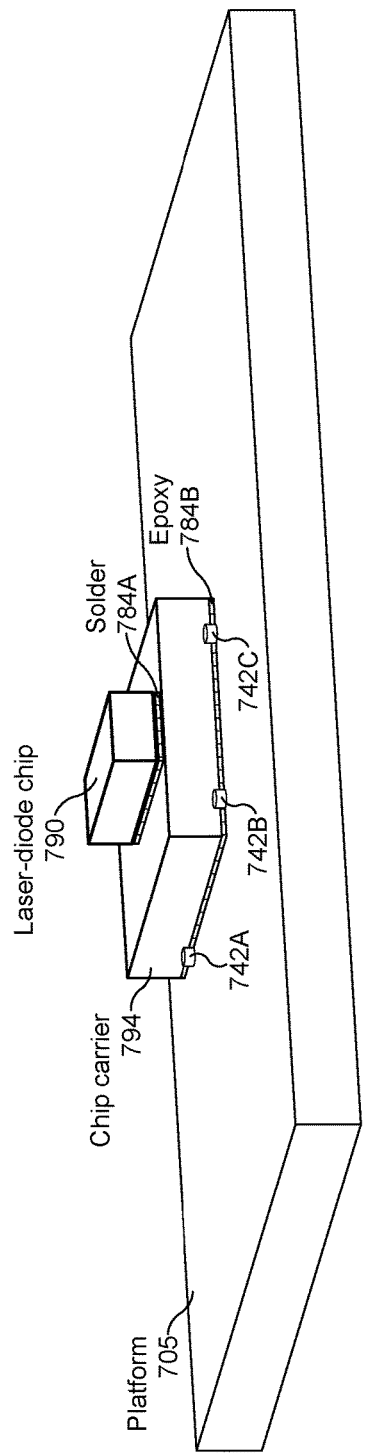
FIG. 20 illustrates an example mechanical-attachment technique based on passive alignment of an optical component.

FIG. 20 illustrates an example mechanical-attachment technique based on passive alignment of an optical component. In particular embodiments, a platform 705 may include one or more registration features 742 which are used to passively align or position an optical component on the platform 705. Rather than applying an active-alignment technique as illustrated in FIG. 19, an optical component may be passively positioned and attached to the platform 705 using one or more registration features 742. In particular embodiments, a registration feature 742 (which may be referred to as a mechanical registration feature, an alignment feature, or a positioning feature) may refer to a mechanical element used to precisely define the location of an optical component on a platform 705. A registration feature 742 may include a bump, protrusion, or hard stop that extends above a top plane of the platform 705, or a registration feature 742 may include a hole or slot that extends below a top plane of the platform 705. A registration feature 742 may have any suitable size, such as for example a length, width, height, thickness, or diameter of approximately 0.05 mm, 0.1 mm, 0.5 mm, 1 mm, or 5 mm. A registration feature 742 may have any suitable shape, such as for example, a circular, elliptical, square, or rectangular shape. As an example, a registration feature 742 may be round with a 0.5-mm diameter and may extend above the plane of the platform 705 by 0.5 mm.

In particular embodiments, one or more optical components may be attached to a platform 705 using a passive-alignment technique. A passive-alignment technique may refer to the installation and attachment of an optical component onto a platform 705 using mechanical alignment features and without the use of electrical or optical feedback to actively position the optical component. As an example, an optical component (or a holder or mount that the optical component is attached to) may be pushed up against one or more registration features 742, and then the optical component may be attached to the platform 705. In particular embodiments, a platform 705 may include one or more mechanical registration features 742 configured to define a fixed position on the platform 705 for one or more of a laser diode 440, a seed-laser lens 720, an isolator 530, a seed-laser detector 716, a pump laser 1, a pump-laser lens 740, a pump-laser detector 736, an optical-beam combiner 750, a focusing lens 754, an input end of a gain fiber 510, an optical filter, or any other suitable optical element. In FIG. 18, the registration features 742 provide hard stops that define the location of pump laser 1 with respect to the platform 705. In FIG. 20, the laser-diode chip 790 is attached to the chip carrier 794, and the chip carrier 794 is positioned on the platform 705 based on the registration features 742A, 742B, and 742C. The laser-diode chip 790 may be attached to the chip carrier 794 (by a layer of solder 784A) in a separate assembly operation, and then the laser-diode-chip-carrier assembly may be attached to the platform 705 (by a layer of epoxy 784B) in a location defined by the three registration features 742A, 742B, and 742C.

In particular embodiments, a registration feature 742 may include a dowel pin or a locating pin that is press-fit into the platform 705 so that a portion of the pin extends above the top plane of the platform 705. As an example, an optomechanical assembly may include two holes (or a hole and a slot) which mate with two dowel pins which are press fit into the platform 705. The two dowel pins define a precise location for the optomechanical assembly, and the optomechanical assembly may be attached to the platform 705 using epoxy (or any other suitable attachment technique). In FIG. 20, the three registration features 742A, 742B, and 742C may be dowel pins which are press fit into the platform 705 so that part of each pin extends above the top plane of the platform 705. As an example, a layer of epoxy 784B may be applied to the chip carrier 794 or platform 705, and then the chip carrier 794 may be placed on the platform 705. A mechanical force may be applied to the chip carrier 794 so that one edge is in contact with or pushed against registration feature 742A and another edge is in contact with or pushed against registration features 742B and 742C. In particular embodiments, a registration feature 742 may include a hole or slot in the platform 705 into which a dowel pin or locating pin is inserted. For example, an optomechanical assembly may include two dowel pins press fit into the bottom surface of the assembly, and each dowel pin may be inserted into a hole or slot in the platform 705.

In particular embodiments, one or more registration features 742 may be formed by a machining operation. For example, a platform 705 may be made from a plate of metal or ceramic, and the plate may be machined to form one or more registration features 742. The plate may be machined using a milling machine that removes material from the top surface of the plate, except for the areas where registration features 742 are to be located. For example, removing approximately 0.5 mm of the top surface may form registration features that extend approximately 0.5 mm above the surface of the platform 705.

In particular embodiments, one or more registration features 742 may be formed by photolithography or microfabrication. As an example, the platform 705 may be made from silicon, polysilicon, or any other suitable semiconductor or silicon-based material, and one or more registration features 742 may be produced through a semiconductor microfabrication process applied to the platform 705. The locations of the registration features 742 may be precisely defined using lithography, and the registration features 742 may be formed by etching. For example, the top surface of the platform 705 may be coated with a layer of photoresist that is then exposed to UV light transmitted through a mask that defines the locations of the registration features 742. Portions of the photoresist are removed based on the mask pattern. Then, the surface of the platform 705 is etched to remove some of the material from the surface and form the registration features 742. In particular embodiments, a microfabrication process may produce registration features 742 with any suitable dimensional or positioning accuracy, such as for example, an accuracy of less than or equal to 10 nm, 20 nm, 50 nm, 100 nm, 0.5 µm, 1 µm, 5 µm, or 10 µm.

In particular embodiments, an active-alignment technique or a passive-alignment technique may be used to position and attach any suitable optical component to a platform 705. As an example, all the optical components in an amplifier input assembly 700 may be actively aligned, all the optical components may be passively aligned, or a combination of active and passive alignment techniques may be used in attaching optical components to a platform 705. In FIG. 18, the laser diode 440, the isolator 530, the pump laser 1, the combiner 750, and the input end of the gain fiber 510 may be attached to the platform 705 using a passive-alignment technique. The seed-laser lens 720, the pump-laser lens 740, and the focusing lens 754 may be attached to the platform 705 using an active-alignment technique. As an example, the seed-laser lens 720 may be attached to a mechanical positioning fixture which adjusts the position of the seed-laser lens 720 until the collimation, focusing, or alignment of the input seed light 714 is optimized. As another example, the position of the focusing lens 754 may be adjusted until the coupling of the input seed light 714 or co-propagating pump light 734 into the gain fiber 510 is maximized, and then the focusing lens 754 may be attached to the platform 705.

In particular embodiments, a platform 705 may be packaged or contained within an enclosure that includes a feedthrough for optical gain fiber 510. As an example, after an amplifier input assembly 700 is built, the assembly (including the platform 705 and the optical components attached to the platform 705) may be installed into an enclosure that protects the optical components from contaminants. The enclosure may be an airtight or watertight structure that prevents water vapor, liquid water, dirt, dust, or other contaminants from getting inside the enclosure. The enclosure may be configured to be purged with an inert gas (e.g., dry air, nitrogen, or argon) and sealed. The enclosure may include a feedthrough that allows the gain fiber 760 to exit from the enclosure. The feedthrough may be an airtight or watertight feedthrough that allows the fiber to exit but still maintains an airtight or watertight seal. The enclosure may also include one or more feedthroughs that allow electrical wire or cables to enter or exit the enclosure.

Figure 21:
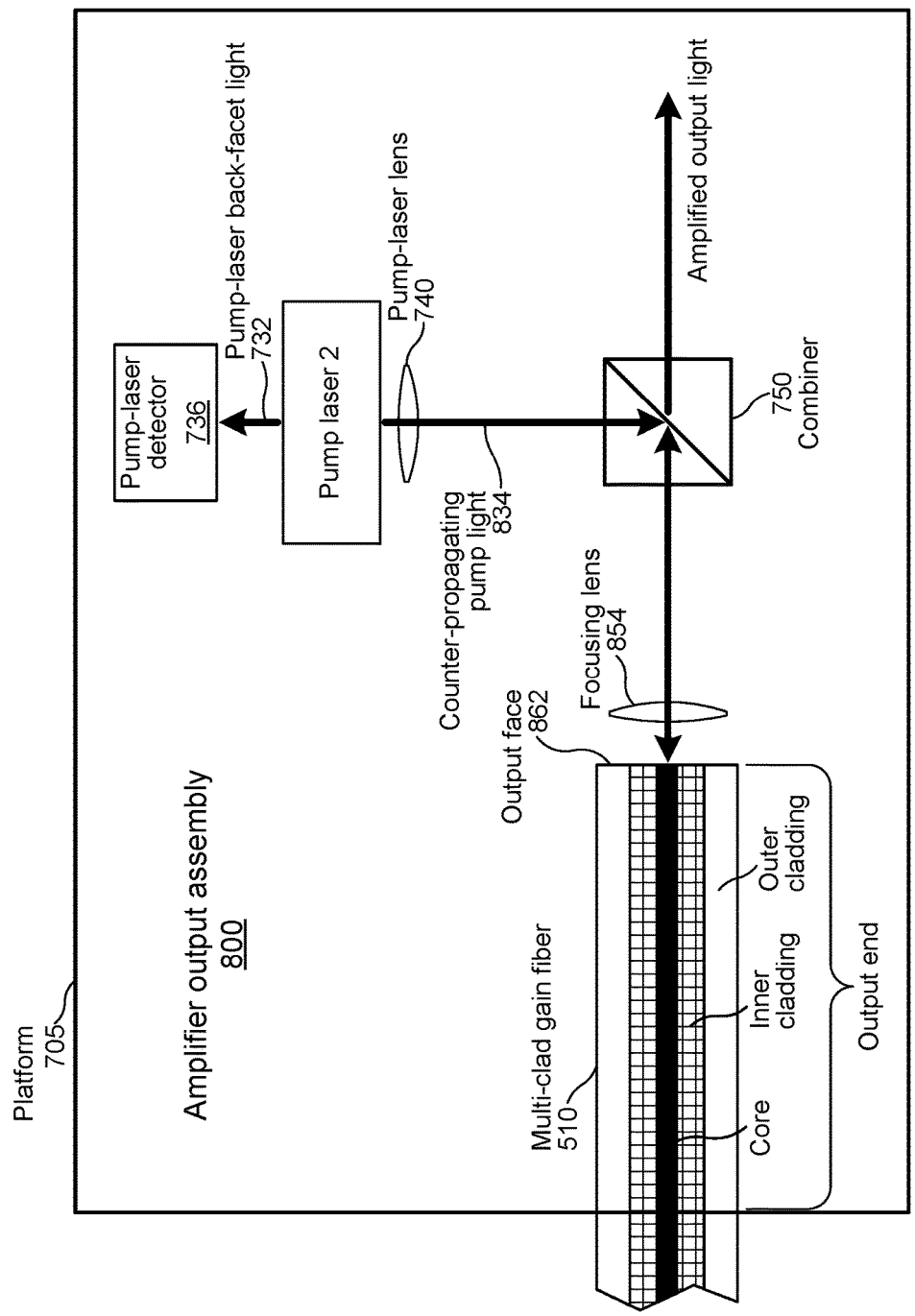
FIG. 21 illustrates an example free-space amplifier output assembly for a fiber-optic amplifier.

FIG. 21 illustrates an example free-space amplifier output assembly 800 for a fiber-optic amplifier. In particular embodiments, a light source 110 may include an amplifier input assembly 700, an amplifier output assembly 800, or both an amplifier input assembly 700 and an amplifier output assembly 800. An amplifier output assembly 800 may include optical components that are similar to those used in an amplifier input assembly 700, and an amplifier output assembly 800 may use alignment or packaging techniques that are similar to those used for an amplifier input assembly 700.

In particular embodiments, a light source 110 may include a fiber-optic amplifier 500 and an amplifier output assembly 800 with one or more free-space optical components that are mechanically attached to a mounting platform 705. In FIG. 21, pump laser 2 and the output end of gain fiber 510 may be mechanically attached to the mounting platform 705. The counter-propagating pump light 834 is provided by pump laser 2 as a free-space pump-laser beam that is coupled into the second gain section of the gain fiber 510 via the output face 862 of the output end. The amplified output light is produced from the output face 862 of the output end of the gain fiber 510. The amplified output light is a free-space output beam that includes the seed-laser input light after propagating through and being amplified by the gain fiber 510. In particular embodiments, the amplified output light from an amplifier output assembly 800 may be provided to a scanner 120 of a lidar system, and the scanner 120 may scan the free-space output beam across a field of regard of the lidar system 100.

In FIG. 21, the counter-propagating pump light 834 emitted by pump laser 2 is collimated by the pump-laser lens 740 and reflected by the optical-beam combiner 750. Additionally, the combiner 750 transmits the amplified output light produced from the output face 862 of the gain fiber 510. The combiner 750 may be a dichroic beam splitter cube or plate configured to reflect the counter-propagating pump light 834 (e.g., light at approximately 930-950 nm) and transmit the amplified output light (e.g., light at approximately 1530-1560 nm). The focusing lens 854 may focus the counter-propagating pump light 834 into the inner cladding of the multi-clad gain fiber. Additionally, the focusing lens 854 may collimate the amplified output light produced from the output face 862. In particular embodiments, the output face 862 may be a cleaved or polished surface of the gain fiber 510. The output face 862 may be cleaved or polished so that it is substantially normal to the incident counter-propagating pump light, or the output face 862 may be cleaved or polished at an angle. Additionally, the output face 862 may include an AR coating having a low optical reflectivity at a wavelength of the amplified output light or the counter-propagating pump light 834.

In FIG. 21, the output end of the gain fiber 510 may refer to a length of the end of the gain fiber 510 that is part of, attached to, located above, or contained within a platform 705 of the amplifier output assembly 800. As an example, the second gain section of gain fiber 510 may include a 2-6 meter length of optical gain fiber, and a 1-100 mm end portion of the second gain section may be attached to the platform 705 and may be referred to as the output end of the gain fiber 510. The output end of the gain fiber 510 in FIG. 21 may be similar to or may be attached to the platform 705 in a manner that is similar to the input end of the gain fiber 510 in FIG. 18. In particular embodiments, the output end of the gain fiber 510 may be lensed. For example, the output face 862 may be shaped, tapered, or rounded to act as a lens.

In the example of FIG. 21, one or more of the following free-space optical components may be mechanically attached to the platform 705: pump laser 2, pump-laser lens 740, optical-beam combiner 750, focusing lens 854, pump-laser detector 736, and the output end of the gain fiber 510. Additionally, the amplifier output assembly 800 may include any other suitable optical components (which may be attached to the platform 705), such as for example, an optical filter, an isolator 530, a polarizing beam splitter, a lens, or an optical assembly (e.g., a combination of two or more optical components). An active-alignment technique or a passive-alignment technique may be used to position and attach each of the optical components of the amplifier output assembly 800 to the platform 705. As an example, all the optical components in an amplifier output assembly 800 may be actively aligned, all the optical components may be passively aligned, or a combination of active and passive alignment techniques may be used. As an example, the output end of the gain fiber 510, the combiner 750, and pump laser 2 may each be passively aligned and attached to the platform 705. Additionally, the pump-laser lens 740 and the focusing lens 854 may each be actively aligned.

In particular embodiments, an amplifier input assembly 700 or an amplifier output assembly 800 may include one or more optical components which are located remotely from or which are not attached to a platform 705. As an example, in FIG. 18, pump laser 1 may be a fiber-coupled laser diode that is not attached to platform 705, and the light from pump laser 1 may be delivered to the platform 705 by an optical fiber. The light from the end of the optical fiber may be received or collimated by a lens or collimator that produces the co-propagating pump light 734, and the lens, collimator, or, end of the optical fiber may be attached to the platform 705. As another example, in FIG. 18, laser diode 440 may be a fiber-coupled laser diode that is not attached to platform 705, and the light from laser diode 440 may be delivered to the platform 705 by an optical fiber. As another example, in FIG. 21, pump laser 2 may be a fiber-coupled laser diode that is not attached to platform 705, and the light from pump laser 2 may be delivered to the platform 705 by an optical fiber. As another example, the seed-laser detector 716 or pump-laser detector 736 in FIG. 18 or FIG. 21 may not be attached to platform 705, and the back-facet light may be delivered to the detector by an optical fiber with a collimator that collects the seed-laser back-facet light 712 or the pump-laser back-facet light 732.

In particular embodiments, a light source 110 may include two or more seed lasers 400 or two or more laser diodes 440 that supply seed-laser input light to a fiber-optic amplifier 500. As an example, a free-space amplifier input assembly 700 may include two or more laser diodes 440 operating at approximately the same wavelength (e.g., 1550 nm) or operating at two or more different wavelengths. The light from the two or more laser diodes 440 may be combined to form a free-space seed-laser beam (e.g., input seed light 714) that is combined with co-propagating pump light 734 and then coupled into the first gain section of a gain fiber 510. In particular embodiments, a free-space amplifier input assembly 700 may include two laser diodes 440 and a free-space dichroic beam combiner. The two laser diodes 440 may have different operating wavelengths, and the two laser diodes 440 and the dichroic beam combiner may be mechanically attached to a platform 705. The dichroic beam combiner may be configured to combine light from the two laser diodes 440 to form a free-space seed-laser beam that is coupled into the first gain section of a gain fiber 510. For example, one laser diode 440 may operate at approximately 1545 nm, and the other laser diode 440 may operate at approximately 1555 nm. A dichroic beam splitter cube or plate may be configured to combine the free-space beams from the two laser diodes 440 by reflecting the light at 1545 nm and transmitting the light at 1555 nm.

In particular embodiments, a free-space amplifier input assembly 700 may include two laser diodes 440 and a polarization beam combiner. The two laser diodes 440 may operate at approximately the same wavelength or at different wavelengths. The two laser diodes 440 and the polarization beam combiner may be mechanically attached to a platform 705 of the amplifier input assembly 700. The polarization beam combiner may be configured to combine two orthogonally polarized beams by reflecting vertically polarized light and transmitting horizontally polarized light (or vice versa). The two laser diodes 440 may emit light having the same polarization (e.g., vertical polarization with respect to the plane of the platform 705), and the amplifier input assembly 700 may include a half-wave plate configured to rotate the polarization of one of the laser diodes 440 by 90 degrees (e.g., rotate the polarization from vertical to horizontal). The polarization beam combiner may be configured to combine the vertically polarized light from one laser diode 440 and the horizontally polarized light from the other laser diode 440 to form a free-space seed-laser beam that is coupled into the first gain section of a gain fiber 510.

In particular embodiments, an amplifier input assembly 700 may include two or more pump lasers. As an example, an amplifier input assembly 700 may include two pump lasers and a free-space dichroic beam combiner. The two pump lasers and the dichroic beam combiner may be mechanically attached to a platform 705 of the amplifier input assembly 700. The two pump lasers may have different operating wavelengths (e.g., 974 nm and 978 nm), and the dichroic beam combiner may be configured to combine light from the two pump laser diodes to form a free-space pump-laser beam (e.g., co-propagating pump light 734) that is combined with input seed light 714 and then coupled into the first gain section of a gain fiber 510. As another example, an amplifier input assembly 700 may include two pump lasers and a polarization beam combiner. The two pump lasers may operate at approximately the same wavelength (e.g., 976 nm±2 nm) or at different wavelengths. The two pump lasers may emit light having the same polarization (e.g., vertical polarization with respect to the plane of the platform 705), and the amplifier input assembly 700 may include a half-wave plate configured to rotate the polarization of one of the pump lasers by 90 degrees (e.g., rotate the polarization from vertical to horizontal). The polarization beam combiner may be configured to combine the vertically polarized light from one pump laser and the horizontally polarized light from the other pump laser to form a free-space pump-laser beam (e.g., co-propagating pump light 734) that is combined with input seed light 714 and then coupled into the first gain section of a gain fiber 510.

In particular embodiments, an amplifier output assembly 800 may include two or more pump lasers. As an example, an amplifier output assembly 800 may include two pump lasers operating at different wavelengths (e.g., 935 nm and 945 nm) and a dichroic beam combiner configured to combine light from the two pump laser diodes to form a free-space pump-laser beam (e.g., counter-propagating pump light 834) that is coupled into the output end of a gain fiber 510. The two pump lasers and the dichroic beam combiner may be mechanically attached to a platform 705 of the amplifier output assembly 800. As another example, an amplifier output assembly 800 may include two pump lasers and a polarization beam combiner. The two pump lasers may operate at approximately the same wavelength (e.g., 940 nm±4 nm) or at different wavelengths. The polarization beam combiner may be configured to combine vertically polarized light from one pump laser and horizontally polarized light from the other pump laser to form a free-space pump-laser beam (e.g., counter-propagating pump light 834) that is coupled into the output end of a gain fiber 510. The two pump lasers and the polarization beam combiner may be mechanically attached to a platform 705 of the amplifier output assembly 800.

Figure 22:
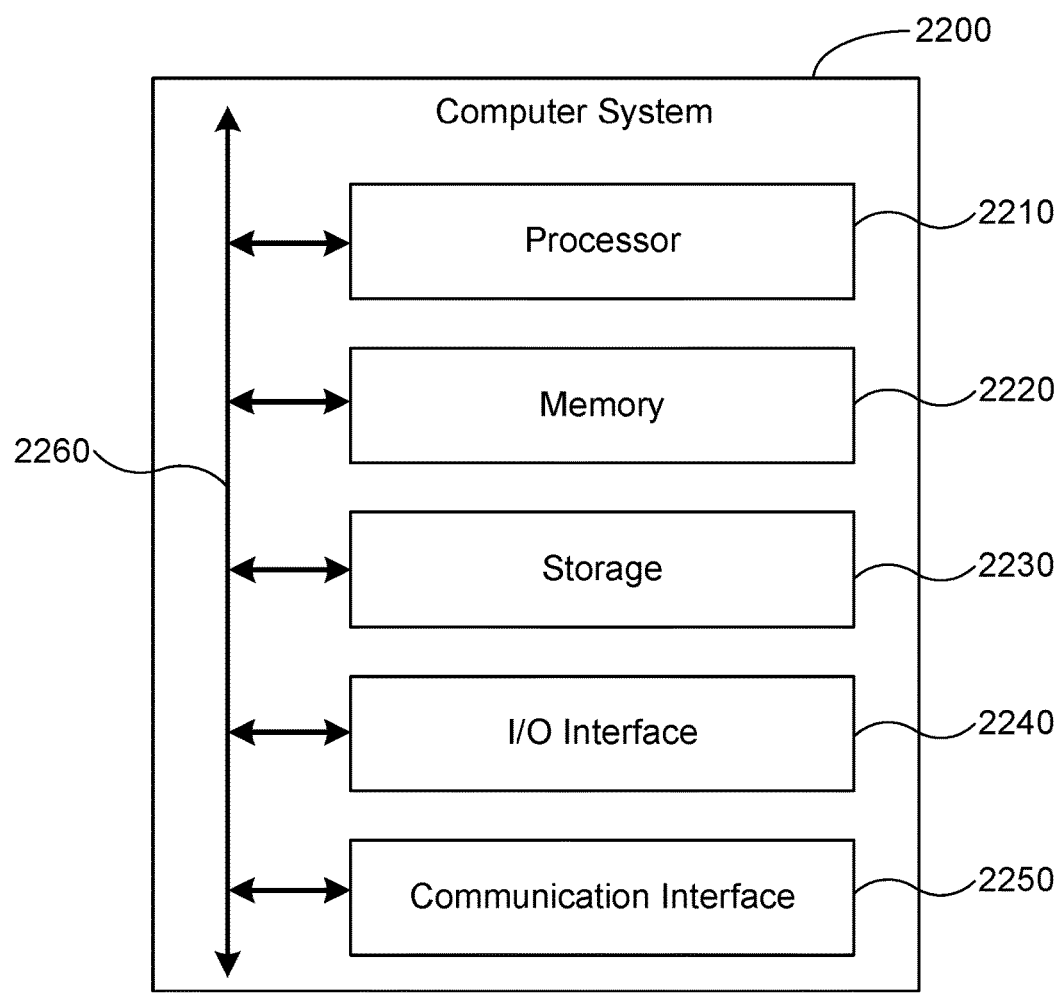
FIG. 22 illustrates an example computer system.

FIG. 22 illustrates an example computer system 2200. In particular embodiments, one or more computer systems 2200 may perform one or more steps of one or more methods described or illustrated herein. In particular embodiments, one or more computer systems 2200 may provide functionality described or illustrated herein. In particular embodiments, software running on one or more computer systems 2200 may perform one or more steps of one or more methods described or illustrated herein or may provide functionality described or illustrated herein. Particular embodiments may include one or more portions of one or more computer systems 2200. In particular embodiments, a computer system may be referred to as a processor, a controller, a computing device, a computing system, a computer, a general-purpose computer, or a data-processing apparatus. Herein, reference to a computer system may encompass one or more computer systems, where appropriate.

Computer system 2200 may take any suitable physical form. As an example, computer system 2200 may be an embedded computer system, a system-on-chip (SOC), a single-board computer system (SBC), a desktop computer system, a laptop or notebook computer system, a mainframe, a mesh of computer systems, a server, a tablet computer system, or any suitable combination of two or more of these. As another example, all or part of computer system 2200 may be combined with, coupled to, or integrated into a variety of devices, including, but not limited to, a camera, camcorder, personal digital assistant (PDA), mobile telephone, smartphone, electronic reading device (e.g., an e-reader), game console, smart watch, clock, calculator, television monitor, flat-panel display, computer monitor, vehicle di splay (e.g., odometer di splay or dashboard display), vehicle navigation system, lidar system, ADAS, autonomous vehicle, autonomous-vehicle driving system, cockpit control, camera view display (e.g., display of a rear-view camera in a vehicle), eyewear, or head-mounted display. Where appropriate, computer system 2200 may include one or more computer systems 2200; be unitary or distributed; span multiple locations; span multiple machines; span multiple data centers; or reside in a cloud, which may include one or more cloud components in one or more networks. Where appropriate, one or more computer systems 2200 may perform without substantial spatial or temporal limitation one or more steps of one or more methods described or illustrated herein. As an example, one or more computer systems 2200 may perform in real time or in batch mode one or more steps of one or more methods described or illustrated herein. One or more computer systems 2200 may perform at different times or at different locations one or more steps of one or more methods described or illustrated herein, where appropriate.

As illustrated in the example of FIG. 22, computer system 2200 may include a processor 2210, memory 2220, storage 2230, an input/output (I/O) interface 2240, a communication interface 2250, or a bus 2260. Computer system 2200 may include any suitable number of any suitable components in any suitable arrangement.

In particular embodiments, processor 2210 may include hardware for executing instructions, such as those making up a computer program. As an example, to execute instructions, processor 2210 may retrieve (or fetch) the instructions from an internal register, an internal cache, memory 2220, or storage 2230; decode and execute them; and then write one or more results to an internal register, an internal cache, memory 2220, or storage 2230. In particular embodiments, processor 2210 may include one or more internal caches for data, instructions, or addresses. Processor 2210 may include any suitable number of any suitable internal caches, where appropriate. As an example, processor 2210 may include one or more instruction caches, one or more data caches, or one or more translation lookaside buffers (TLBs). Instructions in the instruction caches may be copies of instructions in memory 2220 or storage 2230, and the instruction caches may speed up retrieval of those instructions by processor 2210. Data in the data caches may be copies of data in memory 2220 or storage 2230 for instructions executing at processor 2210 to operate on; the results of previous instructions executed at processor 2210 for access by subsequent instructions executing at processor 2210 or for writing to memory 2220 or storage 2230; or other suitable data. The data caches may speed up read or write operations by processor 2210. The TLBs may speed up virtual-address translation for processor 2210. In particular embodiments, processor 2210 may include one or more internal registers for data, instructions, or addresses. Processor 2210 may include any suitable number of any suitable internal registers, where appropriate. Where appropriate, processor 2210 may include one or more arithmetic logic units (ALUs); may be a multi-core processor; or may include one or more processors 2210.

In particular embodiments, memory 2220 may include main memory for storing instructions for processor 2210 to execute or data for processor 2210 to operate on. As an example, computer system 2200 may load instructions from storage 2230 or another source (such as, for example, another computer system 2200) to memory 2220. Processor 2210 may then load the instructions from memory 2220 to an internal register or internal cache. To execute the instructions, processor 2210 may retrieve the instructions from the internal register or internal cache and decode them. During or after execution of the instructions, processor 2210 may write one or more results (which may be intermediate or final results) to the internal register or internal cache. Processor 2210 may then write one or more of those results to memory 2220. One or more memory buses (which may each include an address bus and a data bus) may couple processor 2210 to memory 2220. Bus 2260 may include one or more memory buses. In particular embodiments, one or more memory management units (MMUs) may reside between processor 2210 and memory 2220 and facilitate accesses to memory 2220 requested by processor 2210. In particular embodiments, memory 2220 may include random access memory (RAM). This RAM may be volatile memory, where appropriate. Where appropriate, this RAM may be dynamic RAM (DRAM) or static RAM (SRAM). Memory 2220 may include one or more memories 2220, where appropriate.

In particular embodiments, storage 2230 may include mass storage for data or instructions. As an example, storage 2230 may include a hard disk drive (HDD), a floppy disk drive, flash memory, an optical disc, a magneto-optical disc, magnetic tape, or a Universal Serial Bus (USB) drive or a combination of two or more of these. Storage 2230 may include removable or non-removable (or fixed) media, where appropriate. Storage 2230 may be internal or external to computer system 2200, where appropriate. In particular embodiments, storage 2230 may be non-volatile, solid-state memory. In particular embodiments, storage 2230 may include read-only memory (ROM). Where appropriate, this ROM may be mask ROM (MROM), programmable ROM (PROM), erasable PROM (EPROM), electrically erasable PROM (EEPROM), flash memory, or a combination of two or more of these. Storage 2230 may include one or more storage control units facilitating communication between processor 2210 and storage 2230, where appropriate. Where appropriate, storage 2230 may include one or more storages 2230.

In particular embodiments, I/O interface 2240 may include hardware, software, or both, providing one or more interfaces for communication between computer system 2200 and one or more I/O devices. Computer system 2200 may include one or more of these I/O devices, where appropriate. One or more of these I/O devices may enable communication between a person and computer system 2200. As an example, an I/O device may include a keyboard, keypad, microphone, monitor, mouse, printer, scanner, speaker, camera, stylus, tablet, touch screen, trackball, another suitable I/O device, or any suitable combination of two or more of these. An I/O device may include one or more sensors. Where appropriate, I/O interface 2240 may include one or more device or software drivers enabling processor 2210 to drive one or more of these I/O devices. I/O interface 2240 may include one or more I/O interfaces 2240, where appropriate.

In particular embodiments, communication interface 2250 may include hardware, software, or both providing one or more interfaces for communication (such as, for example, packet-based communication) between computer system 2200 and one or more other computer systems 2200 or one or more networks. As an example, communication interface 2250 may include a network interface controller (NIC) or network adapter for communicating with an Ethernet or other wire-based network or a wireless NIC (WNIC); a wireless adapter for communicating with a wireless network, such as a WI-FI network; or an optical transmitter (e.g., a laser or a light-emitting diode) or an optical receiver (e.g., a photodetector) for communicating using fiber-optic communication or free-space optical communication. Computer system 2200 may communicate with an ad hoc network, a personal area network (PAN), an in-vehicle network (IVN), a local area network (LAN), a wide area network (WAN), a metropolitan area network (MAN), or one or more portions of the Internet or a combination of two or more of these. One or more portions of one or more of these networks may be wired or wireless. As an example, computer system 2200 may communicate with a wireless PAN (WPAN) (such as, for example, a BLUETOOTH WPAN), a WI-FI network, a Worldwide Interoperability for Microwave Access (WiMAX) network, a cellular telephone network (such as, for example, a Global System for Mobile Communications (GSM) network), or other suitable wireless network or a combination of two or more of these. As another example, computer system 2200 may communicate using fiber-optic communication based on 100 Gigabit Ethernet (100 GbE), 10 Gigabit Ethernet (10 GbE), or Synchronous Optical Networking (SONET). Computer system 2200 may include any suitable communication interface 2250 for any of these networks, where appropriate. Communication interface 2250 may include one or more communication interfaces 2250, where appropriate.

In particular embodiments, bus 2260 may include hardware, software, or both coupling components of computer system 2200 to each other. As an example, bus 2260 may include an Accelerated Graphics Port (AGP) or other graphics bus, a controller area network (CAN) bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local bus (VLB), or another suitable bus or a combination of two or more of these. Bus 2260 may include one or more buses 2260, where appropriate.

In particular embodiments, various modules, circuits, systems, methods, or algorithm steps described in connection with the implementations disclosed herein may be implemented as electronic hardware, computer software, or any suitable combination of hardware and software. In particular embodiments, computer software (which may be referred to as software, computer-executable code, computer code, a computer program, computer instructions, or instructions) may be used to perform various functions described or illustrated herein, and computer software may be configured to be executed by or to control the operation of computer system 2200. As an example, computer software may include instructions configured to be executed by processor 2210. In particular embodiments, owing to the interchangeability of hardware and software, the various illustrative logical blocks, modules, circuits, or algorithm steps have been described generally in terms of functionality. Whether such functionality is implemented in hardware, software, or a combination of hardware and software may depend upon the particular application or design constraints imposed on the overall system.

In particular embodiments, a computing device may be used to implement various modules, circuits, systems, methods, or algorithm steps disclosed herein. As an example, all or part of a module, circuit, system, method, or algorithm disclosed herein may be implemented or performed by a general-purpose single- or multi-chip processor, a digital signal processor (DSP), an ASIC, a FPGA, any other suitable programmable-logic device, discrete gate or transistor logic, discrete hardware components, or any suitable combination thereof. A general-purpose processor may be a microprocessor, or, any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In particular embodiments, one or more implementations of the subject matter described herein may be implemented as one or more computer programs (e.g., one or more modules of computer-program instructions encoded or stored on a computer-readable non-transitory storage medium). As an example, the steps of a method or algorithm disclosed herein may be implemented in a processor-executable software module which may reside on a computer-readable non-transitory storage medium. In particular embodiments, a computer-readable non-transitory storage medium may include any suitable storage medium that may be used to store or transfer computer software and that may be accessed by a computer system. Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs (e.g., compact discs (CDs), CD-ROM, digital versatile discs (DVDs), blue-ray discs, or laser discs), optical disc drives (ODDs), magneto-optical discs, magneto-optical drives, floppy diskettes, floppy disk drives (FDDs), magnetic tapes, flash memories, solid-state drives (SSDs), RAM, RAM-drives, ROM, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

In particular embodiments, certain features described herein in the context of separate implementations may also be combined and implemented in a single implementation. Conversely, various features that are described in the context of a single implementation may also be implemented in multiple implementations separately or in any suitable sub-combination. Moreover, although features may be described above as acting in certain combinations and even initially claimed as such, one or more features from a claimed combination may in some cases be excised from the combination, and the claimed combination may be directed to a sub-combination or variation of a sub-combination.

While operations may be depicted in the drawings as occurring in a particular order, this should not be understood as requiring that such operations be performed in the particular order shown or in sequential order, or that all operations be performed. Further, the drawings may schematically depict one more example processes or methods in the form of a flow diagram or a sequence diagram. However, other operations that are not depicted may be incorporated in the example processes or methods that are schematically illustrated. For example, one or more additional operations may be performed before, after, simultaneously with, or between any of the illustrated operations. Moreover, one or more operations depicted in a diagram may be repeated, where appropriate. Additionally, operations depicted in a diagram may be performed in any suitable order. Furthermore, although particular components, devices, or systems are described herein as carrying out particular operations, any suitable combination of any suitable components, devices, or systems may be used to carry out any suitable operation or combination of operations. In certain circumstances, multitasking or parallel processing operations may be performed. Moreover, the separation of various system components in the implementations described herein should not be understood as requiring such separation in all implementations, and it should be understood that the described program components and systems may be integrated together in a single software product or packaged into multiple software products.

Various embodiments have been described in connection with the accompanying drawings. However, it should be understood that the figures may not necessarily be drawn to scale. As an example, distances or angles depicted in the figures are illustrative and may not necessarily bear an exact relationship to actual dimensions or layout of the devices illustrated.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes or illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend.

The term "or" as used herein is to be interpreted as an inclusive or meaning any one or any combination, unless expressly indicated otherwise or indicated otherwise by context. Therefore, herein, the expression "A or B" means "A, B, or both A and B." As another example, herein, "A, B or C" means at least one of the following: A; B; C; A and B; A and C; B and C; A, B and C. An exception to this definition will occur if a combination of elements, devices, steps, or operations is in some way inherently mutually exclusive.

As used herein, words of approximation such as, without limitation, "approximately, "substantially," or "about" refer to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skill in the art recognize the modified feature as having the required characteristics or capabilities of the unmodified feature. In general, but subject to the preceding discussion, a numerical value herein that is modified by a word of approximation such as "approximately" may vary from the stated value by ±0.5%, ±1%, ±2%, ±3%, ±4%, ±5%, ±10%, ±12%, or ±15%.

As used herein, the terms "first," "second," "third," etc. may be used as labels for nouns that they precede, and these terms may not necessarily imply a particular ordering (e.g., a particular spatial, temporal, or logical ordering). As an example, a system may be described as determining a "first result" and a "second result," and the terms "first" and "second" may not necessarily imply that the first result is determined before the second result.

As used herein, the terms "based on" and "based at least in part on" may be used to describe or present one or more factors that affect a determination, and these terms may not exclude additional factors that may affect a determination. A determination may be based solely on those factors which are presented or may be based at least in part on those factors. The phrase "determine A based on B" indicates that B is a factor that affects the determination of A. In some instances, other factors may also contribute to the determination of A. In other instances, A may be determined based solely on B.

What is claimed is:

1. A fiber-optic amplifier comprising:
    an optical gain fiber configured to amplify input light received from a seed laser, the optical gain fiber comprising:
        a first gain section comprising a single-clad gain fiber comprising a first fiber-optic core and a cladding that surrounds the core, wherein the first gain section is configured to:
            receive the seed-laser input light and co-propagating pump light; and
            amplify the seed-laser input light as it propagates along the first gain section, wherein the seed-laser input light and the co-propagating pump light are guided by and propagate substantially within the first core and along the first gain section in a same direction;
        a second gain section comprising a multi-clad gain fiber comprising a second fiber-optic core, an inner cladding surrounding the second core, and an outer cladding surrounding the inner cladding, wherein the second gain section is configured to:
            receive the amplified input light from the first gain section;
            receive counter-propagating pump light; and
            further amplify the amplified input light as it propagates along the second gain section, wherein the amplified input light is guided by and propagates substantially within the second core, the counter-propagating pump light is guided at least in part by the inner cladding and propagates substantially within the inner cladding and the second core, and the amplified input light and the counter-propagating pump light propagate along the second gain section in opposite directions; and
        a fiber-optic splice configured to couple the first gain section to the second gain section, wherein the fiber-optic splice provides a relatively low optical loss for the amplified input light and a relatively high optical loss for light propagating from the second core of the second gain section to the first core of the first gain section;
    a first pump laser diode configured to provide the co-propagating pump light to the first gain section; and
    a second pump laser diode configured to provide the counter-propagating pump light to the second gain section.

2. The fiber-optic amplifier of claim 1, wherein:
    the first gain section comprises an input end configured to receive the seed-laser input light and the co-propagating pump light; and
    the second gain section comprises an output end configured to:
        produce amplified output light comprising the seed-laser input light which is amplified as it propagates along the optical gain fiber; and
        receive the counter-propagating pump light.

3. The fiber-optic amplifier of claim 1, wherein the first core is doped with a gain material that absorbs the co-propagating pump light and provides optical gain to the seed-laser input light as it propagates along the first gain section.

4. The fiber-optic amplifier of claim 1, wherein the second core is doped with a gain material that absorbs the counter-propagating pump light and provides optical gain to the amplified seed-laser input light as it propagates along the second gain section.

5. The fiber-optic amplifier of claim 1, wherein the second gain section comprises a large-mode-area (LMA) gain fiber.

6. The fiber-optic amplifier of claim 1, wherein the first gain section or the second gain section comprises a photonic-crystal gain fiber, an air-clad gain fiber, a pedestal gain fiber, a fluoride glass gain fiber, or a chalcogenide glass gain fiber.

7. The fiber-optic amplifier of claim 1, wherein the optical gain fiber comprises a single continuous length of multi-clad gain fiber comprising a fiber-optic core doped with a gain material, a first cladding surrounding the core, and a second cladding surrounding the first cladding, wherein:
    the first and second gain sections each comprise a portion of the multi-clad gain fiber;
    the seed-laser input light and the co-propagating pump light are guided by and propagate substantially within the core; and
    the counter-propagating pump light is guided at least in part by the first cladding and propagates substantially within the first cladding and the core.

8. The fiber-optic amplifier of claim 7, further comprising a cladding power stripper located near an input end of the first gain section, wherein the cladding power stripper is configured to remove residual counter-propagating pump light from the first cladding.

9. The fiber-optic amplifier of claim 1, further comprising a cladding power stripper located between the first gain section and the second gain section, wherein the cladding power stripper is configured to remove residual counter-propagating pump light.

10. The fiber-optic amplifier of claim 9, wherein the cladding power stripper is formed by removing at least part of the inner cladding from a portion of the multi-clad gain fiber located near the fiber-optic splice.

11. The fiber-optic amplifier of claim 1, wherein the second fiber-optic core of the second gain section is larger than the first fiber-optic core of the first gain section.

12. The fiber-optic amplifier of claim 1, wherein the light propagating from the second core of the second gain section to the first core of the first gain section comprises amplified spontaneous emission produced in the second gain section.

13. The fiber-optic amplifier of claim 1, wherein the first gain section and the second gain section each comprises a fiber-optic core doped with a gain material comprising erbium.

14. The fiber-optic amplifier of claim 1, wherein:
the first gain section comprises a fiber-optic core doped with erbium; and
the second gain section comprises a fiber-optic core doped with erbium and ytterbium.

15. The fiber-optic amplifier of claim 1, wherein:
the co-propagating pump light provided to the first gain section has a wavelength between approximately 900 nanometers and approximately 1000 nanometers;
the counter-propagating pump light provided to the second gain section has a wavelength between approximately 900 nanometers and approximately 1000 nanometers; and
the seed-laser input light has a wavelength between approximately 1400 nanometers and approximately 1600 nanometers.

16. The fiber-optic amplifier of claim 1, wherein:
the co-propagating pump light provided to the first gain section has a wavelength between approximately 970 nanometers and approximately 980 nanometers; and
the counter-propagating pump light provided to the second gain section has a wavelength between approximately 930 nanometers and approximately 950 nanometers.

17. The fiber-optic amplifier of claim 1, wherein:
the first gain section comprises a fiber-optic core doped with erbium;
the co-propagating pump light has a wavelength between approximately 1440 nanometers and approximately 1540 nanometers; and
the seed-laser input light has a wavelength between approximately 1500 nanometers and approximately 1630 nanometers.

18. The fiber-optic amplifier of claim 1, wherein:
the first gain section and the second gain section each comprises a fiber-optic core doped with ytterbium;
the co-propagating pump light and the counter-propagating pump light each has a wavelength between approximately 900 nanometers and approximately 1040 nanometers; and
the seed-laser input light has a wavelength between approximately 970 nanometers and approximately 1120 nanometers.

19. The fiber-optic amplifier of claim 1, wherein:
the first gain section and the second gain section each comprises a fiber-optic core doped with thulium;
the co-propagating pump light and the counter-propagating pump light each has a wavelength between approximately 790 nanometers and approximately 800 nanometers or between approximately 1400 nanometers and approximately 1600 nanometers; and
the seed-laser input light has a wavelength between approximately 1750 nanometers and approximately 2100 nanometers.

20. The fiber-optic amplifier of claim 1, wherein:
the first gain section and the second gain section each comprises a fiber-optic core doped with neodymium;
the co-propagating pump light and the counter-propagating pump light each has a wavelength between approximately 800 nanometers and approximately 820 nanometers or between approximately 870 nanometers and approximately 890 nanometers; and
the seed-laser input light has a wavelength between approximately 1050 nanometers and approximately 1090 nanometers or between approximately 1300 nanometers and approximately 1330 nanometers.

21. The fiber-optic amplifier of claim 1, wherein:
the first gain section and the second gain section each comprises a fiber-optic core doped with holmium;
the co-propagating pump light and the counter-propagating pump light each has a wavelength between approximately 1900 nanometers and approximately 2000 nanometers; and
the seed-laser input light has a wavelength between approximately 2050 nanometers and approximately 2200 nanometers.

22. The fiber-optic amplifier of claim 1, further comprising a wavelength-conversion stage configured to:
receive amplified output light from the second gain section, the amplified output light having a first wavelength; and
convert the received amplified output light into wavelength-converted light having a second wavelength, wherein the second wavelength is different from the first wavelength.

23. The fiber-optic amplifier of claim 22, wherein the wavelength-conversion stage comprises an optical parametric oscillator or a Raman-active material.

24. The fiber-optic amplifier of claim 22, wherein:
the first gain section and the second gain section each comprises a fiber-optic core doped with ytterbium;
the first wavelength is between approximately 970 nanometers and approximately 1120 nanometers; and
the second wavelength is between approximately 1300 nanometers and approximately 2000 nanometers.

25. The fiber-optic amplifier of claim 1, further comprising a saturable absorber configured to receive amplified output pulses from the second gain section, wherein the saturable absorber is configured to sharpen a leading edge of each of the output pulses by absorbing at least a portion of light from the leading edge.

26. The fiber-optic amplifier of claim 25, wherein the saturable absorber comprises a length of unpumped optical gain fiber, wherein the unpumped optical gain fiber comprises a gain material configured to absorb the portion of light from the leading edge of each of the output pulses.

27. The fiber-optic amplifier of claim 1, further comprising a saturable absorber configured to:
receive output light from the second gain section, the output light comprising amplified output pulses and amplified spontaneous emission (ASE) produced by the optical gain fiber; and
absorb at least a portion of the ASE.

28. The fiber-optic amplifier of claim 1, further comprising a piece of glass attached to an output end of the second gain section, wherein the piece of glass allows amplified output light from the second gain section to spread out in a transverse direction to reduce an optical intensity of the amplified output light.

* * * * *